United States Patent
Takeuchi et al.

[19]

[11] Patent Number: 6,147,911
[45] Date of Patent: Nov. 14, 2000

[54] NONVOLATILE SEMICONDUCTOR MEMORY DEVICE

[75] Inventors: Ken Takeuchi, Tokyo; Tomoharu Tanaka, Yokohama, both of Japan

[73] Assignee: Kabushiki Kaisha Toshiba, Kawasaki, Japan

[21] Appl. No.: 09/497,889

[22] Filed: Feb. 4, 2000

Related U.S. Application Data

[63] Continuation of application No. 09/290,995, Apr. 14, 1999, Pat. No. 6,069,823, which is a continuation of application No. 08/968,137, Nov. 12, 1997, Pat. No. 5,920,507, which is a continuation of application No. 08/747,823, Nov. 13, 1996, abandoned.

[30] Foreign Application Priority Data

Nov. 13, 1995 [JP] Japan .................................. 7-294057
Nov. 14, 1995 [JP] Japan .................................. 7-295137
Apr. 19, 1996 [JP] Japan .................................. 8-098626

[51] Int. Cl.$^7$ .................................................. G11C 16/00
[52] U.S. Cl. ................................ 365/185.28; 365/185.23
[58] Field of Search ........................ 365/185.28, 185.23, 365/185.04, 185.11, 185.17, 185.18

[56] References Cited

U.S. PATENT DOCUMENTS

| | | | |
|---|---|---|---|
| 5,163,021 | 11/1992 | Mehrota et al. | 365/185.03 |
| 5,523,972 | 6/1996 | Rasmid et al. | 365/185.03 |
| 5,712,815 | 1/1998 | Bill et al. | 365/185.12 |
| 5,761,117 | 6/1998 | Uchino et al. | 365/185.03 |
| 5,793,677 | 8/1998 | Hu et al. | 365/185.17 |
| 5,892,710 | 4/1999 | Fazio et al. | 365/185.03 |
| 5,905,673 | 5/1999 | Khan | 365/185.03 |

*Primary Examiner*—Tan T. Nguyen
*Attorney, Agent, or Firm*—Oblon, Spivak, McClelland, Maier & Neustadt, P.C.

[57] ABSTRACT

A non-volatile semiconductor memory device comprising a memory cell array having a plurality of electrically writable memory cells arranged in a matrix form, each of the memory cells having three or more logic states so as to store a multi-value data "i" (i=0, 1, ..., n−1: n≧3), a plurality of data latch circuits for temporarily storing data controlling a write state of the plurality of memory cells of the memory array, write verify circuit for confirming the write state of the plurality of memory cells, and an "i" data batch verify circuit for batch-detecting whether or not the memory cell where data "i" should be written reaches a memory state of data "i."

22 Claims, 50 Drawing Sheets

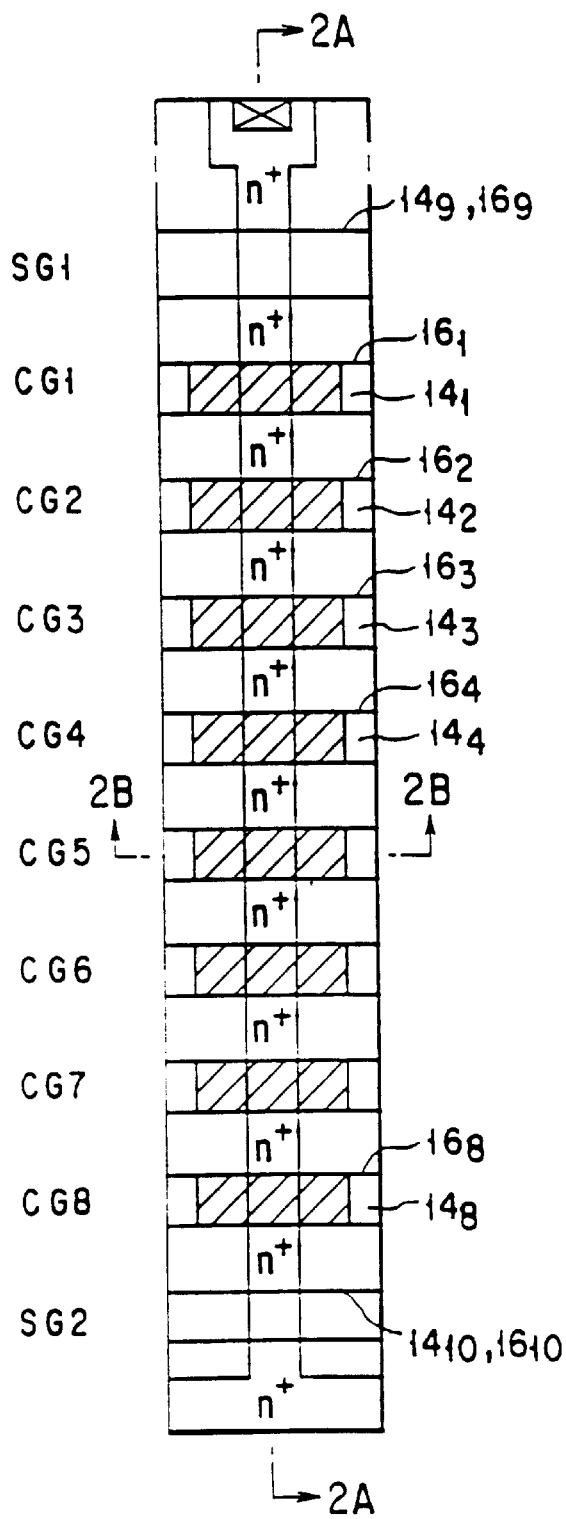
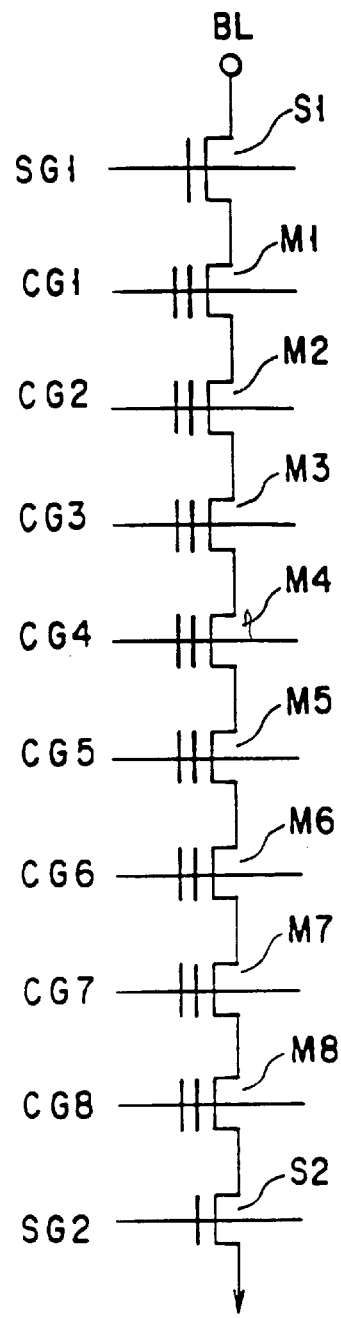
(PRIOR ART)
FIG. 1A
(PRIOR ART)
FIG. 1B

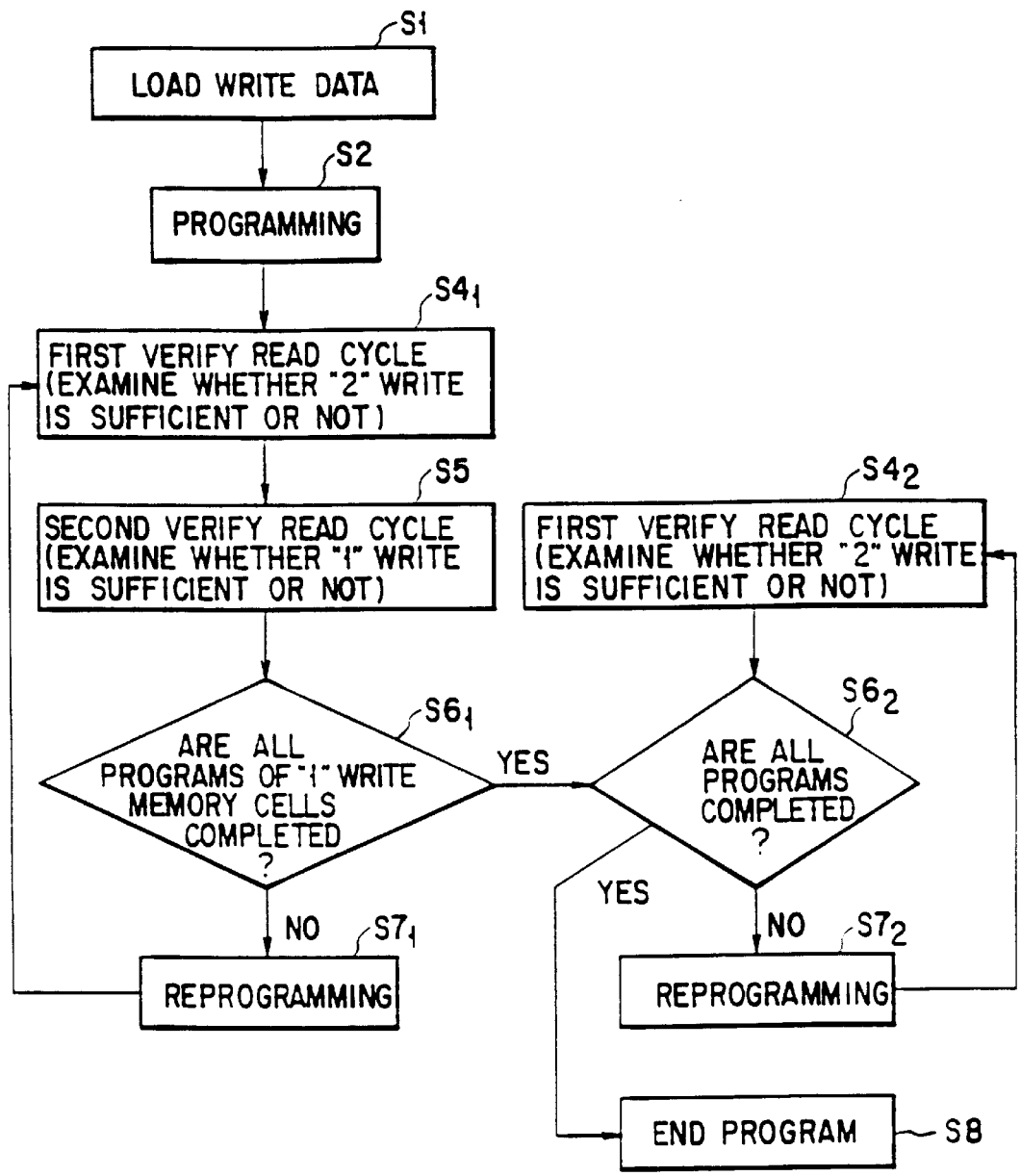
F I G. 6

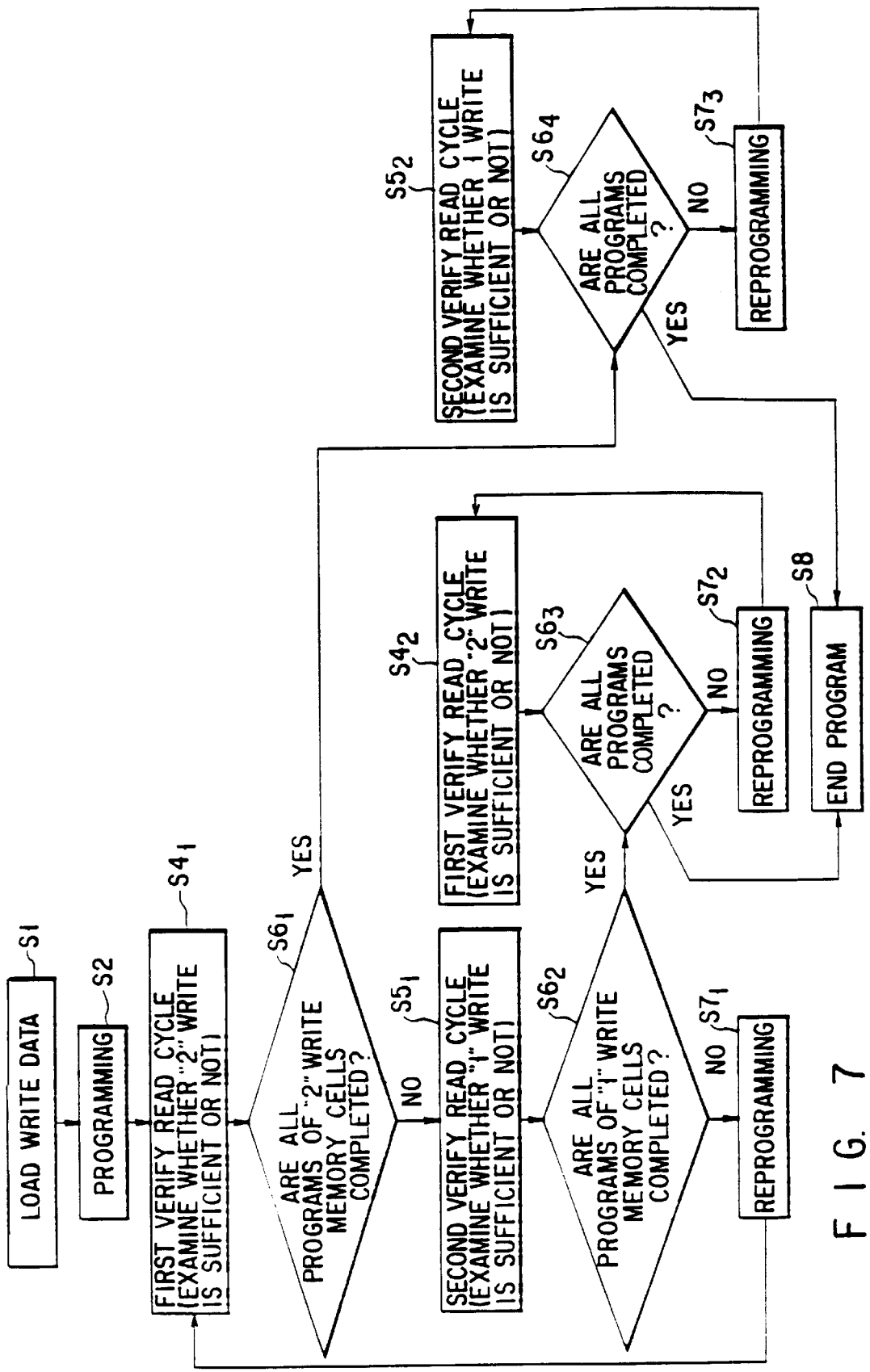
F I G. 7

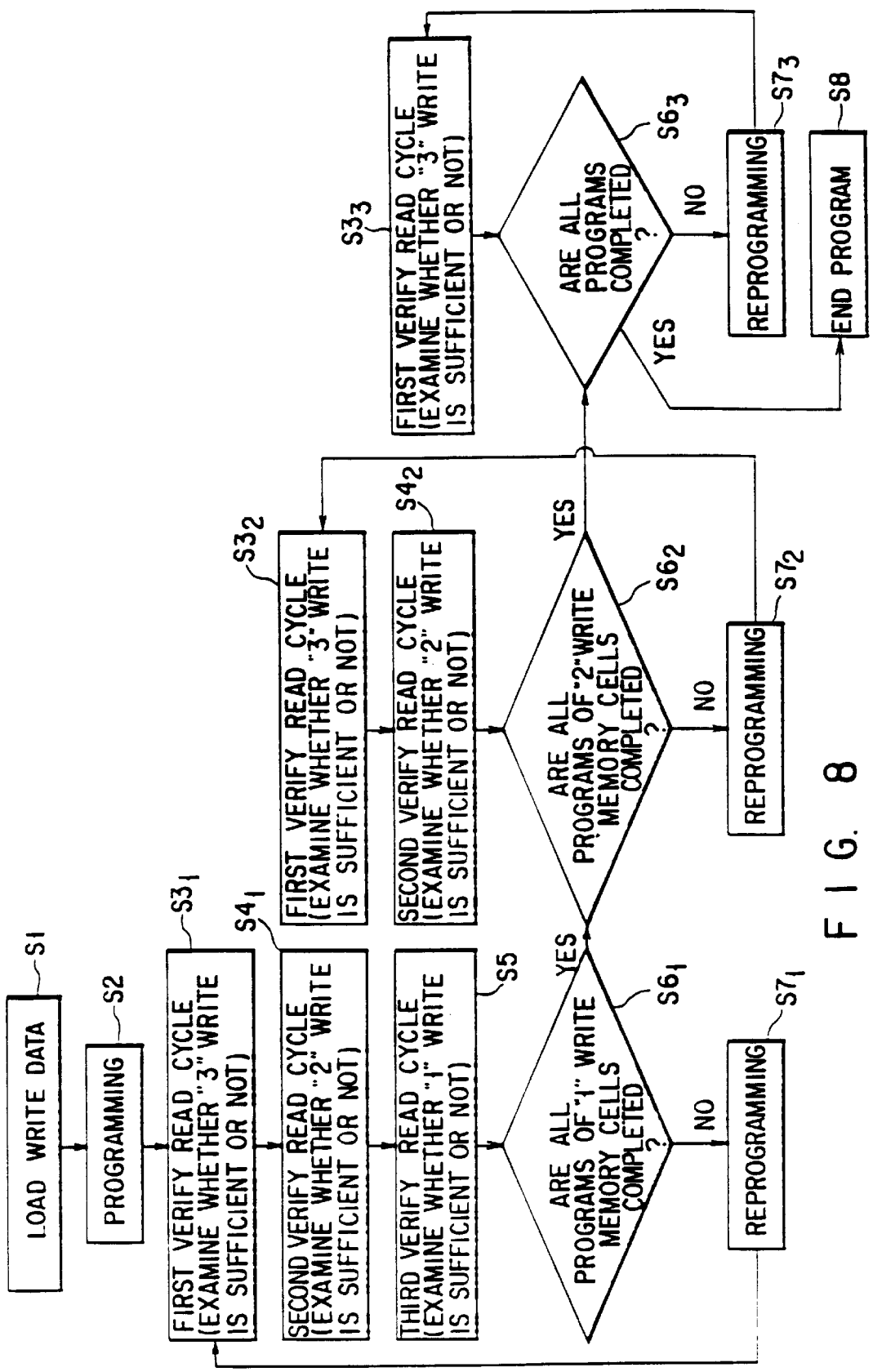
F I G. 8

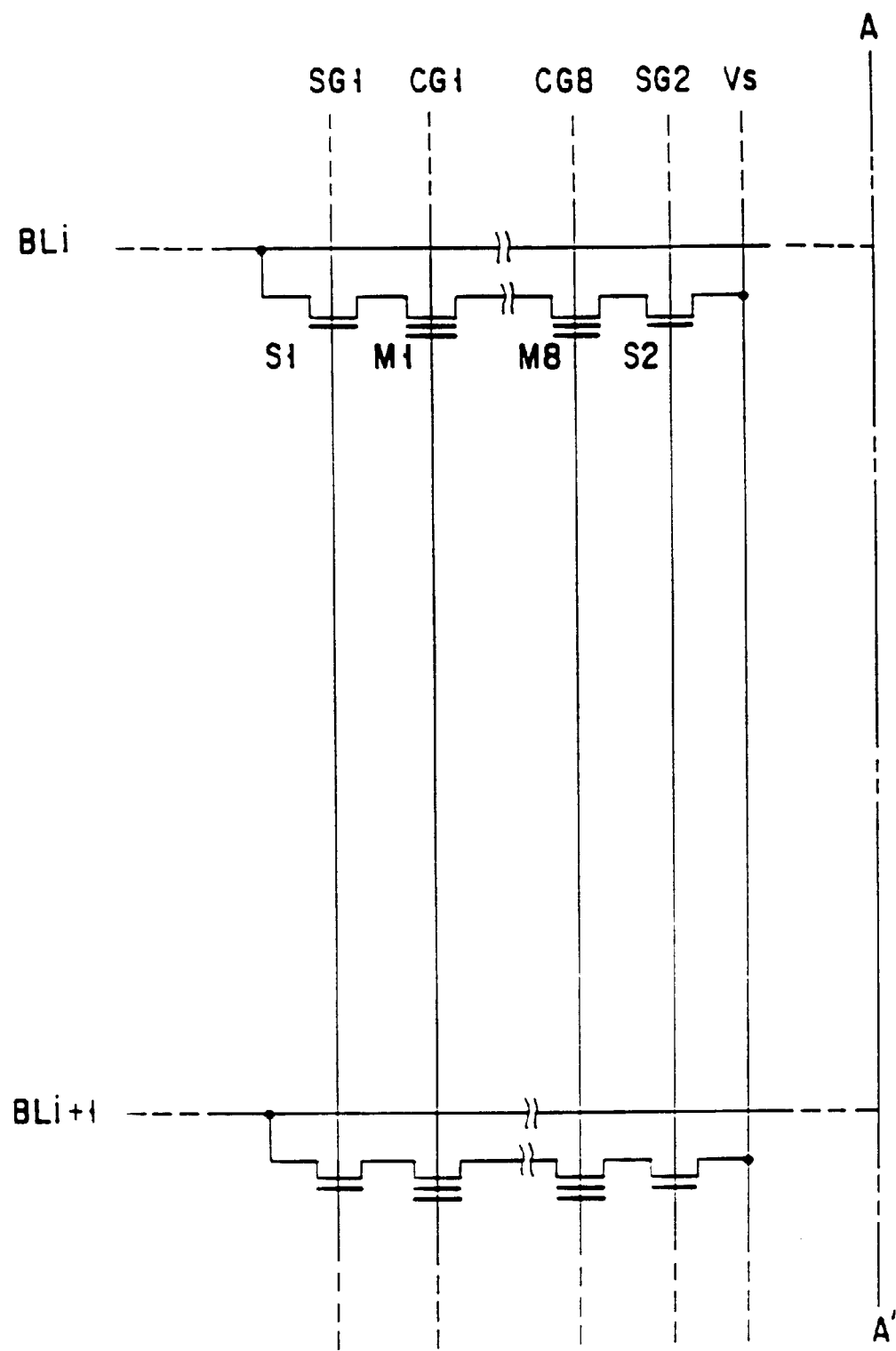
F I G. 10

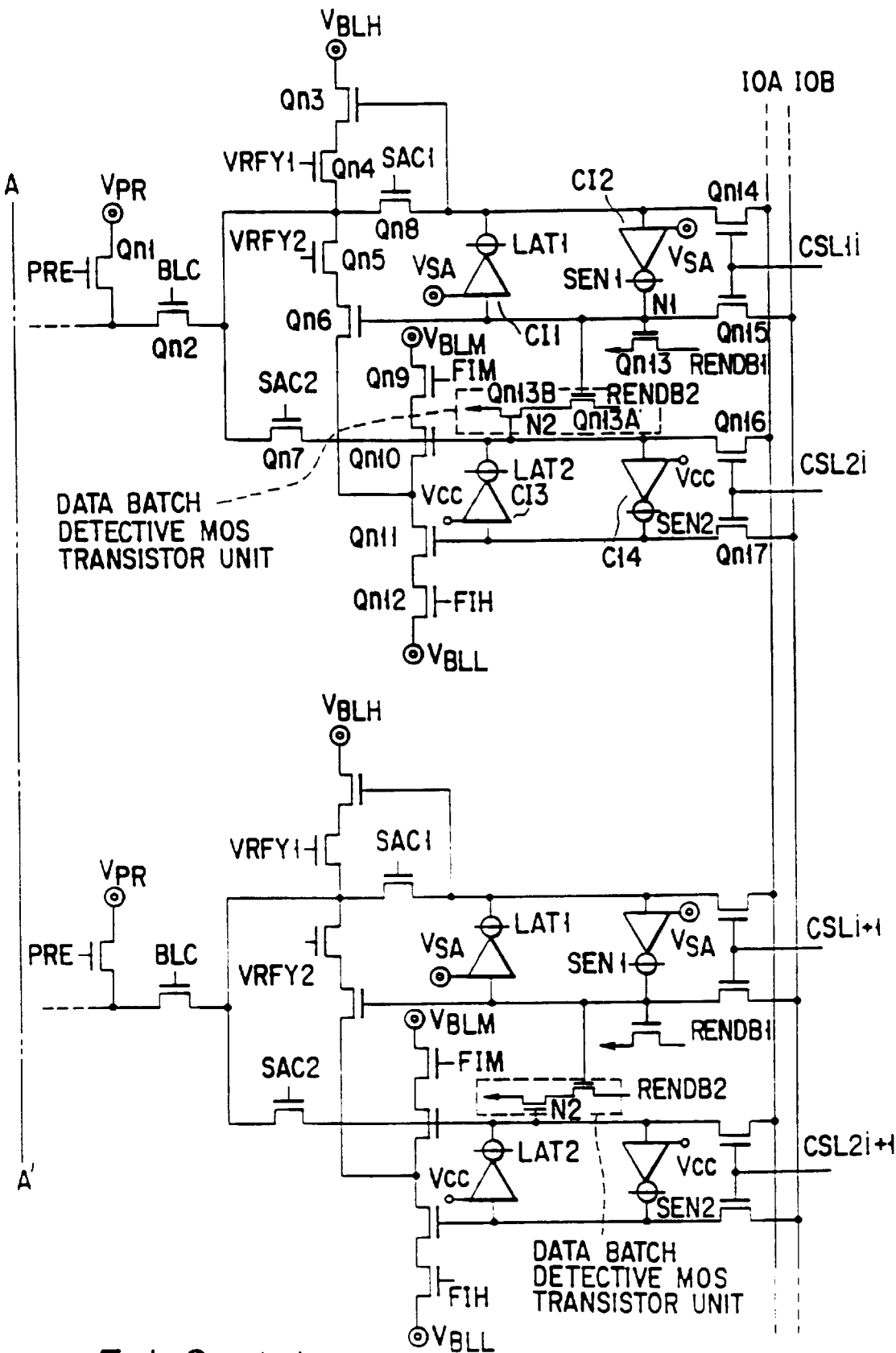
F I G. 11

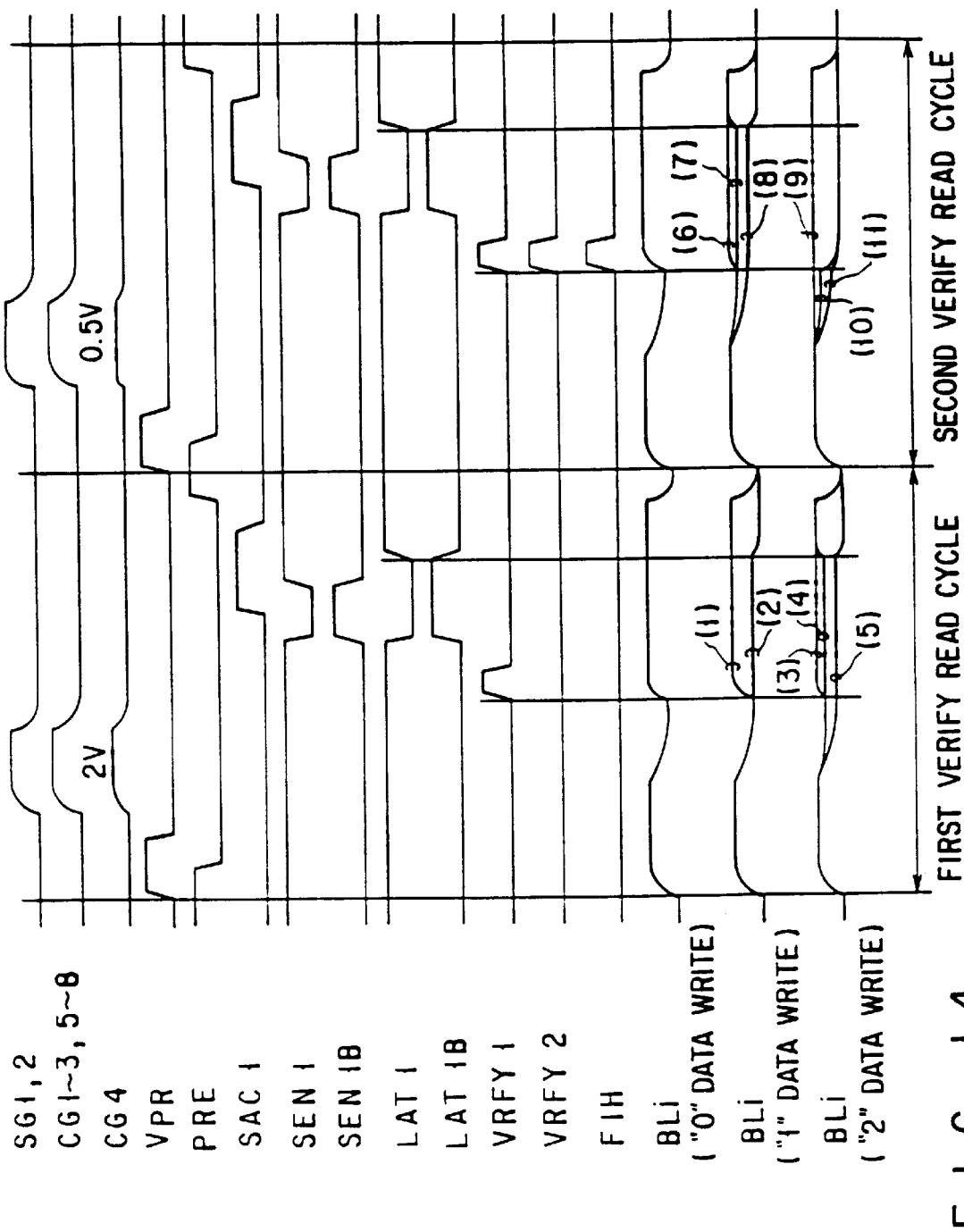
F I G. 14

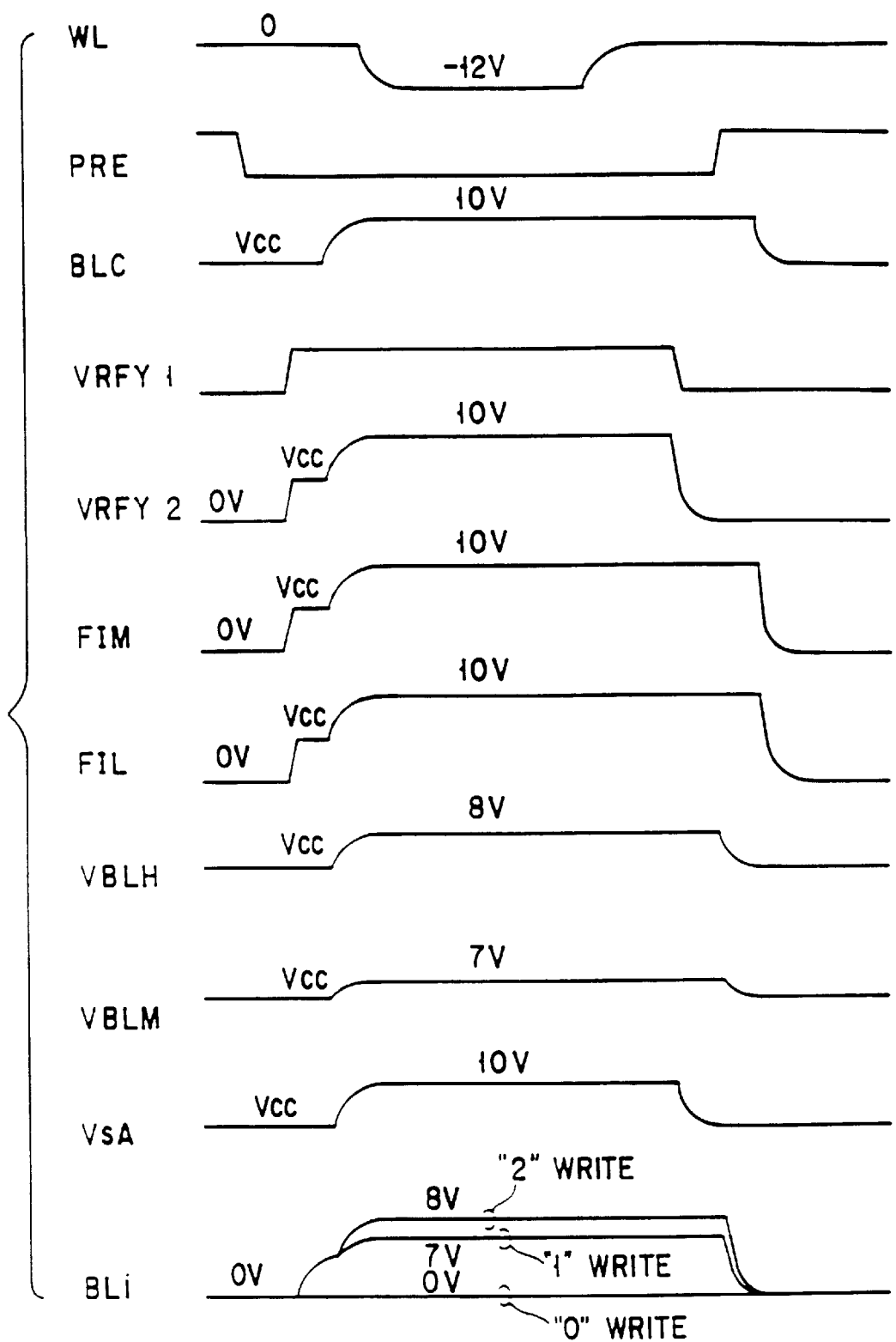
F I G. 18

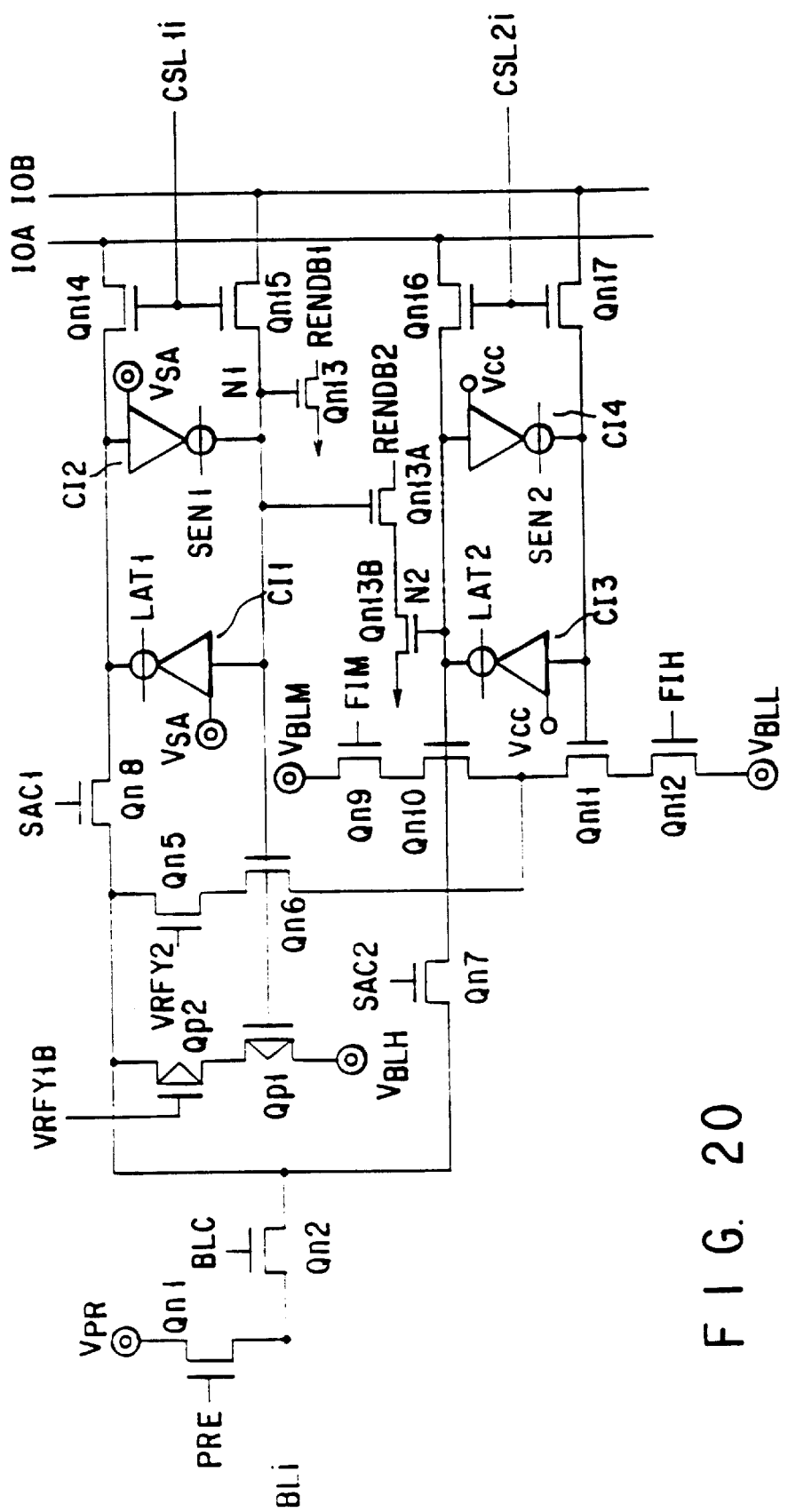
F I G. 20

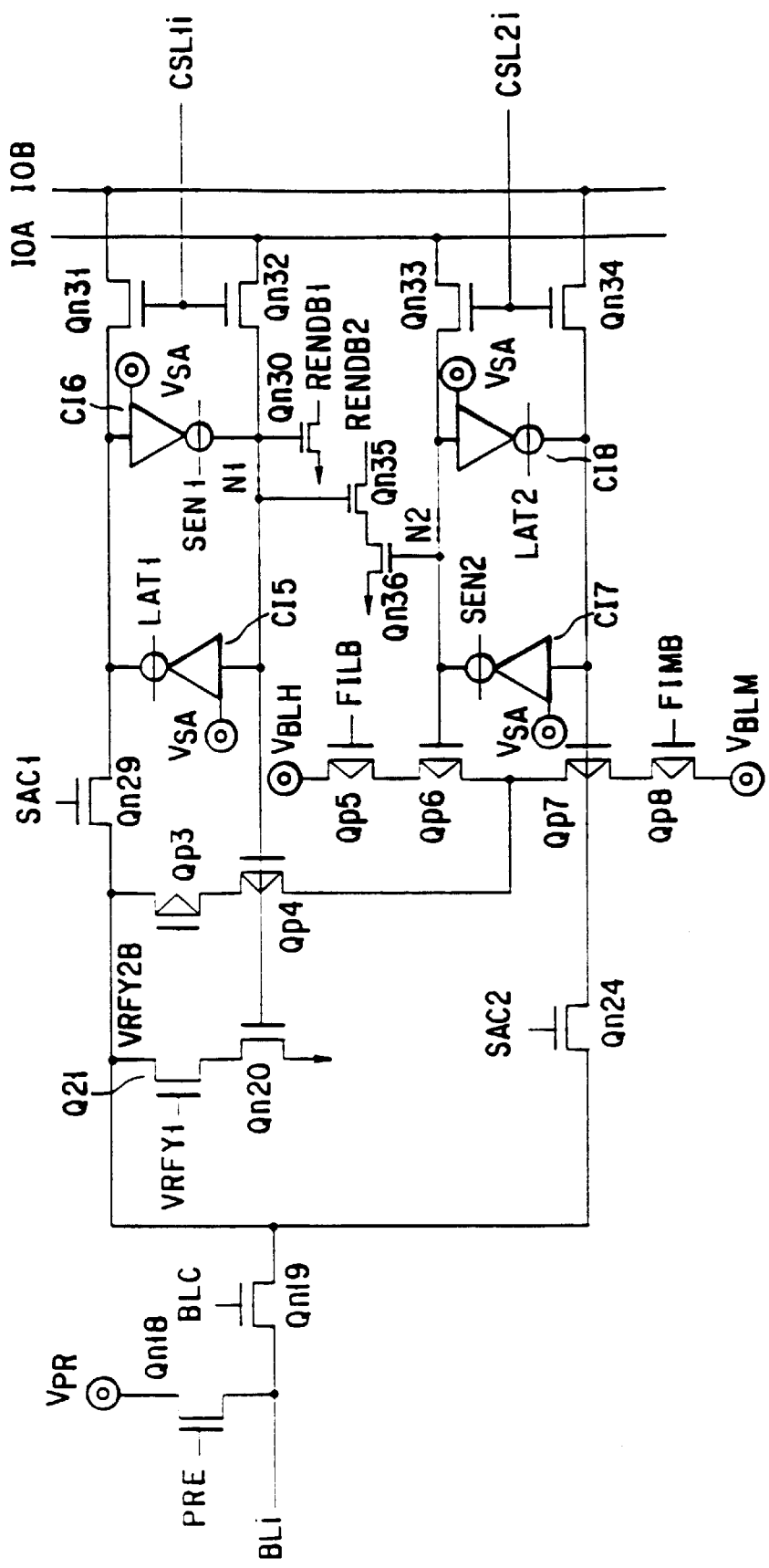
F I G. 21

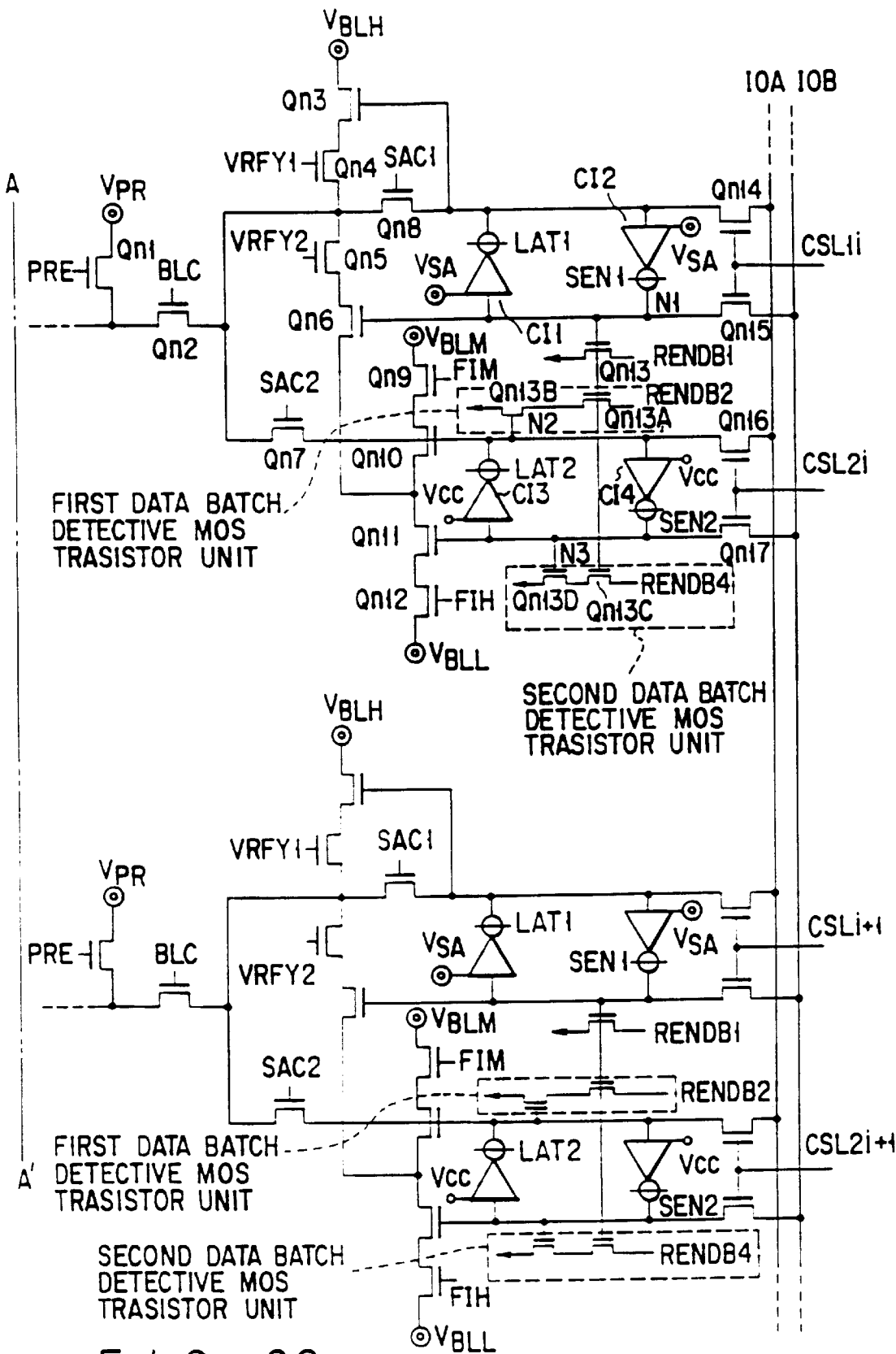
F I G. 22

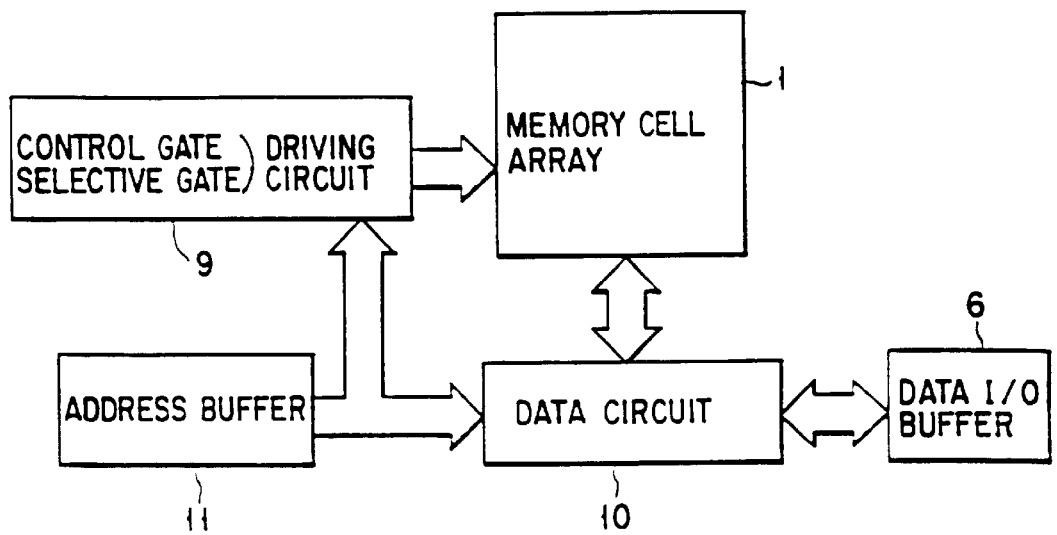
F I G. 24
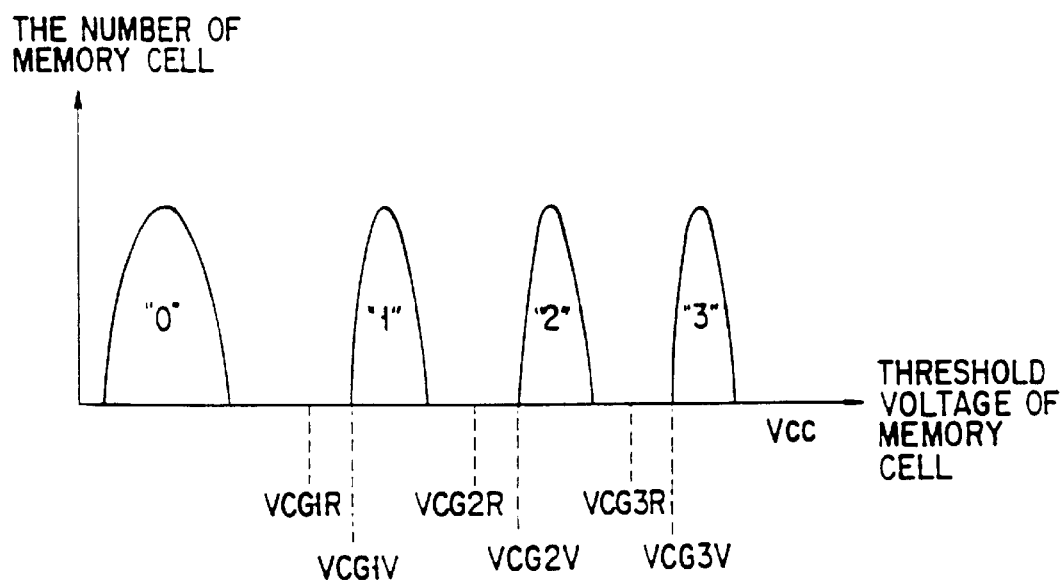
F I G. 26

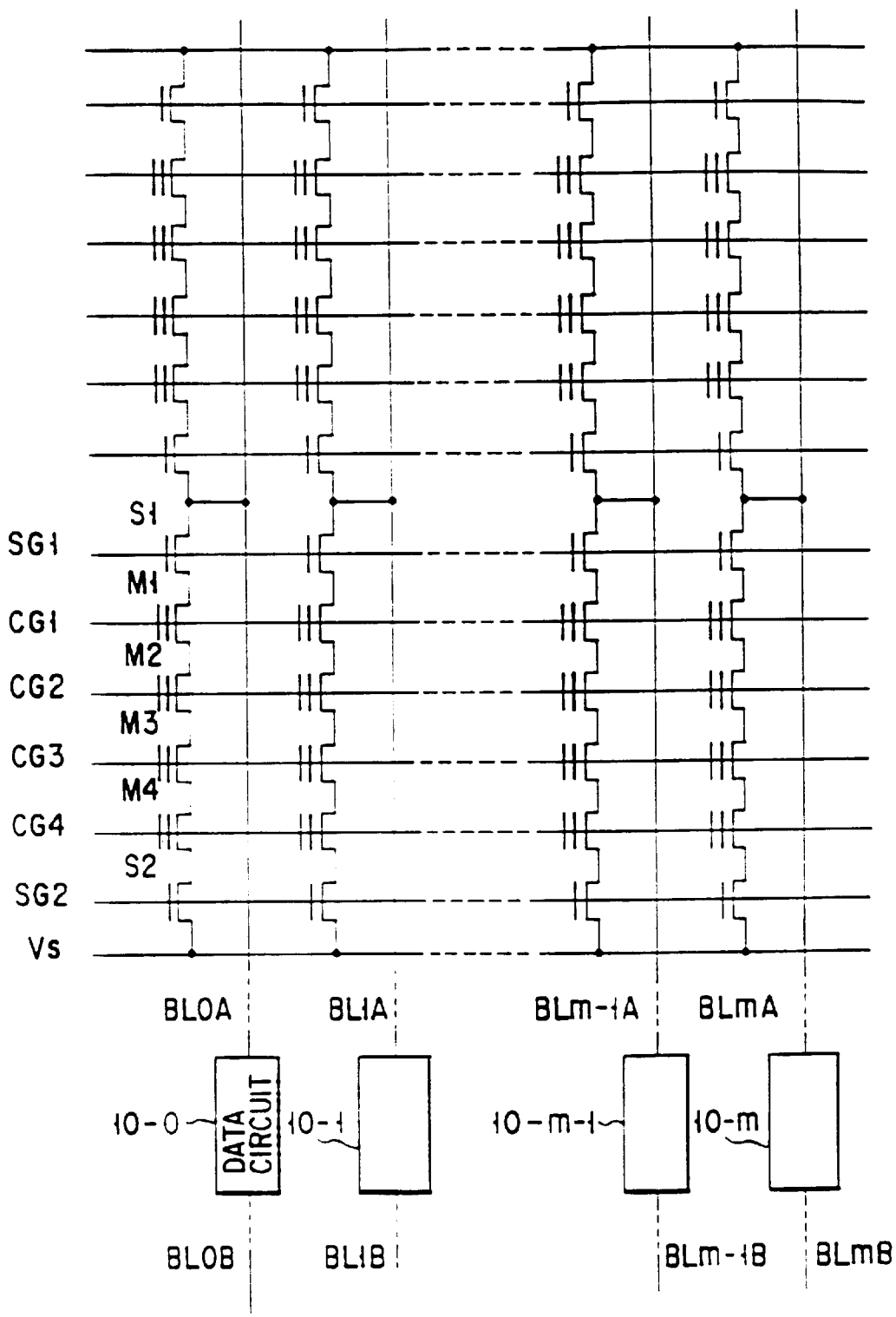
F I G. 25

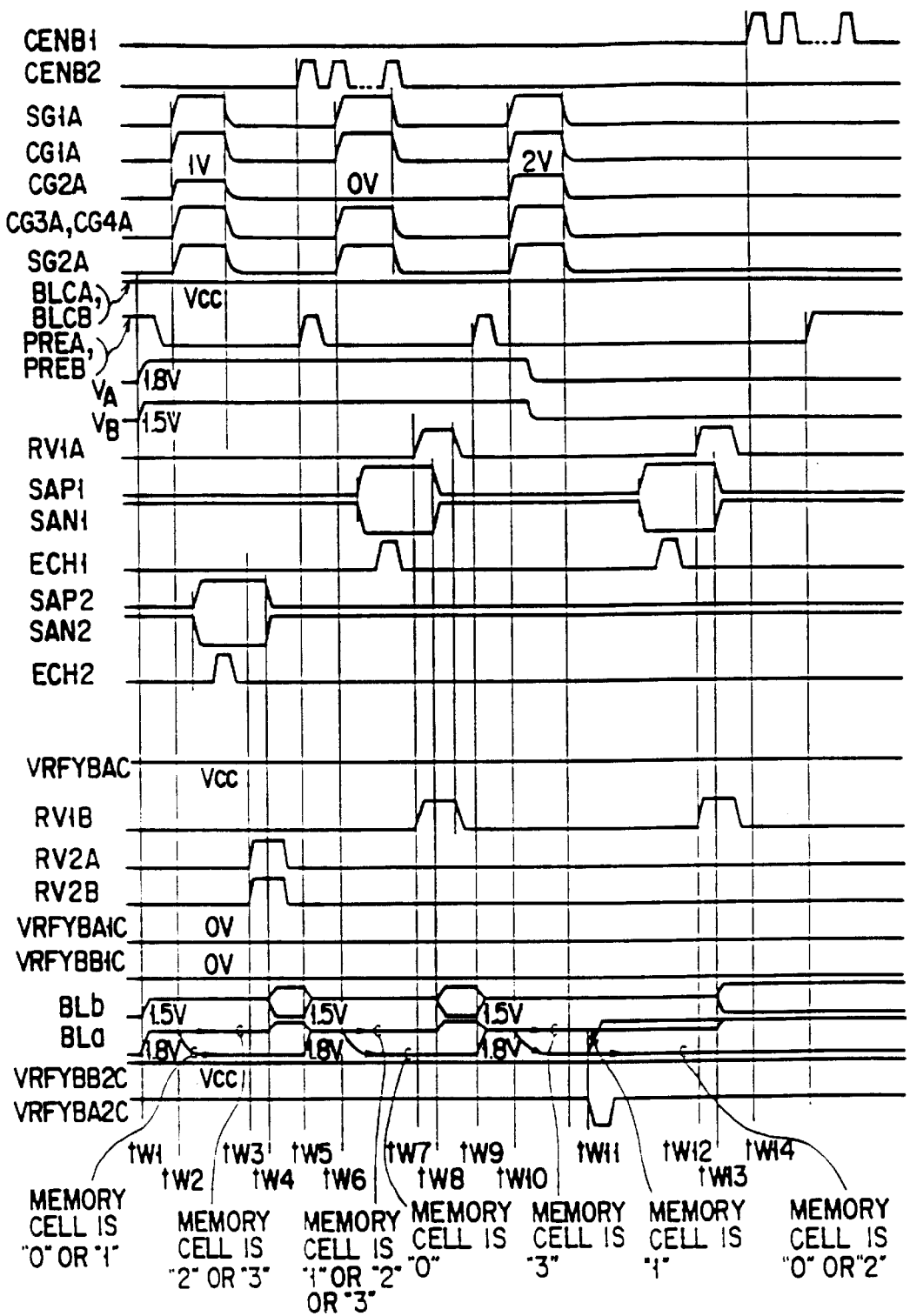
F I G. 30

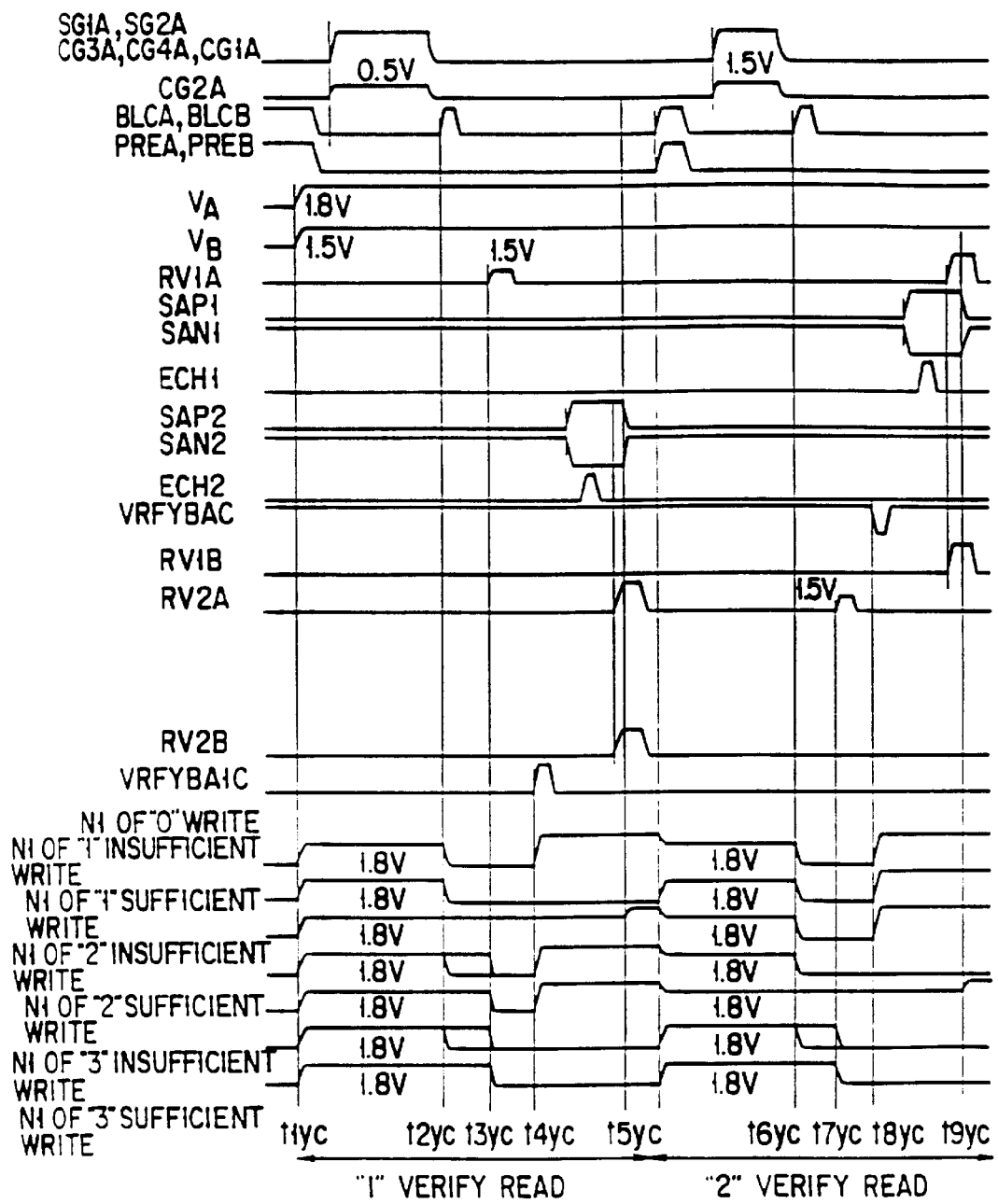
F I G. 32

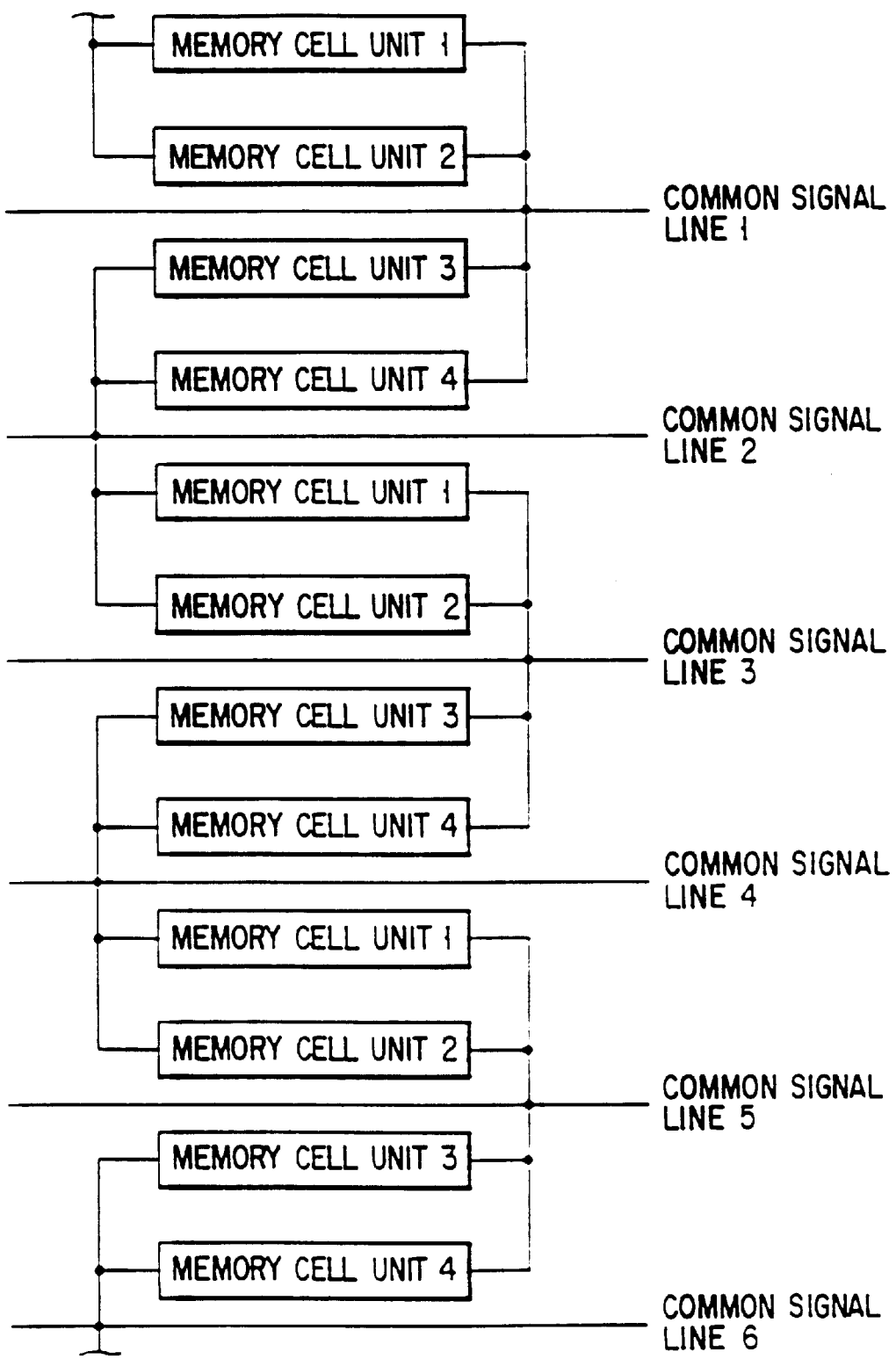
F I G. 35

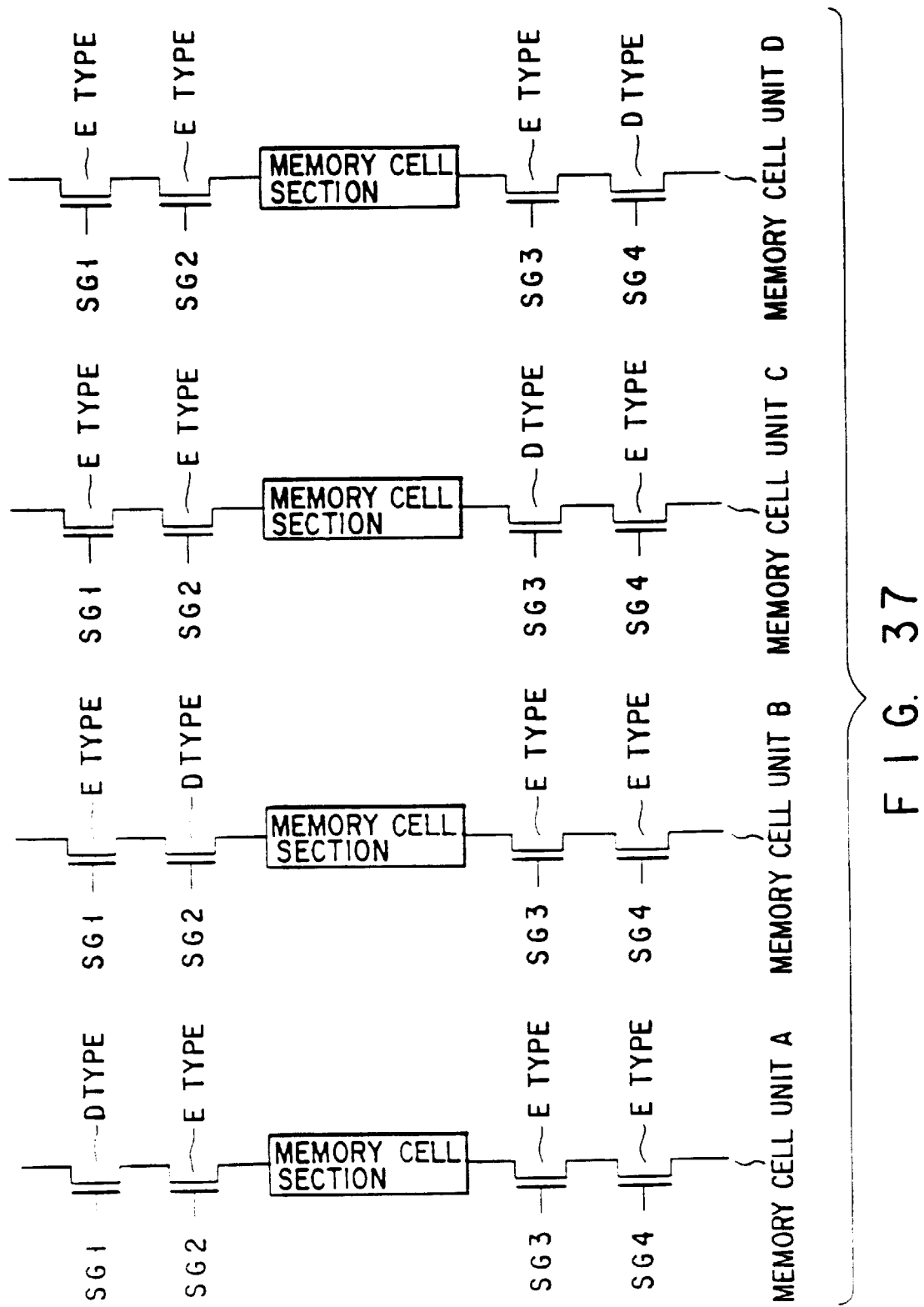
F I G. 37

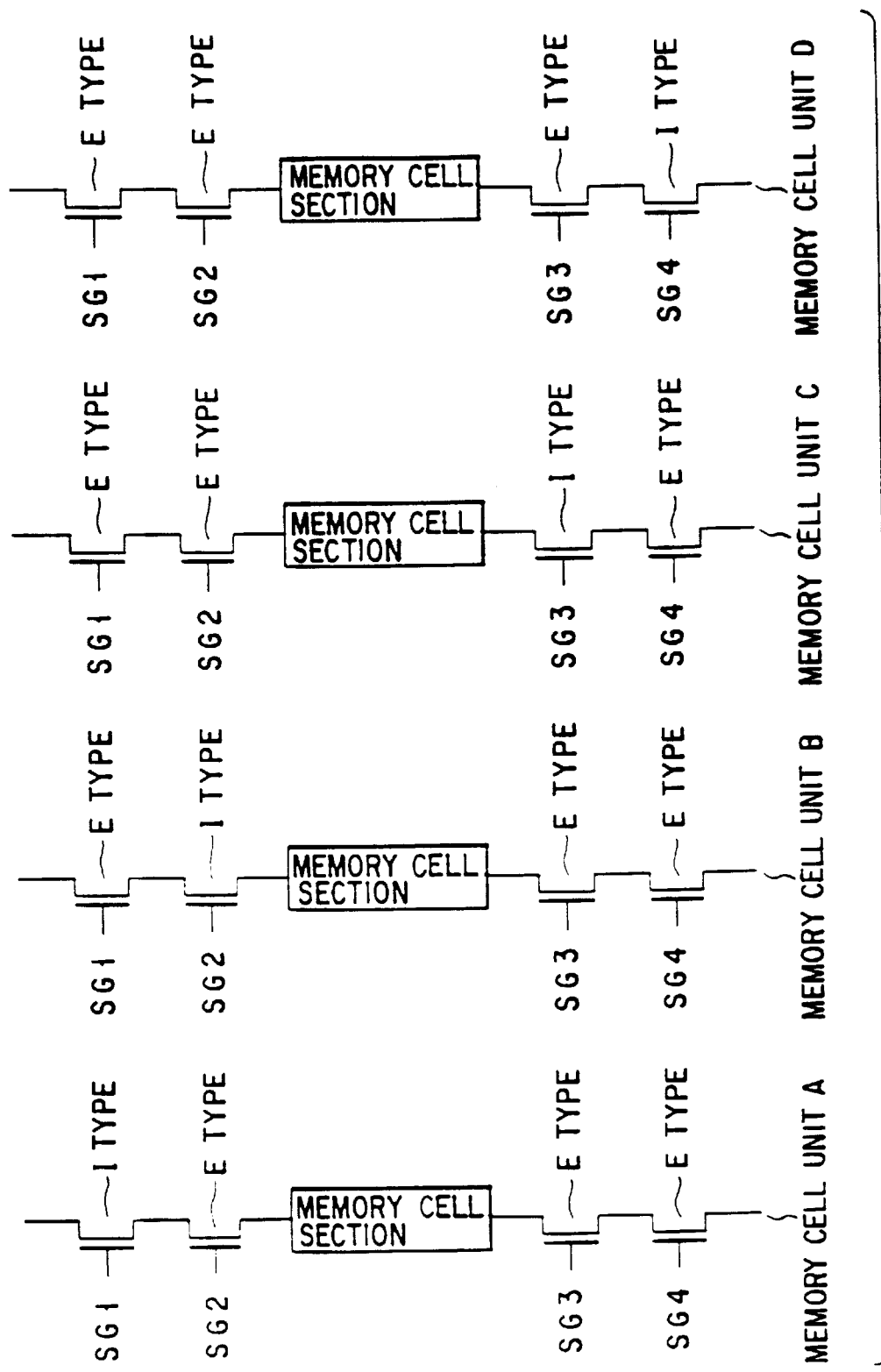
F I G. 38

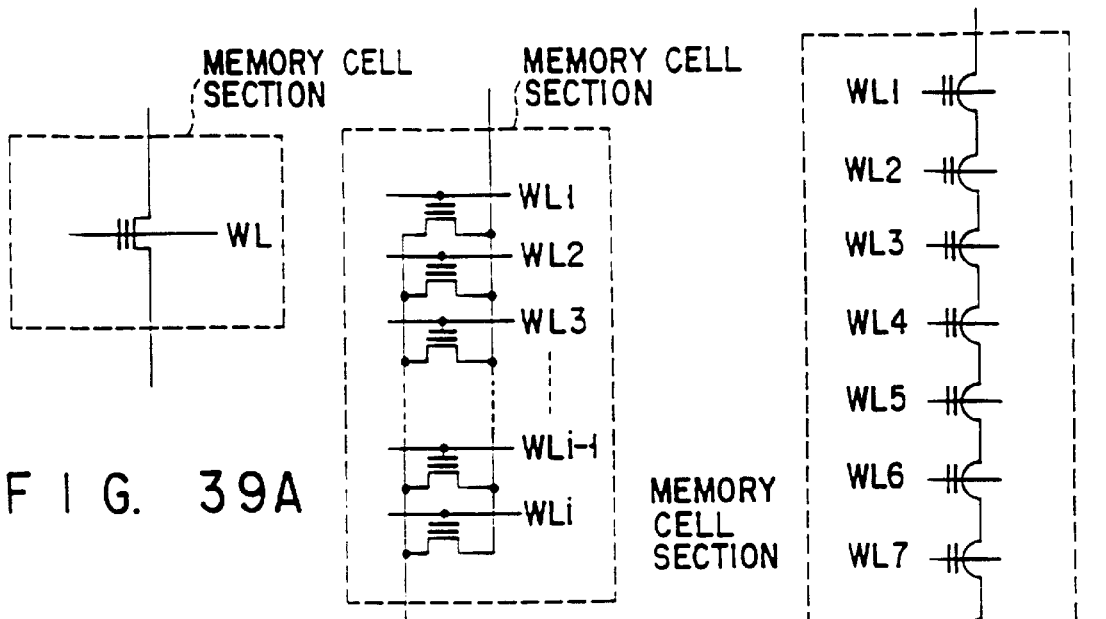
FIG. 39A
FIG. 39B
FIG. 39C
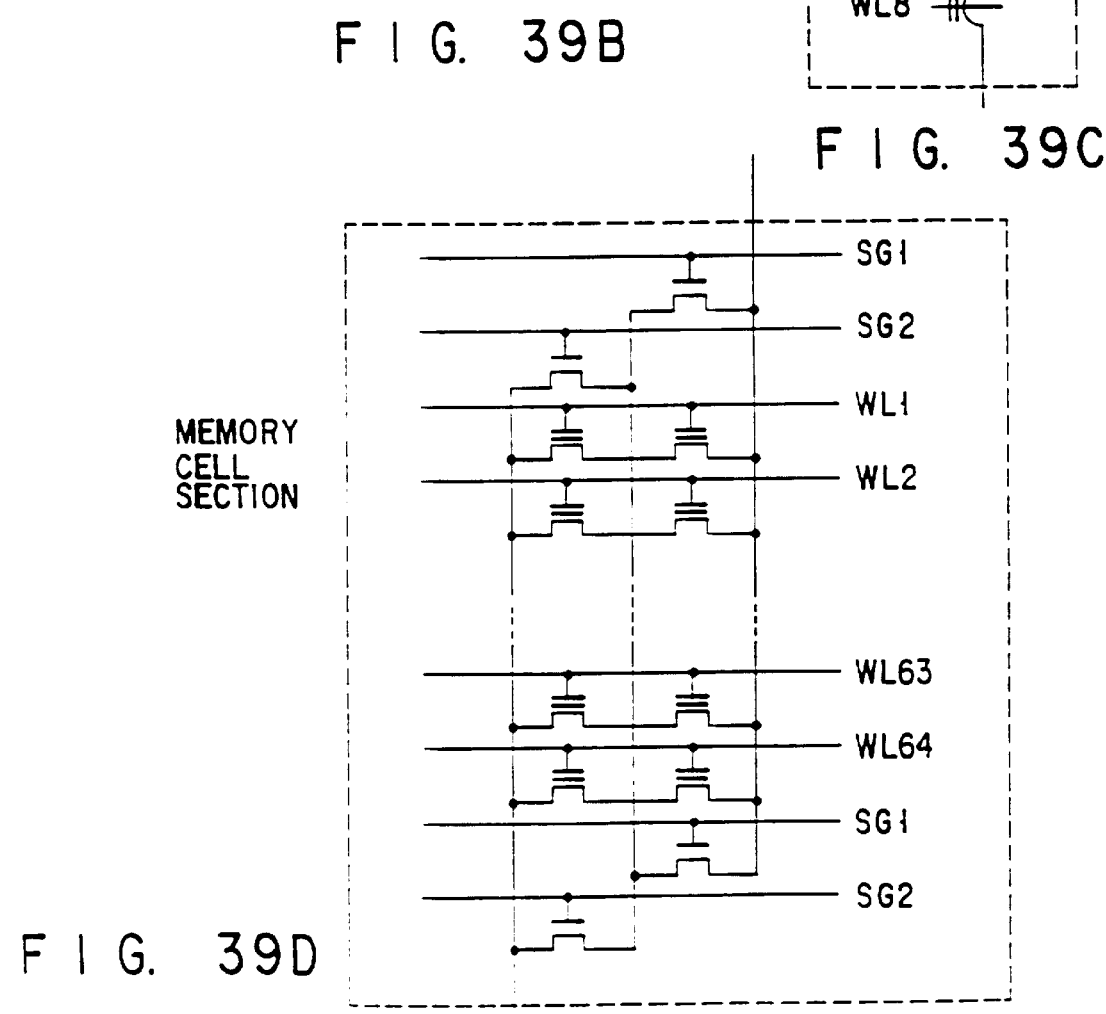
FIG. 39D

FIG. 43  MEMORY CELL MC31  READ OPERATION

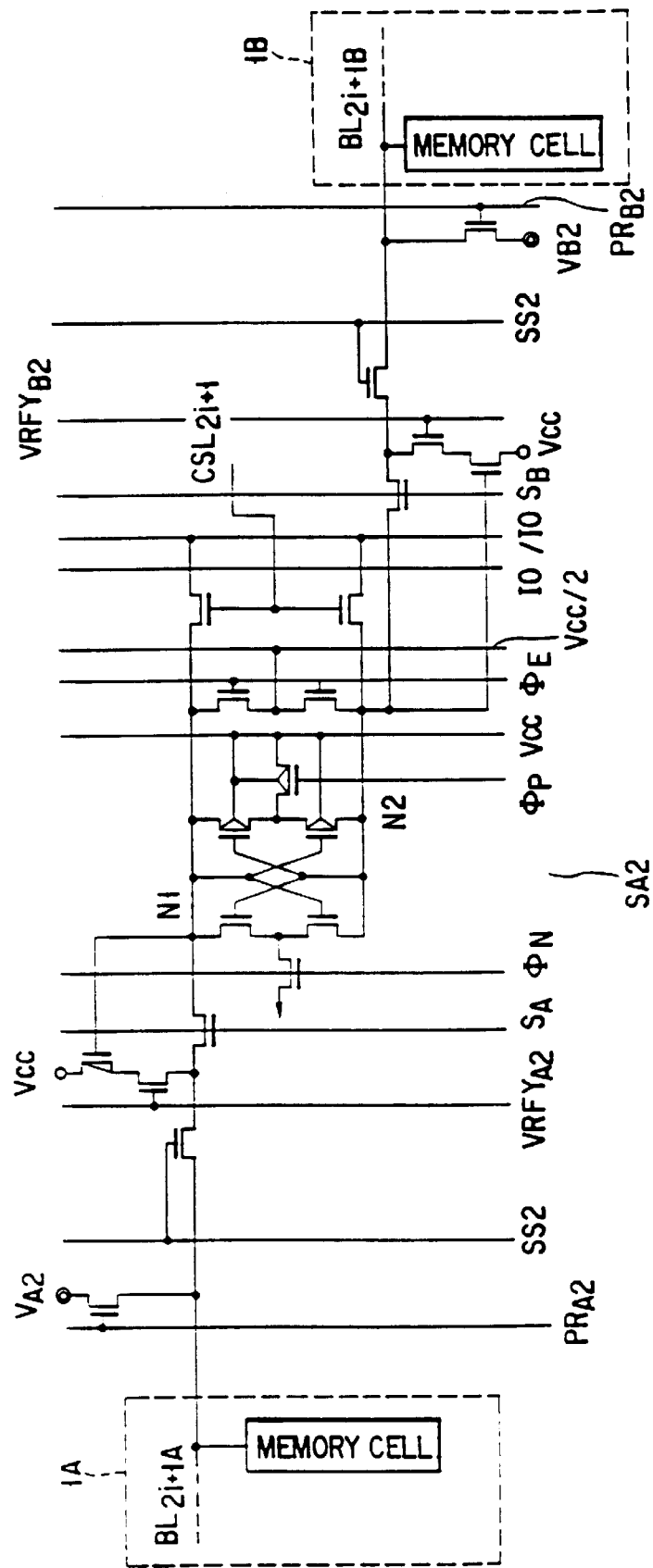
F I G. 45

FIG. 46  MEMORY CELL MC51 READ OPERATION

FIG. 47 MEMORY CELL MC61 READ OPERATION

FIG. 48  MEMORY CELL MC41  READ OPERATION

FIG. 49   MEMORY CELL MC31 WRITE OPERATION

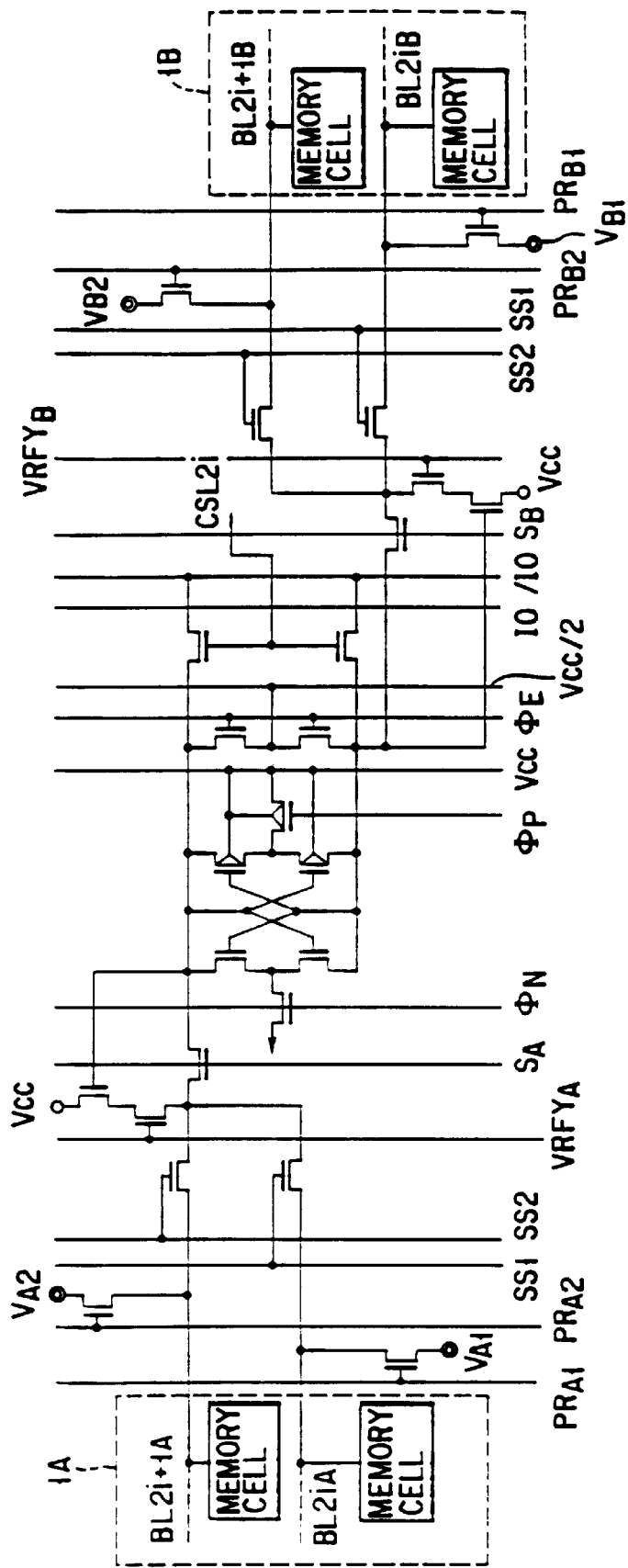
F I G. 51

NONVOLATILE SEMICONDUCTOR MEMORY DEVICE

This application is a Continuation of application Ser. No. 09/290,995 filed on Apr. 14, 1999, now U.S. Pat. No. 6,069,823; which is a continuation of application Ser. No. 08/968,137 filed Nov. 12, 1997 now U.S. Pat. No. 5,920,507 which is a continuation of application Ser. No. 08/747,823 filed Nov. 13, 1996 now abandoned.

BACKGROUND OF THE INVENTION

1. Field of the Invention

The present invention relates to an electrically rewritable nonvolatile semiconductor device (EEPROM) and particularly to an EEPROM in which a multi-value memory larger than one bit is stored in one memory cell.

2. Description of the Related Art

As one of electrically rewritable nonvolatile semiconductor memory devices (EEPROM), an NAND type EEPROM in which a high integration can be made is known. In this type of EEPROM, each of a plurality of memory cells has an n-channel FETMOS structure having a floating gate, as a charge storage layer, and a control gate. Then, adjacent memory cells have a source and a drain in which are shared, and is connected in series. The memory cells connected in this manner are to a bitline as one unit. A memory cell array is integrated on a p-type substrate or a p-type well formed on an n-type substrate. The drain side of an NAND cell is connected to the bitline through a select gate, and the source side is connected to a common source line through the select gate. The control gates of the memory cells are sequentially formed in a row direction, and used as a word line.

FIG. 1A is a plan view showing one NAND cell portion of the memory cell array, and FIG. 1B is an equivalent circuit diagram. FIG. 2A is a cross-sectional view taken along line of 2A—2A of FIG. 1A, and FIG. 2B is a cross-sectional view taken along line of 2B—2B of FIG. 1A.

A memory cell array having a plurality of NAND cells is formed on a p-type silicon substrate 11 (or p-type well), which is surrounded with a device isolation oxide film 12. In this example, one NAND cell comprises eight memory cells M1 to M8, which are connected in series. Each of the memory cells comprises a floating gate ($14_1$ to $14_8$) and a control gate 16 ($16_1$ to $16_8$). Each floating gate 14 is formed on the substrate 11 through a tunnel insulating film 13, and each control gate 16 is formed thereon through a gate insulating film 15. An n-type diffusion layer 19 is used as both source and drain, and the adjacent memory cells use the n-type diffusion in common so as to be connected in series.

First select gates $14_9$ and $16_9$ are provided at the drain side of the NAND cell, and second select gates $14_{10}$ and $16_{10}$ are provided at the source side of the NAND cell. The first select gates $14_9$ and $16_9$ are formed at the same time with the floating gates of the memory cells and the control gates. The above-formed substrate is covered with a CVD oxide film 17, and a bitline 18 is formed thereon. The control gates 16 of the NAND cell are provided as control gates CG1 to CG8 in common. These control gates are used as word lines.

The select gates $14_9$, $16_9$ and $14_{10}$, $16_{10}$ are sequentially formed in a row direction, and used as select gate SG1 and SG2, respectively.

FIG. 3 shows an equivalent circuit of the memory cell array having such NAND cells arranged in a matrix form. One source line per 64 bitlines is connected a substrate voltage line of Al, polysilicon, etc., through a contact. The substrate voltage line is connected to a peripheral circuit. The control gates of the memory cell and the first and second select gates are sequentially formed in a row direction. Normally, a set of memory cells, in which a plurality of the memory cells are connected to the control gates, is called as one page. Then, a set of pages, which are sandwiched between a pair of select gates (first selection gate on the drain side and second select gate on the source side) is called one NAND block or simply one block.

An operation of an NAND cell type EEPROM will be explained as follows.

The data write operation is performed from the memory cell, which is far from the bitline, in order. A boosted voltage Vpp (=about 20V) is applied to the control gate of the selected memory cell. An intermediate voltage Vm (=about 10V) is applied to the control gates of the other non-select memory cells and the first select gate. 0V ("0" state) or an intermediate potential ("1" state) is applied to the bitline in accordance with data. At this time, the potential of the bitline is transmitted to the select cell. At the time of "0" state, a high voltage is applied to the floating gate of the select memory cell and the substrate. As a result, an electron is tunnel-injected to the floating gate from the substrate, and a threshold voltage is moved to a positive direction. At the time of "1" state, the threshold voltage is unchanged.

Data erasing is performed by the block unit at substantially the same time. Specifically, all control gates of the blocks to be erased and the select gates are set to "0" state, and a boosted voltage VppE (about 20V) is applied to a p-type well and an n-type substrate. VppE is also applied to the control gates of the blocks and the select gates, which no erasing is performed. As a result, in the memory cells of the erasing blocks, the electron of the floating gate is discharged to the well and the threshold voltage is moved to the a negative direction.

A data read operation is performed as follows.

Specifically, the control gate of the selected memory cell is set to "0" state, and the control gates of the other memory cells are set to a power-supply voltage Vcc (e.g., 3V). Then, the data read operation is performed by detecting whether a current flows into the select memory cell or not. In a NAND cell type EEPROM, since the plurality of memory cells are connected in a cascade form, an amount of cell currents is small at the reading time. Moreover, since the control gate of the memory cell and the first and second select gates are continuously arranged in a row direction, data for one page is simultaneously read to the bitline.

Because of the limitation of the read operation, the threshold voltage after write "1" state must be controlled to be between 0V to Vcc. Due to this, a verify write is performed, only a memory cell in which "1" is insufficiently written is detected. Then, rewrite data is provided to execute a rewrite operation of only the memory cell in which "1" is insufficiently written (verify write of each bit). The selected control gate is set to, for example, 0.5V (verify voltage) to execute the verify read, so as to detect the memory cell in which "1" insufficiently written.

In other words, if the threshold voltage of the memory cell is not 0.5V or more, the current flows into the select memory cell, and the memory cell is detected as the memory cell in which "1" is insufficiently written. The current naturally flows into the memory cell of "0" state. Due to this, a verify circuit for compensating for the current flowing into the memory cell is provided so that the memory cell is not erroneously recognized as the memory cell in which "1" insufficiently is written. A write verify is performed at a high speed by the verify circuit.

The write and the write verify operations are repeated to execute the data write operation, so that write time of each memory cell is optimized, and the threshold voltage after write "1" must be controlled to be between 0V to Vcc.

In the above-explained NAND cell type EEPROM, there is proposed a multi-value memory cell storing three data "0", "1", "2" or more in a state after write operation (FIG. 4A). In this case, for example, in a "0" state, the threshold voltage is set to be negative. In a "1" state, the threshold voltage is set to from 0V to Vcc/2. In a "2" state, the threshold voltage is set from Vcc2 to Vcc.

FIG. 4B shows a conventional verify read operation to check whether or not write operation is sufficiently is performed in this type of ternary memory cell.

In the write operation, after a write voltage (Vpp) is applied to the control gate of the memory cell (steps S1, S2), a first verify read cycle (step S4) and a second verify read cycle (step S5) are sequentially performed. The first verify read cycle checks whether or not "2" state is sufficiently written, and the second verify read cycle checks whether or not "1" state is sufficiently written. A write pulse is applied to the memory cell in which data is insufficiently written (step S7). Thus, the verify first cycle, the verify second cycle, and the rewrite are repeated until all memory cells are sufficiently written (steps S4 to S7).

The steps of the above-mentioned write operation are the same as the case of a four-value memory cell shown in FIGS. 5A and 5B. Specifically, at the time of a verify read operation second cycle (step S4), and third verify read cycle (step S5) are sequentially performed. The first verify read cycle checks whether or not "3" is sufficiently written (step 3), the second verify read cycle checks whether or not "2" is sufficiently written, and the third verify read cycle checks whether or not "1" is sufficiently written.

However, in this type of EEPROM, the following problems exist in write operation.

Specifically, for example, in the ternary memory cell, data "1" whose write threshold value is small is sufficiently written. Thereafter, "2" is sufficiently written. According to the conventional write method, in the memory cell in which "1" is written, after the memory cell in which "1" is written is sufficiently written, the unnecessary second verify read cycle for checking whether or not "1" is sufficiently written is performed until the writing of "2" is completed. As a result, verify read time is increased, and the entire write time is increased.

In the case of the four-value memory cell, data "1" whose write threshold value is small is first written. Thereafter, "2" write operation is sufficiently written, and "3" is sufficiently written. According to the conventional write method, in the memory cell in which "1" is written, after "1" is sufficiently written, the unnecessary second verify read cycle for checking whether or not "1" is sufficiently written is performed until the writing of "2" and "3" are completed. Then, in the memory cell in which "2" is written, after "2" is sufficiently written, the unnecessary second verify read cycle for checking whether or not "3" is sufficiently written is performed until the writing of "3" is completed. As a result, verify read time is increased, and the entire write time is increased.

In the conventional nonvolatile semiconductor memory device (EEPROM), the following problems other than the above-mentioned problems peculiar to the multi-value storable EEPROM exist.

Specifically, in the NAND cell type EEPROM, the control gate of the memory cell selected at the time of data reading is set to 0V, and the control gates of the other memory cells is set to Vcc (e.g., 3V) to detect whether or not a cell current Icell flows. In this case, the amount of the cell current is influenced by not only the threshold voltage to be read but also the threshold voltages of all residual cells connected in series. In the case of one NAND cell comprising eight memory cells connected in series, all threshold voltages of eight cells connected in series are in a negative state ("1" state) if the amount of the cell current Icell (best) is the largest (the amount of resistance is the smallest). If the amount of the cell current Icell (worst) is the smallest (the amount of resistance is the largest), the memory cell (e.g., MC1 of FIG. 3) of the first bitline contact side is read as "1" when the threshold voltages of the other cells connected to the read cells in series are in a positive state ("0" state).

The cell current flows to the source line from the bitline through the memory cell. In the conventional memory cell array, the source is shared in the NAND cell for one page to be read at the same time (FIG. 3). For reading the memory cell, which is the farthest from the contact between the source and the substrate voltage line (memory cell MC1 of FIG. 3), the following case is assumed.

Specifically, the threshold voltages of the other seven cells connected to the memory cell MC in series, and the resistance of the other NAND columns having the source in column is minimum (the amount of the cell current (best) is the largest). In this case, at an initial read time, the cell current flows from the small NAND column, and the resistance of the source line is large. As a result, the potential of the source line of the NAND cell to which the memory cell MC1 belongs is set to I (I: cell current flowing at the initial read time, R: resistance of the source line).

In other words, the source of the memory cell of the NAND column including the memory cell MC floats from a ground potential Vss. As a result, the voltage between the source and the drain of the memory cell and the voltage between the source and gate. Moreover, since a substrate bias effect occurs due to the float of the source from Vss, conductance of the memory cell of the NAND cell column including MC1 is reduced. Thus, since the source line floats from the ground potential when the resistance of the source line is large, the cell current does not easily flow in the NAND column in which the amount of the cell current is small.

To read a negative threshold voltage of the memory cell, "1" state, it is needed that the bitline potential be reduced from a precharge potential by ΔVB. The maximum value of bitline discharge time TRWL is determined when the amount of the cell current is the smallest. In a case where the source line does not float, TRWL=CB (bitline capacitance)/Icell (worst). In the above-mentioned memory cell, since the source line floats, TRWL is further increased, and random access time is increased.

In the conventional NAND cell type EEPROM, the bitlines having the same number as the number of the memory cell columns are provided in the column direction as shown in FIG. 3. There is possibility that the size of the memory cell will be reduced in the column direction in the future by a trench device separation technique (Aritome et. al., IEDM Tech. Dig. pp. 61 (1944)) and the like. Due to this, it will be difficult to process the bitline by the same pitch as the memory cell column.

For storing multi-value data in the conventional NAND cell type EEPROM and executing the verify write of each bit by the verify circuit, the following verify read cycles are performed until the writing of all data is completed.

For example, at the time of the verify read, in the ternary memory cell, two verify read cycles are performed, and in the four-value memory cell, three verify read cycles are performed. As a result, verify read time is increased, and the entire write time is increased.

In the conventional EEPROM, since the source line floats from the ground potential, the bitline discharge time is increased, and the random access time is also increased. Moreover, in the conventional EEPROM, the bitlines having the same number as the number of the memory cell columns are provided in the column direction. However, if the size of the memory cell is reduced in the column direction by the trench device separation technique, it will be difficult to process the bitline by the same pitch as the memory cell column.

SUMMARY OF THE INVENTION

An object of the present invention is to provide an EEPROM in which an unnecessary verify read can be omitted when storing multi-value data so that time needed for an entire write operation can be reduced.

Another object of the present invention is to provide a non-volatile semiconductor memory device wherein resistance to a source line is lowered so that the floating of the source line can be reduced so as to obtain a high speed random access.

Further, still another object of the present invention is to provide a non-volatile semiconductor memory device wherein a plurality of memory cell columns share bitlines so that a pitch between bitlines in a column direction can be relaxed and a memory cell structure having high density can be realized.

According to the first aspect of the present invention, there is provided a non-volatile semiconductor memory device comprising: a memory cell array having a plurality of electrically writable memory cells arranged in a matrix form, each of the memory cells having three or more logic states so as to store a multi-value data "i" (i=0, 1, . . . , n−1: n≧3); a plurality of data latch circuits for temporarily storing data controlling a write state of the plurality of memory cells of the memory array; write verify means for confirming the write state of the plurality of memory cells; and an data batch verify circuit for batch-detecting whether or not the memory cell where data "i" should be written reaches a memory state of data "i."

Then, preferable manners of the first aspect of the present invention will be described as follows.

(1) in an electrical data write operation in which the write operation in accordance with the contents of the data latch circuits and the write verify operation for confirming the write state of the memory cells are continued till the plurality of memory cells reach a predetermined write state, when the "i" data batch verify circuit batch-detects the memory cell where data "i" should be written reaches the memory state of data "i", a write verify operation of data ("i" data verify read) is not performed in the following write verify operation.

(2) In an electrical data write operation in which the write operation in accordance with the contents of the data latch circuits and the write verify operation for confirming the write state of the memory cells are continued till the plurality of memory cells reach a predetermined write state; when the "i" data batch verify circuit batch-detects that there is not data "i" in write data input from an external section, a write verify operation of data "i" ("i" data verify read) is not performed in the following write verify operation.

In an electrical data write operation in which the write operation in accordance with the contents of the data latch circuits and the write verify operation for confirming the write state of the memory cells and the renewal of the of the data latch circuits are continued till the plurality of memory cells reach a predetermined write state; when the "i" data batch verify circuit batch-detects that there is not data "i" in read data input from an external section, a write verify operation of data "i" ("i" data verify read) is not performed in the following write verify operation.

(3) In an electrical data write operation in which the write operation in accordance with the contents of the data latch circuits and the write verify operation for confirming the write state of the memory cells are continued till the plurality of memory cells reach a predetermined write state, at a first write verify operation, "i" data verify read is performed from i=1 to i=n−1 so as to confirm whether or not the memory cell where data "i" (i=1, 2, . . . , n−1) should be written reaches the memory state of data "i"; when a first data batch verify circuit batch-detects that the memory cell where data "i" should be written reaches a memory state of data "1", "i" data verify read is performed from i=2 to i=n−1 in the following write verify operation so as to confirm whether or not the memory cell where data "i" (i=2, 3, . . . , n−1) should be written reaches the memory state of data "i"; when a second data batch verify circuit batch-detects that the memory cell where data "2" should be written reaches a memory state of data "2", "i" data verify read is performed from i=3 to i=n−1 in the following write verify operation so as to confirm whether or not the memory cell where data "i" (i=3, 4, . . . , n−1) should be written reaches the memory state of data "i"; and finally, when an i-th (i=1 to n−2) data batch verify circuit batch-detects that the memory cell where data "i" (i=1 to n−2) should be written reaches a memory state of data "i", (n−1)th data verify read is performed in the following write verify operation so as to confirm whether or not the memory cell where data "n−1" should be written reaches the memory state of data "n−1."

In an electrical data write operation in which the write operation in accordance with the contents of the data latch circuits and the write verify operation for confirming the write state of the memory cells and the renewal of the of the data latch circuits are continued till the plurality of memory cells reach a predetermined write state; at a first write verify operation, "i" data verify read is performed from i=1 to i=n−1 so as to confirm whether or not the memory cell where data "i" (i=1, 2, . . . , n−1) should be written reaches the memory state of data "i"; when a first data batch verify circuit batch-detects that the memory cell where data "1" should be written reaches a memory state of data "1", "i" data verify read is performed from i=2 to i=n−1 in the following write verify operation so as to confirm whether or not the memory cell where data "i" (i=2, 3, . . . , n−1) should be written reaches the memory state of data "i"; when a second data batch verify circuit batch-detects that the memory cell where data "2" should be written reaches a memory state of data "2", "i" data verify read is performed from i=3 to i=n−1 in the following write verify operation so as to confirm whether or not the memory cell where data "i" (i=3, 4, . . . , n−1) should be written reaches the memory state of data "i"; and finally, when an i-th (i=1 to n−2) data batch verify circuit batch-detects that the memory cell where data "i" (i=1 to n−2) should be written reaches a memory state of data "i", (n−1)th data verify read is performed in the following write verify operation so as to confirm whether or not the memory cell where data "n−1" should be written reaches the memory state of data "n−1."

(4) The non-volatile semiconductor memory device further comprises data renewal means for renewing the contents of the data latch circuits such that only a memory cell in which data is insufficiently written is rewritten in accordance with the contents of the data latch circuits and the write state of the memory cell.

(5) In an electrical data write operation in which the write operation in accordance with the contents of the data latch circuits and the write verify operation for confirming the write state of the memory cells and the renewal of the of the data latch circuits are continued till the plurality of memory cells reach a predetermined write state; when the "i" data batch verify circuit batch-detects the memory cell where data "i" should be written reaches the memory state of data "i", a write verify operation of data "i" ("i" data verify read) is not performed in the following write verify operation.

(6) The data batch verify circuit includes a plurality of data batch detective MOS transistor units connected to the data latch circuits, and the plurality of data batch detective MOS transistor units are connected in parallel.

(7) The data latch circuits include flip-flop circuits, the data batch detective MOS transistor units include a plurality of data batch detective MOS transistors whose gates are connected to the flip-flop circuits, and the plurality of data batch detective MOS transistors are connected in series.

(8) Each of the memory cells comprises a charge storage layer and a control gate on a semiconductor layer, and an NAND cell structure is formed by connecting the plurality of the memory cells in series.

(9) Each of the memory cells comprises a charge storage layer and a control gate formed on a semiconductor layer, and a NOR cell structure is formed.

(10) The data latch circuits include first, second, . . . , m (m is a natural number satisfying $2(m-1)<n \geqq 2^m$) latch circuits.

In the first aspect of the present invention, the data batch verify circuit can detect whether or not a write state of each memory cell reaches a predetermined multi-value level after write operation multi-value data. Then, if there is a memory cell, which does not reach the predetermined multi-value level after write operation multi-value data, a bitline voltage needed at a write time is output in accordance with a pre-determined write state such that a rewrite operation is provided to on the memory cell. In a case of a ternary memory cell, if all memory cells in which "1" state are written, the verify read for checking whether or not "1" state is sufficiently written can be omitted in the following verify reading, so that the entire write time can be reduced. If the write operation and the verify read operation are repeated so as to confirm that all memory cells reach a predetermined write state, the data write operation is completed.

In a case of a four-value memory cell, if all memory cells in which "1" state are written, the verify read for checking whether or not "1" state is sufficiently written can be omitted in the following verify reading. Moreover, if all memory cells in which "2" state are written, the verify read for checking whether or not "2" state is sufficiently written can be omitted in the following verify reading. Thus, the unnecessary verify read is omitted, so that the entire write time can be reduced. If the write operation and the verify read operation are repeated so as to confirm that all memory cells reach a predetermined write state, the data write operation is completed.

As mentioned above, the verify read in data is sufficiently written is omitted in the following verify reading when writing the multi-value memory cells. As a result, the unnecessary verify read can be omitted, so that the entire write time can be reduced and the write speed can be improved.

According to the first aspect of the present invention, the write operation is repeated little by little as checking the degree of the write state. Further, regarding data whose write operation is completed ("1" state in the case of the ternary memory cell), the unnecessary verify read ("1" state is sufficiently written in the case of the ternary memory cell) can be omitted thereafter, so that data write operation can be performed at high speed.

According to the second aspect of the present invention, there is provided a non-volatile semiconductor memory device comprising: a memory cell array in which a plurality of memory cell units are arranged in a matrix form, the memory cell units each having a memory cell section and one or a plurality of select MOS transistors, the memory cell having one or a plurality of non-volatile memory cells, and the select MOS transistors allowing the memory cell section to be electrically conducted to a common signal line, wherein one end of each of the memory cell units is connected to a first common signal line in a state that the plurality of 2n ($n \geqq 2$) memory cell units, sharing a word line, have a contact in common; and the other end of each of the memory cell units is connected to a second common signal line in a state that n memory cell units, sharing a word line and having no contact in common at one end of the memory cell unit, have a contact in common, and n memory cell units, sharing a contact at one end of the memory cell unit, have a contact in common.

Also, there is provided a non-volatile semiconductor memory device comprising: a memory cell array in which a plurality of memory cell units are arranged in a matrix form, the memory cell units each having a memory cell section and one or a plurality of select MOS transistors, the memory cell having one or a plurality of non-volatile memory cells, and the select MOS transistors allowing the memory cell section to be electrically conducted to a common signal line, wherein n ($n \geqq 2$) memory cell units are arranged in parallel so as to form a plurality of parallel connected units, one end of each of arbitrary parallel connected units is connected to a first common signal line in a state that two parallel connected units, sharing a word line, have a contact in common; and the other end is connected to a second signal line in a state that two parallel connected units, sharing a word line and having no contact in common at one end, have a contact in common.

Then, preferable manners of the second aspect of the present invention will be described as follows.

(1) The first common signal line, to which one end of each memory cell unit is connected, is set to a read potential, and the second common signal line, to which the other end of each memory cell unit is connected, is set to a read non-select potential in reading the memory cell section of each of the memory cell units.

(2) The read non-select potential is a ground potential.

(3) The first common signal line, to which one end of each memory cell unit is connected, is set to a "i" write potential in accordance with write data "i" (i=0, 1, . . . , n: $n \geqq 1$) in writing the writing section of each of the memory cell units.

(4) Each of the memory units comprises a memory cell section having one or a plurality of non-volatile memory cells, two select MOS transistors connected in series so as to allow the memory cell section to be electrically conducted to the first common signal line (first select MOS transistor connected to the first common signal line and second select MOS transistor connected to the memory cell section), and two select transistors connected in series so as to allow the memory cell section to be electrically conducted to the second common signal line (third select MOS transistor connected to the memory cell section and fourth select transistor connected to the second common signal line); and at least one of threshold voltages of the first to fourth select MOS transistors is different from the threshold voltages of the other select MOS transistors.

(5) Each of the memory units comprises a memory cell section having one or a plurality of non-volatile memory cells, two select MOS transistors connected in series so as to allow the memory cell section to be electrically conducted to the first common signal line (first select MOS transistor connected to the first common signal line and second select MOS transistor connected to the memory cell section), and two select transistors connected in series so as to allow the memory cell section to be electrically conducted to the second common signal line (third select MOS transistor connected to the memory cell section and fourth select transistor connected to the second common signal line); the first select MOS transistor has a first threshold voltage Vth1, the second select MOS transistor has a second threshold voltage Vth2, the third select MOS transistor has a third threshold voltage Vth3, the fourth select MOS transistor has a fourth threshold voltage Vth4, thereby forming a first memory cell unit; the first select MOS transistor has a fifth threshold voltage Vth5, the second select MOS transistor has a sixth threshold voltage Vth6, the third select MOS transistor has a seventh threshold voltage Vth7, the fourth select MOS transistor has an eighth threshold voltage Vth8, thereby forming a second memory cell unit; the first select MOS transistor has a ninth threshold voltage Vth9, the second select MOS transistor has a tenth threshold voltage Vth10, the third select MOS transistor has an eleventh threshold voltage Vth11, the fourth select MOS transistor has a twelfth threshold voltage Vth12, thereby forming a third memory cell unit; the first select MOS transistor has a thirteenth threshold voltage Vth13, the second select MOS transistor has a fourteenth threshold voltage Vth14, the third select MOS transistor has a fifteenth threshold voltage Vth15, the fourth select MOS transistor has a sixteenth threshold voltage Vth16, thereby forming a fourth memory cell unit; the first to fourth memory cell units form a sub-array in a state that a gate electrode of the first select MOS transistor, a gate electrode of the second select MOS transistor, a gate electrode of the third select MOS transistor, and a gate electrode of the fourth select MOS transistor are shared as first to fourth select gates, respectively; and at least one of first, fifth, ninth, thirteenth threshold voltages Vth1, Vth5, Vth9, Vth13 is different from the other threshold voltages, at least one of second, sixth, tenth, fourteenth threshold voltages Vth2, Vth6, Vth10, Vth14 is different from the other threshold voltages, at least one of third, seventh, eleventh, fifteenth threshold voltages Vth3, Vth7, Vth11, Vth15 is different from the other threshold voltages, and at least one of fourth, eighth, twelfth, sixteenth threshold voltages Vth4, Vth8, Vth12, Vth16 is different from the other threshold voltages.

(6) The first, sixth, eleventh, sixteenth threshold voltages Vth1, Vth6, Vth11, and Vth16 are equal to each other, and second to fifth, seventh to tenth, and twelfth to fifteenth threshold voltages Vth2 to Vth5, Vth7 to Vth10, Vth12 to Vth15 are equal to each other.

(7) The first to fourth memory cell units are alternately arranged so as t o form the sub-array.

(8) The non-volatile semiconductor memory device further comprises: read select gate voltage applying means for applying a read select gate voltage to the gate electrodes of the first to fourth select MOS transistors of the selected sub-array such that at the time of reading the memory cell section of the first memory cell unit, the first to fourth select MOS transistors of the first memory cell unit are made conductive, at least one of the first to fourth select MOS transistors of the second memory cell unit is made non-conductive, at least one of the first to fourth select MOS transistors of the third memory cell unit is made non-conductive, and at least one of the first to fourth select MOS transistors of the fourth memory cell unit is made non-conductive; at the time of reading the memory cell section of the second memory cell unit, the first to fourth select MOS transistors of the second memory cell unit are made conductive, at least one of the first to fourth select MOS transistors of the first memory cell unit is made non-conductive, at least one of the first to fourth select MOS transistors of the third memory cell unit is made non-conductive, and at least one of the first to fourth select MOS transistors of the fourth memory cell unit is made non-conductive; at the time of reading the memory cell section of the third memory cell unit, the first to fourth select MOS transistors of the third memory cell unit are made conductive, at least one of the first to fourth select MOS transistors of the first memory cell unit is made non-conductive, at least one of the first to fourth select MOS transistors of the second memory cell unit is made non-conductive, and at least one of the first to fourth select MOS transistors of the fourth memory cell unit is made non-conductive; and at the time of reading the memory cell section of the fourth memory cell unit, the first to fourth select MOS transistors of the fourth memory cell unit are made conductive, at least one of the first to fourth select MOS transistors of the first memory cell unit is made non-conductive, at least one of the first to fourth select MOS transistors of the second memory cell unit is made non-conductive, and at least one of the first to fourth select MOS transistors of the third memory cell unit is made non-conductive.

(9) The non-volatile semiconductor memory device further comprises: write select gate voltage applying means for applying a write select gate voltage to the gate electrodes of the first to fourth select MOS transistors of the selected sub-array such that at the time of writing the memory cell section of the first memory cell unit, the first and second select MOS transistors of the first memory cell unit are made conductive, at least one of the third and fourth select MOS transistors is made non-conductive, at least one of the first and second select MOS transistors of the second memory cell unit is made non-conductive, at least one of the first and second select MOS transistors of the third memory cell unit is made non-conductive, and at least one of the first and second select MOS transistors of the fourth memory cell unit is made non-conductive; at the time of writing the memory cell section of the second memory cell unit, the first and second select MOS transistors of the second memory cell unit are made conductive, at least one of the third and fourth select MOS transistors is made non-conductive, at least one of the first and second select MOS transistors of the first memory cell unit is made non-conductive, and at least one of the first and second select MOS transistors of the third memory cell unit is made non-conductive, and at least one of the first and second select MOS transistors of the fourth memory cell unit is made non-conductive; at the time of writing the memory cell section of the third memory cell unit, the third and fourth select MOS transistors of the third memory cell unit are made conductive, at least one of the first and second select MOS transistors is made non-conductive, at least one of the third and fourth select MOS transistors of the first memory cell unit is made nonconductive, at least one of the third and fourth select MOS transistors of the second memory cell unit is made nonconductive, and at least one of the third and fourth select MOS transistors of the fourth memory cell unit is made non-conductive; and at the time of writing the memory cell section of the fourth memory cell unit, the third and fourth select MOS transistors of the fourth memory cell unit are made conductive, at least one of the first and second select MOS transistors is made non-conductive, at least one of the third and fourth select MOS transistors of the first memory cell unit is made non-conductive, at least one of the third and fourth select MOS transistors of the second memory cell unit is made non-conductive, and at least one of the third and fourth select MOS transistors of the third memory cell unit is made non-conductive.

(10) Each of the memory cell sections comprises electrically rewritable non-volatile memory cell.

(11) Each of the non-volatile memory cells comprises a charge storage layer and a control gate formed on a semiconductor layer, and the memory cells are connected in series in a state that a plurality of adjacent memory cells share a source and a drain, thereby forming the memory cell section.

(12) Each of the non-volatile memory cells comprises a charge storage layer and a control gate formed on a semiconductor layer, and the memory cells are connected in parallel in a state that one or a plurality of memory cells share a source and a drain, thereby forming the memory cell section.

(13) Concentration of impurity material of a channel is changed so as to vary the threshold voltages of the first to sixteenth select MOS transistors.

In the second aspect of the present invention, both one end the other end of the memory cell unit have a contact in common to the other memory units, respectively, and these ends are connected to the first and second common signal lines, respectively. The bitline, which comprises low resistive polysilicon, Al, etc., is used in place of the source line, which comprises a conventional high resistive n-type diffusion layer. As a result, the floating of the source line can be reduced so as to obtain a high speed random access.

Also, as a select MOS transistor for connecting the one end and the other end to the common signal lines, respectively, an E-type MOS transistor, an I-type MOS transistor, and a D-type MOS transistor are suitably selected, so that the memory cell array which can obtain a high speed random access, can be obtained without increasing a chip area. Moreover, since the plurality of memory cells can share the bitlines, the pitch between the bitlines in the column direction can be relaxed, so that the memory cell structure having high density can be realized.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A and 1B are a plan view and an equivalent circuit diagram each showing the cell structure of the conventional NAND type EEPROM;

FIG. 6 is a view showing the outline of a write of a first embodiment of the present invention;

FIG. 7 is a view showing the outline of a write of a second embodiment of the present invention;

FIG. 8 is a view showing the outline of a write of a third embodiment of the present invention;

FIG. 10 is a circuit diagram showing the specific structure of the memory cell array of the fourth embodiment of the present invention;

FIG. 11 is a circuit diagram showing the specific structure of a bitline control circuit of the fourth embodiment of the present invention;

FIG. 14 is a timing chart showing a verify read operation of the fourth embodiment of the present invention;

FIG. 18 is a timing chart showing a write of the fifth embodiment of the present invention;

FIG. 20 is a circuit diagram showing the structure of the bitline control circuit of the fourth embodiment of the present invention;

FIG. 21 is a circuit diagram showing the structure of the bitline control circuit of the fifth embodiment of the present invention;

FIG. 22 is a circuit diagram showing the specific structure of the bitline control circuit of the sixth embodiment of the present invention;

FIG. 24 is a block diagram showing the structure of a multi-value storing type EEPROM of an eighth embodiment of the present invention;

FIG. 25 is a circuit diagram showing the structure of a memory cell array of FIG. 24 and a data circuit;

FIG. 26 is a view showing a distribution of a threshold value of a memory cell in a case of four-value storing;

FIG. 30 is a timing chart explaining a reading method of the eighth embodiment of the present invention;

FIG. 32 is a timing chart explaining the write verify operation of the eighth embodiment of the present invention;

FIG. 35 is a block diagram showing the structure of a sub-array of an eleventh embodiment of the present invention;

FIG. 37 is a circuit diagram showing the structure of a memory cell array of the eleventh embodiment of the present invention;

FIG. 38 is a circuit diagram showing the structure of a memory cell array of the eleventh embodiment of the present invention;

FIGS. 39A to 39D are circuit diagrams each showing the structure of a memory cell portion of the eleventh embodiment of the present invention;

FIG. 45 is a circuit diagram showing the bitline control circuit of the twelfth embodiment of the present invention;

FIG. 51 is a circuit diagram showing the other example of the bitline control circuit of the twelfth embodiment of the present invention.

DETAILED DESCRIPTION OF THE PREFERRED EMBODIMENTS

Embodiments of the present invention will now be described with reference to the accompanying drawings.

First Embodiment

Figures 4A, 4B:
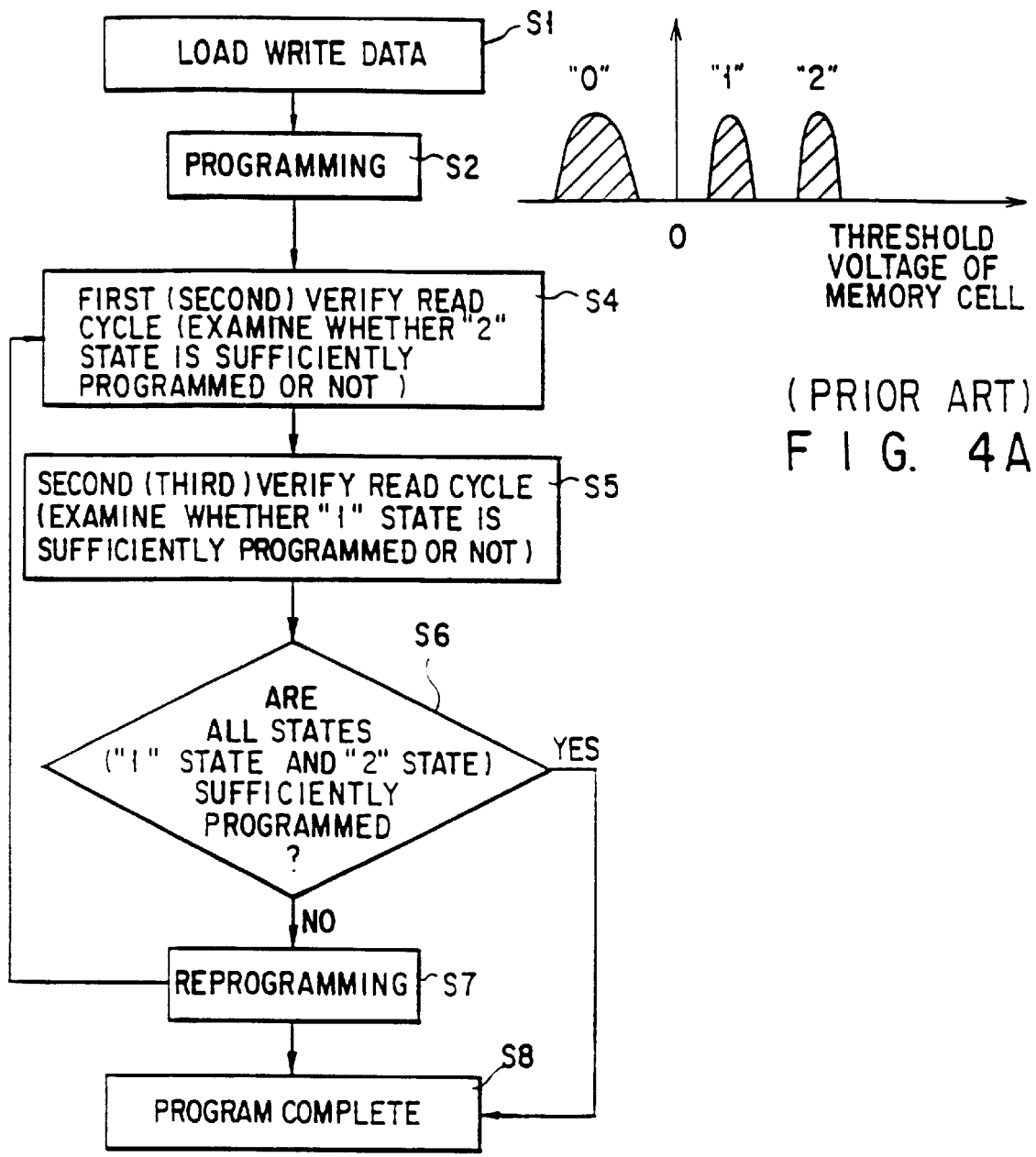
FIGS. 4A and 4B are views each showing the outline of the conventional write operation.
Figure 5A:
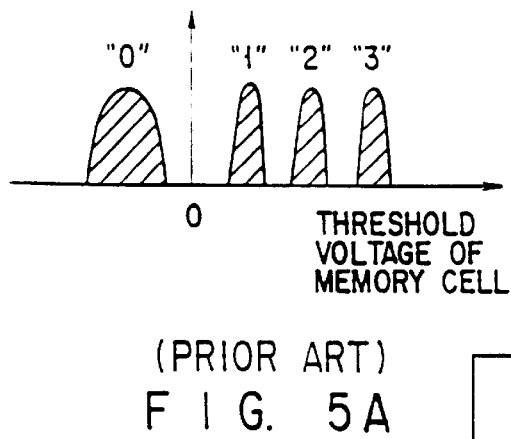
FIGS. 5A and 5B are views each showing the outline of the conventional write operation.
Figure 5B:
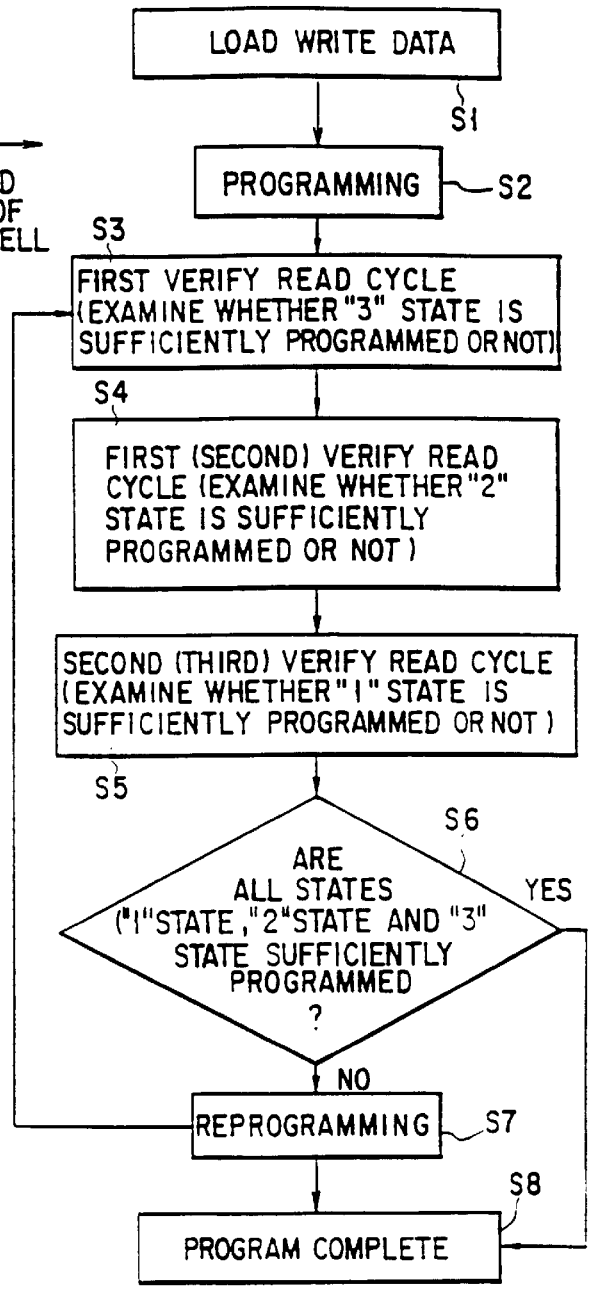

FIG. 6 is a view explaining a first embodiment of the present invention, and showing a write operation in a case of a ternary memory cell. In FIG. 6, the same reference numerals as the case of FIG. 4B are added to the portions common to the case of FIG. 4A, and the explanation is omitted.

After a first write (step S2), a first verify read cycle for checking whether or not "2" state is sufficiently written (step $S4_1$) and a second verify read cycle for checking whether or not "1" state is sufficiently written (step S5) are performed. If there is a memory cell of insufficient write in the memory cells in which "1" state is written, a rewrite is performed (steps $S6_1$, $S7_1$), and the verify first and second cycles (steps $S4_1$, $S_5$) are performed again. In the rewrite, the write operation is performed even in the memory cell in which "2" state is insufficiently written.

The second verify read cycle is unnecessary after the memory cell in which "1" state is written is sufficiently written. Due to this, as shown in FIG. 6, only the first verify read cycle is performed until the memory cell in which "2" state is written is sufficiently written (step $S4_2$, $S6_2$, $S7_2$).

According to this embodiment, the verify read for checking whether or not "1" state is sufficiently written is not performed after the memory cell in which "1" state is written is sufficiently written. As a result, the entire write time can be largely reduced.

Second Embodiment

FIG. 7 is a view explaining a second embodiment of the present invention in the case of the ternary memory cell. The second embodiment differs from the first embodiment in the point that the writing of the memory cell in which "2" state is written is completed faster than that of the memory cell in which "1" state is written.

If the writing of the memory cell in which "2" is written is completed faster than that of the memory cell in which "1" is written (Yes in step $S6_1$), the verify read for checking whether or not "2" is sufficiently written is not performed after the completion of the writing of the memory cell in which "2" is written. Only the second verify read cycle for checking whether or not "1" is sufficiently written is performed until the memory cell in which "1" is written is sufficiently written (steps $S7_3$, $S5_2$, $S6_4$). If the writing of the memory cell in which "1" is written is completed faster than that of the memory cell in which "2" is written (Yes in step $S6_2$), similar to the first embodiment of FIG. 1, only the first verify read cycle is performed until the memory cell in which "2" is written is sufficiently written (steps $57_2$, $S4_2$, $S6_2$).

According to this embodiment, after the completion of the writing of any one of the memory cell in which "1" is written and the memory cell in which "2" is written, the verify read of the memory cell in which data is sufficiently written is not performed. As a result, the entire write time is largely reduced.

Third Embodiment

FIG. 8 is a view explaining a third embodiment of the present invention in the case of the four-value memory cell. Similar to the first embodiment, the unnecessary verify read is omitted, so that the entire write time can be reduced. Specifically, after a first write (step S2), a first verify read cycle for checking whether or not "3" is sufficiently written (step $S3_1$), a second verify read cycle for checking whether or not "2" is sufficiently written (step S4$_1$), and a third verify read cycle for checking whether or not "1" is sufficiently written (step S5) are performed. If there is a memory cell of insufficient write in the memory cells for "1", a rewrite is performed (steps S6$_1$, S71), and the verify first, second, and third cycles (steps S3$_1$, S4$_1$, S5) are performed again. In the rewrite, the write operation is performed even in the memory cells in which "2" is insufficiently written and the memory cells in which "3" is insufficiently written.

The third verify read cycle is unnecessary after the memory cell in which "1" is written is sufficiently written. Due to this, the rewrite (step S7$_2$), the first verify read cycle (step S3$_2$), and the second verify read cycle (step S4$_2$) are performed until the memory cell in which "2" is written is sufficiently written (step S6$_2$).

The second verify read cycle is unnecessary after the memory cell in which "2" is written is sufficiently written. Due to this, only the rewrite (step S7$_3$) and the first verify read cycle (step S3$_2$) are performed until the memory cell in which "3" is written is sufficiently written (step S6$_3$).

According to the present invention, in simultaneously writing multi-value data (e.g., "1", "2", . . . , "6", "7"), the verify read is not performed after data is already sufficiently written at the time of the previous verify read. As a result, the entire write time can be reduced. For example, in the case of 8-value memory cell, at the first write, seven verify reads of data, "1", "2", . . . , "7", are performed. At the second write, six verify reads of data, "2", "3", . . . , "7", are performed. At the next write, five verify reads of data, "3", "4", . . . , "7", are performed.

As described in the second embodiment, for example, if the memory cell in which "3" is written is sufficiently written, six verify reads of data, "1", "2", "4", "5", "6", "7", may be performed at the second write. Next, if the memory cell in which "2" is written is sufficiently written, five verify reads of data, "1", "4", "5", "6", "7", may be performed.

In other words, every time when the writing of desirable data is sufficiently written, the number of the verify reads can be reduced, so that the entire write time can be reduced.

Fourth Embodiment

The following will explain a fourth embodiment of the present invention showing a case in which the present invention is applied to the ternary memory cell of the NAND type EEPROM.

Figure 9:
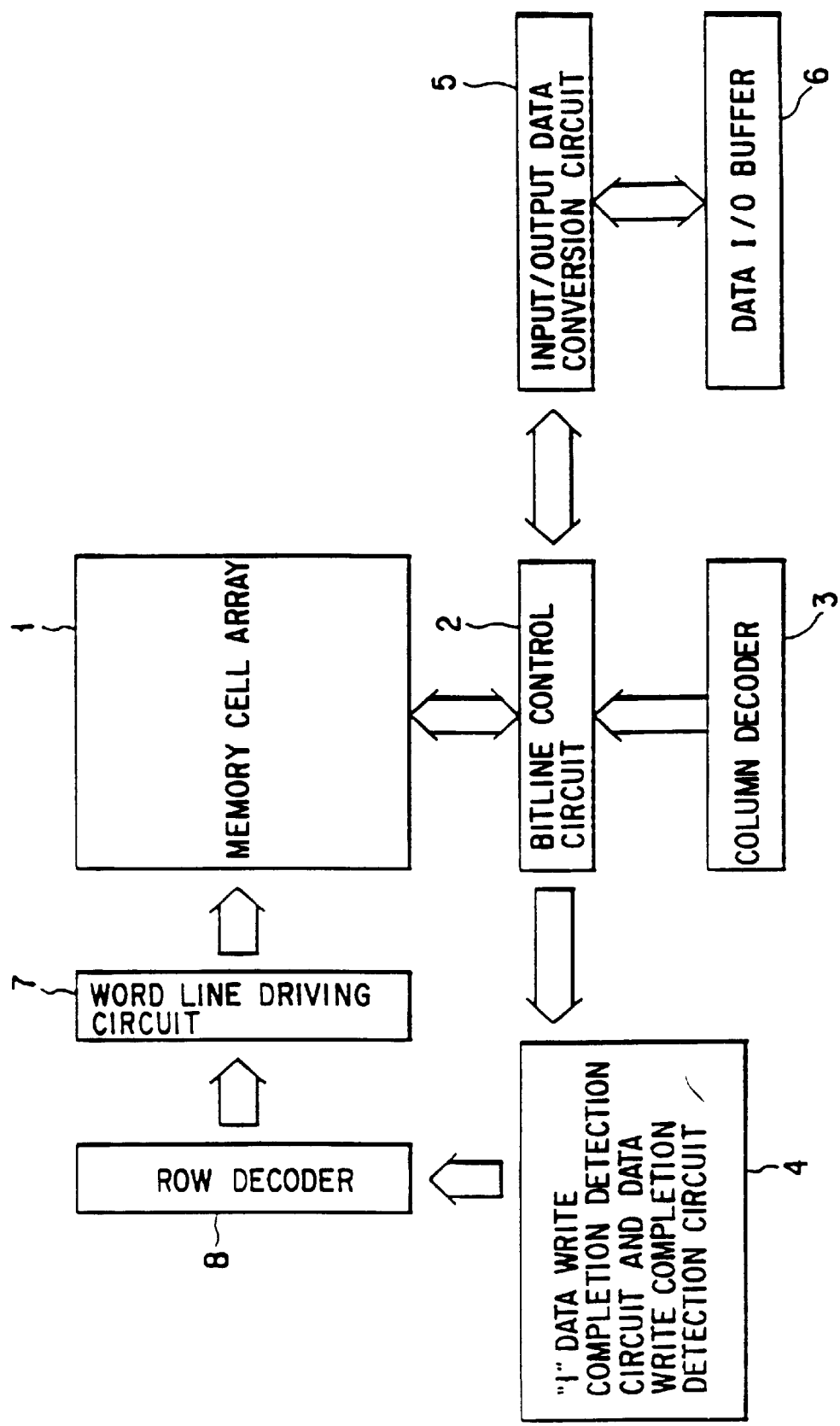
FIG. 9 is a view showing the outline structure of an EEPROM of fourth and fifth embodiments of the present invention.

FIG. 9 is a block diagram showing the outline structure of the NAND cell type EEPROM of the fourth embodiment of the present invention.

A memory cell array 1 comprises a bitline control circuit 2 for controlling the bitline at read/write time, and a word line driving circuit 7 for controlling a word line potential. The bitline control circuit 2 and the word line driving circuit 7 are selected by a column decoder 3 and a row decoder 8, respectively. The bitline control circuit 2 receives and transmits from/to an input/output (I/O) data conversion circuit 5 through a data input/output line (I/O line). The I/O data conversion circuit 5 converts multi-value data of the read memory cell to binary data to be output to an external section. Or, the I/O data conversion circuit 5 convert binary data input from the external section to multi-value data of the memory cell. The I/O data conversion circuit 5 is connected to a data input/output buffer 5 for controlling data input/output to/from the external section. A "1" data write operation completion detection circuit and data write operation completion detection circuit 4 detects whether or not write of data "1" is completed and whether or not write of all data is completed.

FIGS. 10 and 11 show the specific structure of the memory cell array 1 and the bitline control circuit 2. Memory cells M1 to M8 and select transistors S1 and S2 constitute an NAND type cell. One end of the NAND type cell is connected to the bitline BL, and the other end is connected to a common source line Vs. Selective gates SG1 and SG2, control gates CG1 to CG8 are shared by a plurality of NAND type cells, and the memory cells using one control gate in common constitute one page.

The memory cell stores data in accordance with its threshold value Vt. Specifically, if Vt is below 0V, the memory cell stores data "0." If Vt is 0V to 1.5V or less, the memory cell stores data "1." If Vt is 1.5V or more and less than power supply voltage, the memory cell stores data "2." Three data states can be provided by one memory cell, and nine combinations of data can be formed by two memory cells. Among these combinations, by use of eight combinations, two memory cells can store data for three bits. In this embodiment, the combination of two adjacent memory cells using one control gate in common stores data for three bits. The memory cell array 1 is formed on a dedicated p-well.

Clock-synchronous type inverters C11, C12 and C13, C14 constitute flip-flops, respectively, to latch write/read data. These flip-flops operate as sense amplifiers. The flip-flop comprising inverters C11, C12 latches data, "write "0" data or write "1" or "2" data?", as write data. Also, the flip-flop latches data, "the memory cell holds "0" data or the memory cell holds "1" or "2" data?" as read data. The flip-flop comprising inverters C13, C14 latches data, "write "1" data or write "2" data?", as write data. Also, the flip-flop latches data, "the memory cell holds "2" data or the memory cell holds "0" or "1" data?" as read data.

In the n-channel MOS transistors, Qn1 transfers a voltage VPR to the bitline when a precharge signal PRE is set to an "H" level. Qn2 connects the bitline to the main bitline control circuit when a bitline connection signal BLC is set to an "H" level. Qn3 to Qn6 and Qn9 to Qn12 selectively transfer voltages VBLH, VBLM, BVLL to the bitline in accordance with data latched by the above-described flip-flops. Qn7 and Qn8 connect the flip-flop to the bitline when signals SAC2, SAC1 are set to an "H" level, respectively. Qn13 detects whether or not data for one page latched by the flip-flops is all the same. Qn14, Qn15 and Qn16, Qn17 selectively connect the corresponding flip-flop to data I/O line IOA, IOB, respectively, when column select signals CSL1, CSL2 are set to an "H" state. Qn13A and Qn13B are batch detective MOS transistors to detect whether or not the memory cells in which "1" of the same page is written are all sufficiently written.

Figure 12:
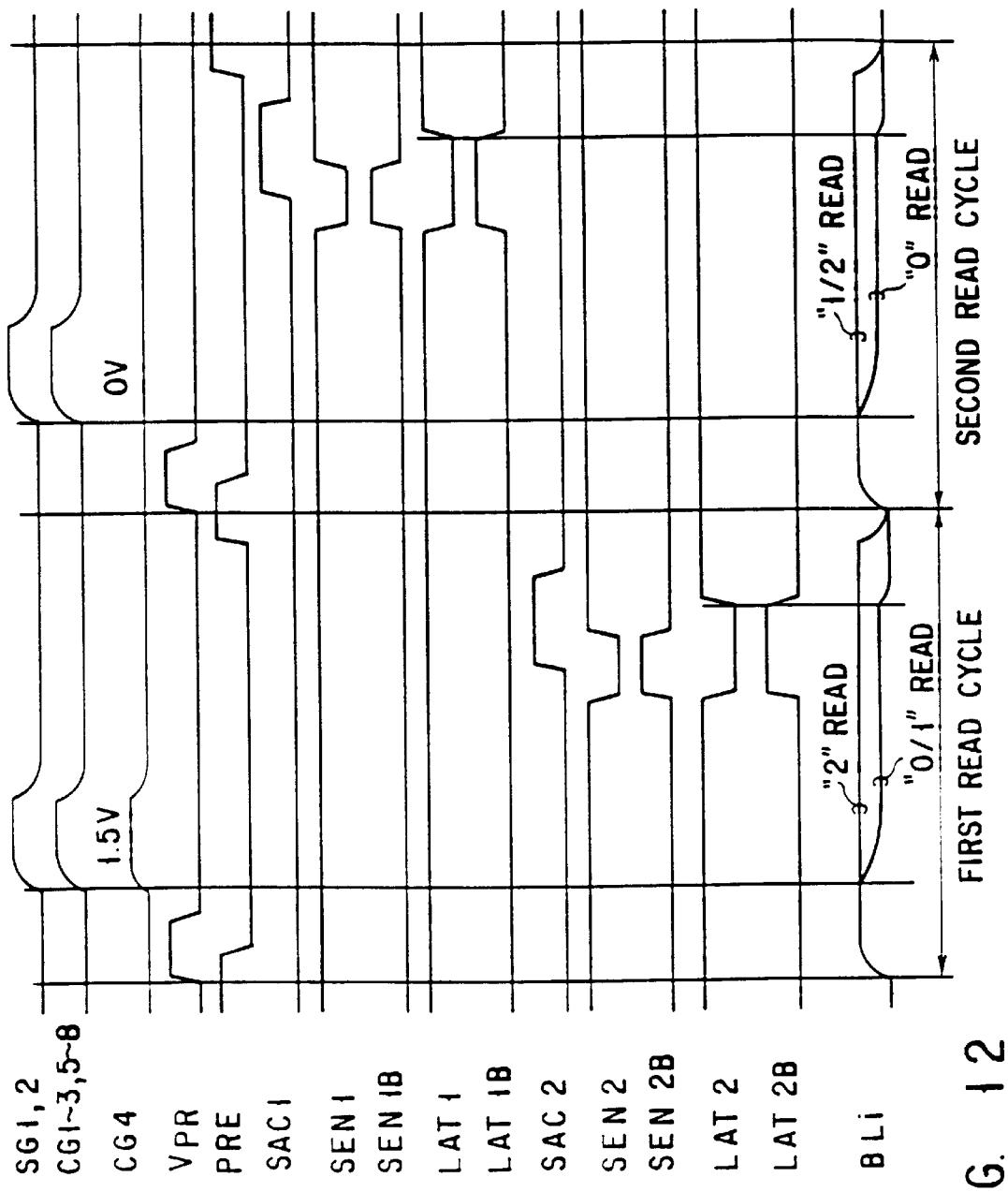
FIG. 12 is a timing chart showing a read operation of the fourth embodiment of the present invention.
Figure 13:
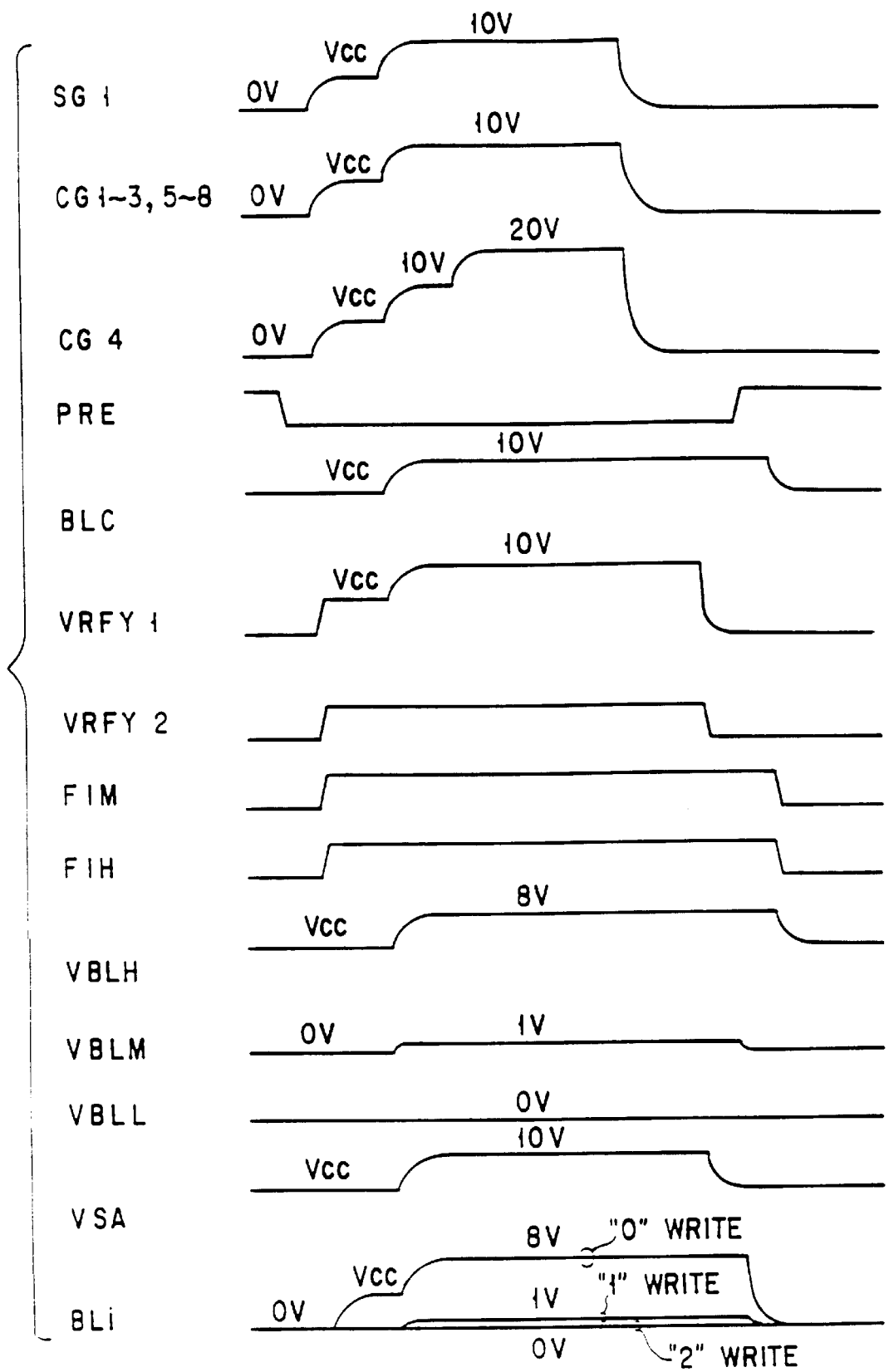
FIG. 13 is a timing chart showing a write of the fourth embodiment of the present invention.

The following will explain an operation of the above-structured EEPROM with reference to FIGS. 12 to 14. FIG. 12 shows the timing of a read operation, FIG. 13 shows the timing of a write operation, and FIG. 14 shows the timing of a verify read operation. In any case, a control gate CG4 is selected.

<Read Operation>

The read operation is performed by two basic cycles as shown in FIG. 12. At the first read cycle, the voltage VPR is changed to the power supply voltage Vcc, and the bitline is precharged. The precharge signal PRE is set to an "L" level, and the bitline is floated. Sequentially, select gates SG1, SG2, control gates CG1 to CG3, CG5 to CG8 are set to Vcc. At the same time, the control gate CG4 is set to 1.5V. Only when Vt of the selected memory cell is 1.5V or more, that is, data "2" is written, the "H" level of the bitline is maintained.

Thereafter, the levels of sense activation signals SEN2, SEN2B are set to "L", "H", respectively. The levels of latch activation signals LAT2, LAT2B are "L" and "H", respectively. As a result, the flip-flop comprising the clock-synchronous type inverters C13 and C14 is reset. The level of the signal SAC2 is set to "H", and the flip-flop comprising the clock-synchronous type inverters C13 and C14 and the bitline are connected. The levels of sense activation signals SEN2, SEN2B are set to "H", "L", respectively, so that the bitline potential is sensed. Thereafter, the levels of latch activation signals LAT2, LAT2B are "H" and "L", respectively. Then, data ""2" data, or "1" or "0" write" is latched by the flip-flop comprising the clock-synchronous type inverters C13 and C14.

The second read cycle is different from the first read cycle in the following points.

Specifically, the voltage of the select control gate C4 is not 1.5V but 0V. Signals SEN1, SEN1B, LAT1, LAT1B, and SAC1 are output in place of signals SEN2, SEN2B, LAT2, LAT2B, SAC2.

In the second read cycle, data ""2" data or, "1" or "2" write" is latched by the flip-flop comprising the clock-synchronous type inverters C11 and C12.

Data written in the memory cell is read by the above-explained two read cycles. Nodes N1 and N2 of the latches LAT1 and LAT2 are shown in the following Table 1 wherein "H" is Vcc and "L" is Vss.

TABLE 1

|    | "0" | "1" | "2" |
|----|-----|-----|-----|
| N1 | H   | L   | L   |
| N2 | L   | L   | H   |

<Write Operation>

FIG. 13 shows the timing of the write operation. Write data is transferred to the latches LAT1 and TAT2 from IOA and IOB. The potentials of nodes N1 and N2 are shown in the following Table 2.

TABLE 2

|    | "0" | "1" | "2" |
|----|-----|-----|-----|
| N1 | L   | H   | H   |
| N2 | L   | H   | L   |

Prior to data write operation, data of the memory cell is erased, and the threshold value Vt is set to below 0V. Data erasure is performed under conditions that the p-well, the common source line VS, the select gates SG1, SG2 are set to 20V, and the control gates CG1 to CG8 are set to 0V.

In the write operation, the level of the precharge signal PRE is set to "L", and the bitline is floated. The select gate SG1 is set to Vcc, and the control gates CG1 to CG8 are set to Vcc. The select gate SG2 is set to 0V during the operation. At the same time, signals VRFY1, VRFY2, FIM, FIH are set to Vcc. In a case where "0" is written, data is latched by the flip-flop comprising the clock-synchronous type inverters C11 and C12 such that the output level of the clock-synchronous type inverter C11 is set to "H." As a result, the bitline is charged by Vcc. In a case where "1" or "2" is written, the bitline is set to 0V.

Sequentially, the select gate SG1, the control gates CG1 to CG8, the signal BLC, the signal VREY1, and the voltage VSA are set to 10V, the voltage VBLH is set to 8V, and the voltage VBLM is set to 1V. In a case where "1" is written, data is latched by the flip-flop comprising the clock-synchronous type inverters C13 and C14 such that the output level of the clock-synchronous type inverter C13 is set to "H." As a result, 1V is applied to the bitline BL. On a case where "2" is written, the bitline is set to 0V. In a case where "0" is written, the bitline is set to 8V. Thereafter, the selected control gate CG4 is set to 20V.

In a case where "1" or "2" is written, an electron is injected to a charge storage layer of the memory cell by a potential difference between the bitline BL and the control gate CG4. As a result, the threshold value of the memory cell is increased. In a case where "1" is written, an amount of charges to be injected to the charge storage layer of the memory cell must be lessened as compared with the case where "2" is written. Due to this, the bitline BL is set to 1V, and the potential difference between the bitline BL and the control gate CG4 is relaxed to 19V. In this case, even if the potential difference is not relaxed, the operation can be performed. In the case where "0" is written, the threshold value of the memory cell is substantially unchanged by the bitline voltage of 8V.

When the write operation is completed, the select gate SG1 and the control gates CG1 to CG8 are set to 0V, the voltage of the bitline, which was 8V when "0" was written, is reset to 0V later. If this order is reversed, the state of the operation is temporarily set to a state that "2" is written, and erroneous data is written when "0" is written.

<Write Verify Read>

To confirm the write state of the memory cell after the write operation and additionally write data only to the memory cell in which data is insufficiently written, the verify read is performed. In this embodiment, the ternary memory cell is used, and timing of the verify read operation is shown by FIG. 14. The specific explanation of the operation will be described later with reference to FIG. 15.

During the verify read, voltage VBLH is set to Vcc, and VBLL is set to 0V, and FIM is set to 0V. Prior to the verify read, RENDB1 and RENDB2 are precharged to a fixed potential, e.g., Vcc. Thereafter, RENDB1 and RENDB2 are kept to be floated.

The first verify read after the first write pulse is applied is performed by two basic cycles. The basic cycles are similar to the first read cycle. However, the difference between the basic cycles and the first read cycle lies in the point that the voltage of the selected control gate CG4 and the signals VRFY1, VRFY2, and FIH are output (only VERY1 is output at the first verify read cycle).

The signals VRFY1, VRFY2, and FIH are output before the signals SEN1, SEN1B, LAT1, LAT1B are set to "L", "H", "L", "H" respectively, after the gates SG1, SG2, and the control gates CG1 to CG8 are reset to 0V. In other words, the signals VRFY1, VRFY2 and FIH are output after the potential of the bitline is determined by the threshold value of the memory cell and before the flip-flop comprising the clock-synchronous type inverters C11 and C12 is reset. The voltage of the selected control gate CG4 is highly set to 2V (first cycle) and 0.5V (second cycle) to reserve a threshold margin of 0.5V against 1.5V (first cycle) at the read time and 0V (second cycle).

The following will explain the voltage of the bitline BL, which is determined by data 1, data 2, and the threshold value of the selected memory cell (data 1 is latched by the flip-flop comprising the clock-synchronous type inverters C11 and C12 and data 2 is latched by the flip-flop comprising the clock-synchronous type inverters C13 and C14).

Data 1 is a signal for controlling ""0" data write, or "1" or "2" data write." In the case where "0" is written, Qn3 is in an "ON" state, and in the case where "1" or "2" is written, Qn6 is in an "ON" state. Data 2 is a signal for controlling ""1" data or "2" data write." In the case where "1" is written, Qn10 is in an "ON" state, and in the case where "2" is written, Qn11 is in an "ON" state.

<Verify First Read Cycle>

In the first verify read cycle when "0" data is written (initial write data is "0"), since data of the memory cell is "0", the bitline potential is set to "L" by the memory cell if the control gate CG4 is 2V. Thereafter, if the signal VRFY1 is set to "H", the bitline BL is set to "H."

In the first verify read cycle when "1" data is written (initial write data is "1"), since data of the memory cell is "1", the threshold value of the memory cell is 1.5V or less. If the control gate CG4 is 2V, the bitline potential is set to "L." Thereafter, if the signal VRFY1 is set to "H", "1" data is already sufficiently written, and data 1 shows only "0" data write, the bitline BL is set to "H" ((1) of FIG. 14), or "L" ((2) of FIG. 14).

In the first verify read cycle when "2" data is written (initial write data is "2"), if data of the select memory cell is not "2" ("2" is insufficiently written), the bitline potential is set to "L" ((5) of FIG. 14) when the control gate CG4 is 2V. In a case where "2" is sufficiently written in the select memory cell, the bitline potential is "H" as it is even if the control gate CG4 is 2V ((3), (4) of FIG. 14). (3) of FIG. 14 shows the case in which "2" is already sufficiently written and data 1 shows "0" data write. In this case, the signal VRFY1 is set to "H", so that the bitline BL is recharged by the voltage VBH.

<Verify Second Read Cycle>

In the second verify read cycle when "0" data is written (initial write data is "0"), since data of the memory cell is "0", the bitline potential is set to "L" when the control gate CG4 is 0.5V. Thereafter, the bitline BL is set to "H" when the signal VRFY1 is "H."

In the second verify read cycle when "1" data is written (initial write data is "1"), if data of the select memory cell is not "1" ("1" is insufficiently written), the bitline potential is set to "L" ((8) of FIG. 14) when the control gate CG4 is 0.5V. In a case where "1" is sufficiently written in the select memory cell, the bitline potential is "H" as it is even if the control gate CG4 is 0.5V ((6), (7) of FIG. 14). (6) of FIG. 14 shows the case in which "1" is already sufficiently written and data 1 shows "0" data write. In this case, the signal VRFY1 is set to "H", so that the bitline BL is recharged by the voltage VBH.

In the second verify read cycle when "2" data is written (initial write data is "2"), data of the memory cell is "2". Therefore, if the threshold value of the memory cell is 0.5V or more, the bitline potential is "H" as it is even if the control sate is set to 0.5V ((9), (10) of FIG. 14). In a case where "2" data is insufficiently written and the threshold value of the memory is below 0.5V, the bitline is set to "L" ((11) of FIG. 14).

Thereafter, in a case where the signals VRFY1, VRFY2, FIH are set to "H", so that "2" is already sufficiently written and data 1 shows "0" data write, the bitline BL is set to "H" ((9) of FIG. 14) or "L" ((10), (11) of FIG. 14).

By the above-explained verify read operation, write data and rewrite data from the write state of the memory cell are set as shown in the following Table 3.

TABLE 3

| Write data | 00011222 |
|---|---|
| Cell data | 01201012 |
| Rewrite data | 00010220 |

As is understood from Table 3, "1" data is written again in only the memory cell in which "1" is insufficiently written. Also, "2" data is written again in only the memory cell in which "2" is insufficiently written.

In the memory cell in which "1" is insufficiently written, since both N1 and N2 are set to "H", Qn13A and Qn13B are "ON", so that RENDB2 is discharged from the precharge potential. In other words, if there is at least one memory cell in which "1" is insufficiently written, RENDB2 is set to "L." Then, even in the next verify read after the rewrite, it is checked whether or not "1" data is sufficiently written.

If all the memory cells in which "1" is written are sufficiently written, node N1 is set to "L" at all columns for write "1." As a result, Qn13A is turned "OFF", and RENDB2 keeps the precharge potential. In the other words, the "1" data write operation completion detection circuit 4 detects that "H" level of the potential of RENDB2 is maintained. As a result, as shown in FIGS. 6 and 15, at the next verify read (after the rewrite), only the verify read for checking whether or not "2" data is sufficiently written is performed.

In the memory cells in which "0" or "2" is written, since N2 is set to "L", Qn13B is turned "OFF", and RENDB2 is not discharged from the precharge potential. As a result, even in a case where all write data is "0" or "2", RENDB2 can keep "H" level. In the case of "0" data write, N1 may be set to "L", and N2 may be set to "H." Since N1 is set to "L," Qn13A is turned "OFF", the "H" level of RENDB2 can be maintained, and RENDB2 is not discharged from the precharge potential.

Figure 15:
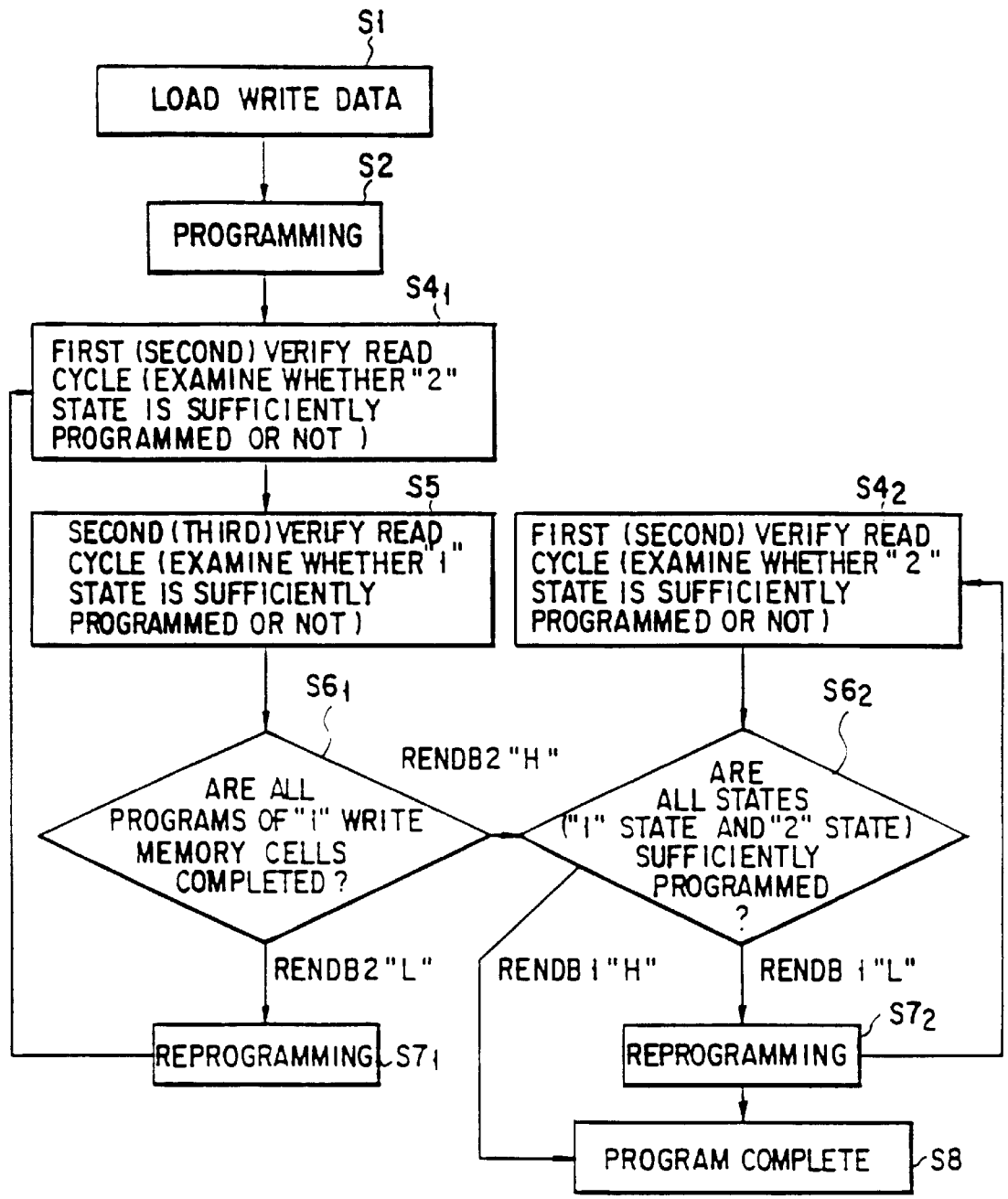
FIG. 15 is a view explaining the outline of a write of the fourth and fifth embodiments of the present invention.

The following will explain the state in which the verify read for checking whether or not the memory cell in which "1" data is sufficiently written is omitted with reference to FIG. 15.

If "1" data is insufficiently written, the rewrite, the first verify read cycle, the second verify read cycle are repeated as shown in FIG. 15 since RENDB2 is in the "L" level.

Assuming that all the memory cells in which "1" is written are sufficiently written and that there is a memory cell in which "2" is insufficiently written. Since RENDB2 is in the "H" level and RENDB1 is in the "L" level, only the verify read for checking whether or not "2" data is sufficiently written is performed at the next verify read (after the rewrite).

If data is sufficiently written in all memory cells, Qn13 of each column is turned "OFF", and the level of RENDB1 is set to "H." The data write operation completion detection circuit 4 detects that the level of RENDB1 is set to "H." As a result, data write operation completion data is output.

According to this embodiment, the unnecessary verify read operation is omitted, so that data write time can be largely reduced. The omission of the unnecessary verify read operation can be realized only by increasing the number of transistors by two as compared with the conventional case. As a result, the increase in the area, which is necessary for realizing the omission, is small.

Table 4 shows the potential of each part of the memory cell array at each of the cases of erasure, write, read and verify read.

TABLE 4

| | Erase | Write "0" | "1" | "2" | Read first cycle only "2" reading time | Read second cycle only "0" reading time | Verify read first cycle | Verify read second cycle |
|---|---|---|---|---|---|---|---|---|
| BL | 20V | 8V | 1V | 0V | "H" | "L" | See FIG. 9 | |
| SG1 | 20V | | 10V | | 5V | | 5V | |
| CG1 | 0V | | 10V | | 5V | | 5V | |
| CG2 | 0V | | 10V | | 5V | | SV | |
| CG3 | 0V | | 10V | | 5V | | 5V | |
| CG4 | 0V | | 20V | | 1.5V | 0V | 2V | 0.5V |
| CG5 | 0V | | 10V | | 5V | | 5V | |
| CG6 | 0V | | 10V | | 5V | | 5V | |
| CG7 | 0V | | 10V | | 5V | | 5V | |
| CG8 | 0V | | 10V | | 5V | | 5V | |
| SG2 | 20V | | 0V | | 5V | | 5V | |
| Vs | 20V | | 0V | | 0V | | 0V | |
| Pwell | 20V | | 0V | | 0V | | 0V | |

Fifth Embodiment

Figure 16:
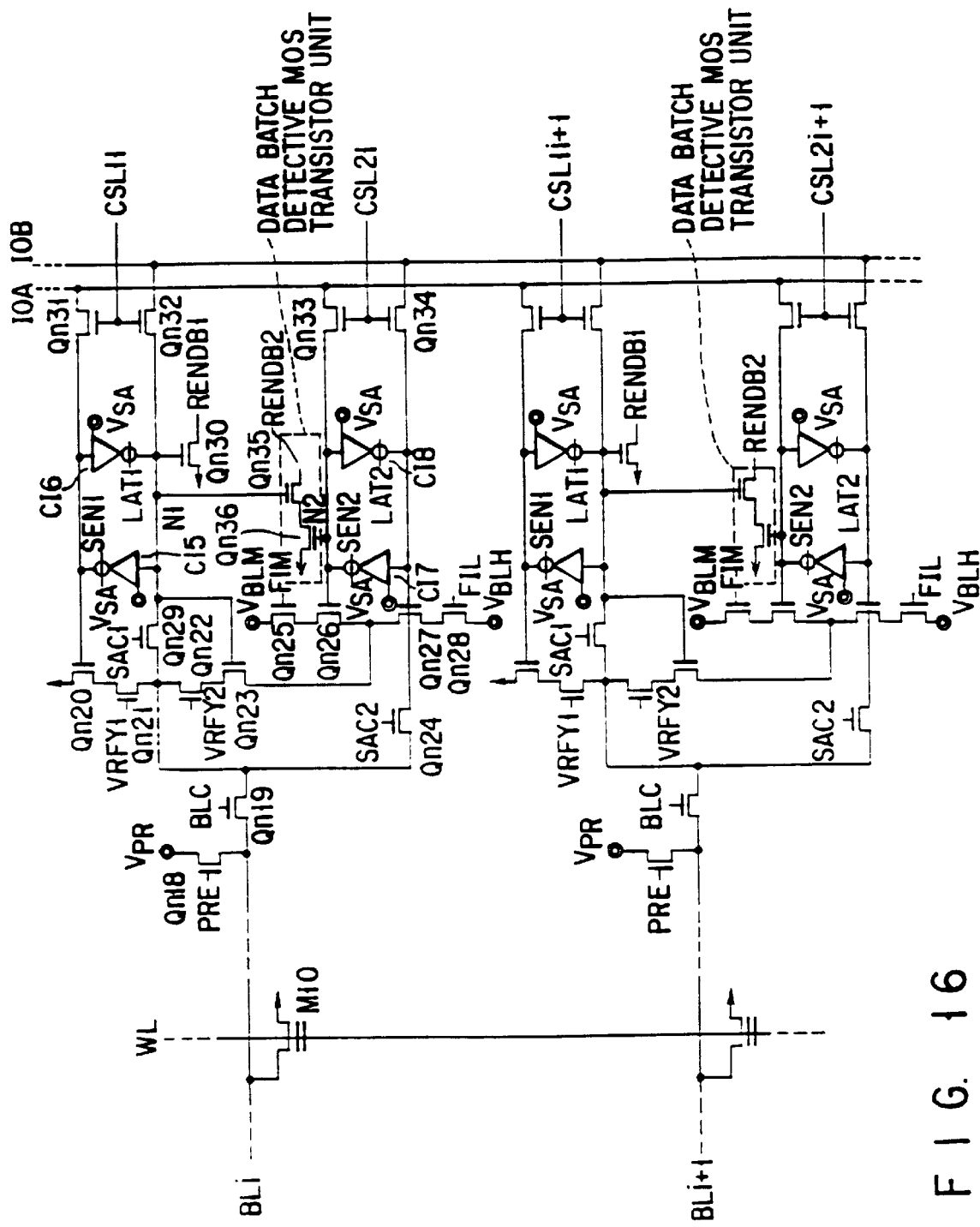
FIG. 16 is a circuit diagram showing the specific structure of the bitline control circuit of the fifth embodiment.

FIG. 16 shows the specific structure of the memory cell array 1 and the bitline control circuit 2 of the NOR cell type EEPROM according to the fifth embodiment of the present invention.

The NOR type cell comprises only the memory cell M10. One end of the NOR type cell is connected to the bitline BL, and the other end is connected to the common around line. The memory cell M having one control gate WL in common constitutes a page. The memory cell stores data in accordance with its threshold value Vt. Specifically, if Vt is over Vcc, the memory cell stores data "0." If Vt is below Vcc, the memory cell stores data "1." If Vt is below 5V and more than 0V, the memory cell stores data "2."

Three data states can be provided by one memory cell, and nine combinations of data can be formed by two memory cells. In this embodiment, by use of eight combinations, two memory cells can store data for three bits. The combination of two adjacent memory cells using one control gate in common stores data for three bits.

Clock-synchronous type inverters C15, C16 and C17, C18 constitute flip-flops, respectively, to latch write/read data. These flip-flops operate as a sense amplifier. The flip-flop comprising inverters C15, C16 latches data, "write "0" data or write "1" or "2" data", as write data. Also, the flip-flop latches data, "the memory cell holds "0" data or the memory cell holds "1" or "2" data?" as read data. The flip-flop comprising inverters C17, C18 latches data, "write "1" data or write "2" data", as write data. Also, the flip-flop latches data, "the memory cell holds "2" data or the memory cell holds "0" or "1" data?" as read data.

In the n-channel MOS transistors, Qn18 transfers a voltage VPR to the bitline when a precharge signal PRE is set to an "H" level. Qn19 connects the bitline to the main bitline control circuit when a bitline connection signal BLC is set to an "H" level. Qn20 to Qn23 and Qn25 to Qn28 selectively transfer voltages VBLH, VBLM, 0V to the bitline in accordance with data latched by the above-described flip-flops. Qn24 and Qn29 connect the flip-flop to the bitline when signals SAC2, SAC1 are set to an "H" level, respectively. Qn30 detects whether or not data for one page latched by the flip-flops is all the same. Qn35 and Qn36 are batch detective MOS transistors to detect whether or not the memory cells in which "1" of the same page is written are all sufficiently written. Qn31, Qn32 and Qn33, Qn34 selectively connect the corresponding flip-flop to data I/O line IOA, IOB, respectively, when column select signals CSL1, CSL2 are set to an "H" state.

Figure 17:
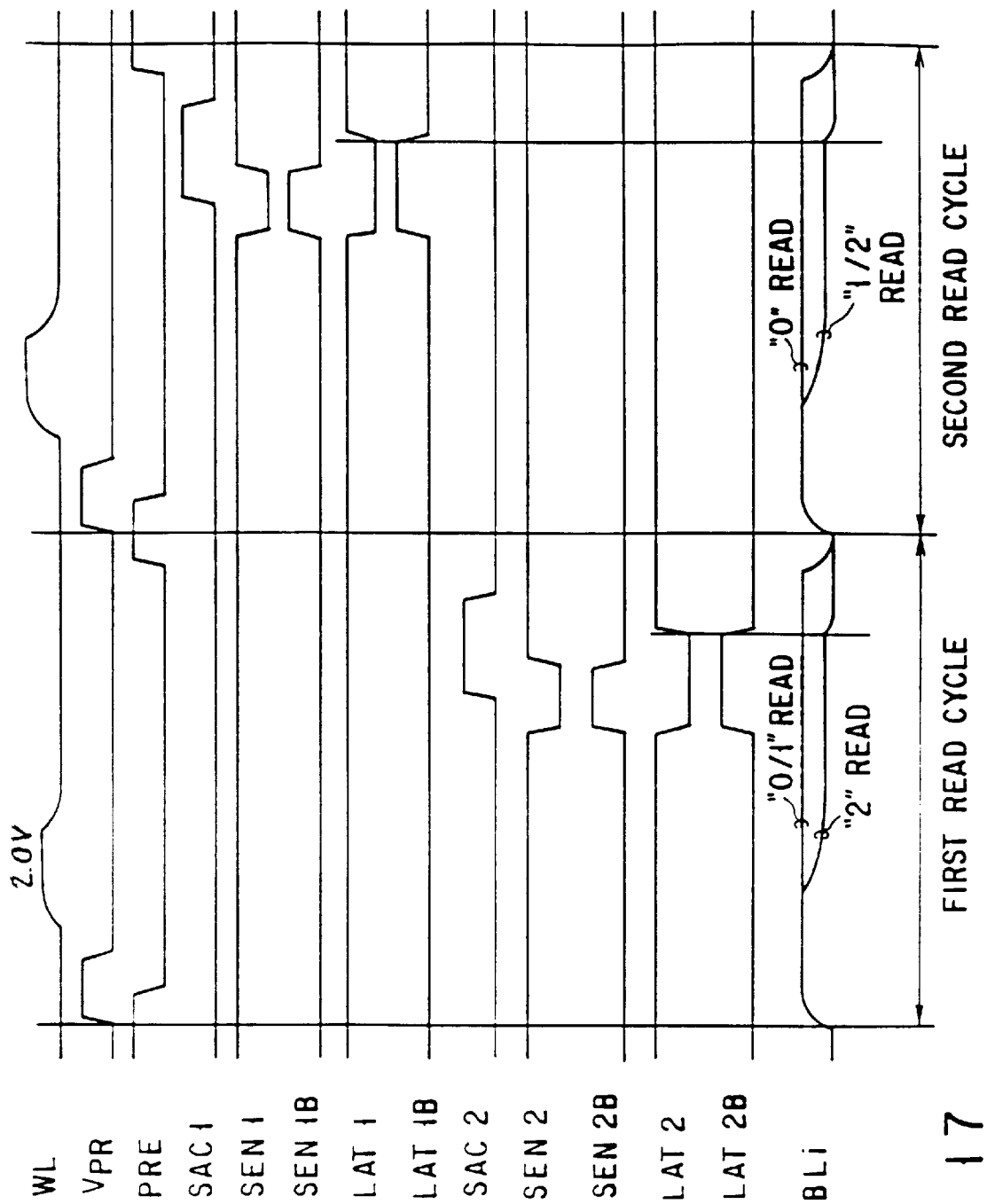
FIG. 17 is a timing chart showing a read operation of the fifth embodiment of the present invention.
Figure 19:
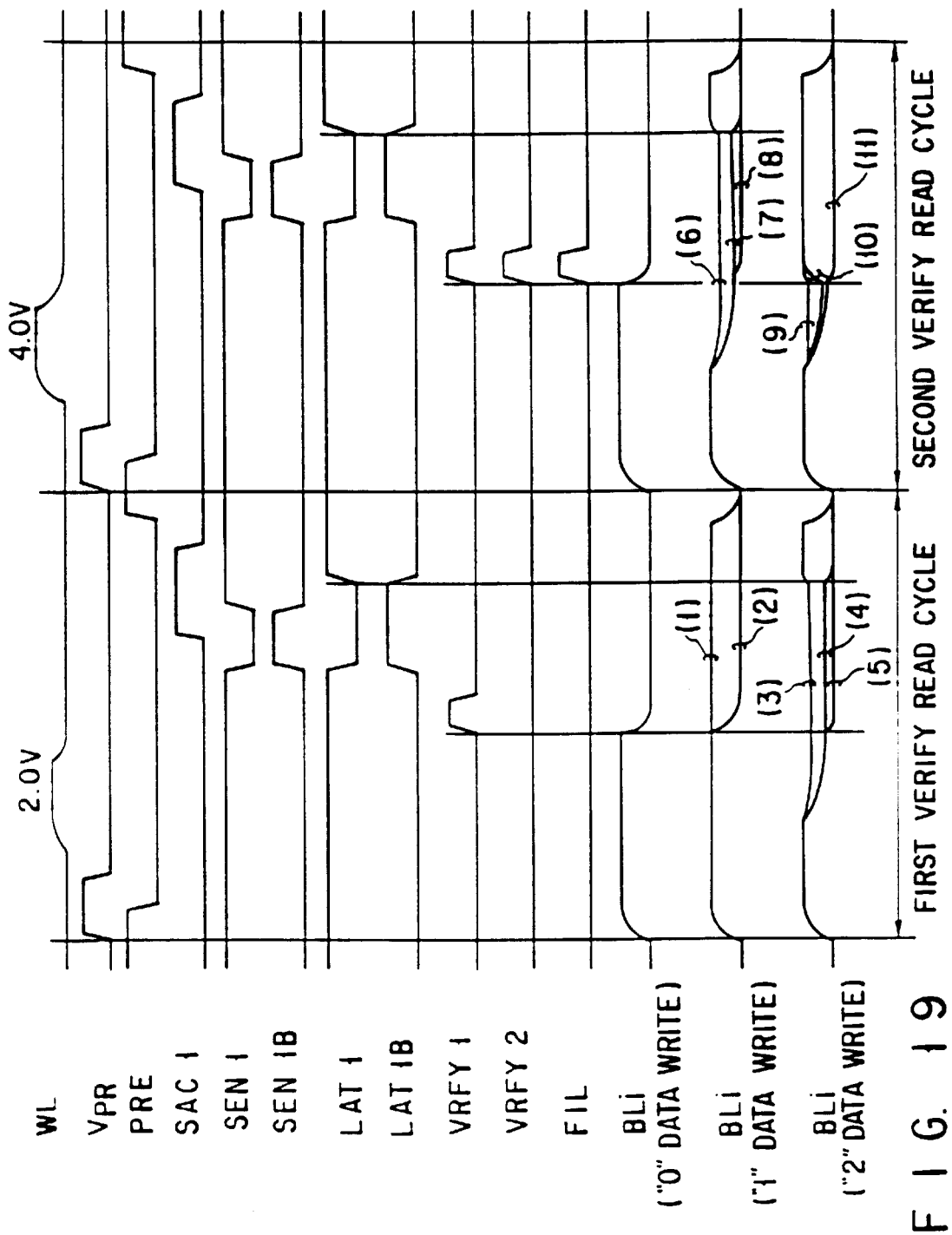
FIG. 19 is a timing chart showing a verify read operation of the fifth embodiment of the present invention.

The following will explain an operation of the above-structured EEPROM with reference to FIGS. 17 to 19. FIG. 17 shows the timing of a read operation, FIG. 18 shows the timing of a write operation, and FIG. 19 shows the timing of a verify read operation.

<Read Operation>

The read operation is performed by two basic cycles as shown in FIG. 17. At the first read cycle, the voltage VPR is changed to the power supply voltage Vcc, and the bitline is precharged. The precharge signal PRE is set to an "L" level, and the bitline is floated. Sequentially, the control gate WL is set to 2.5V. Only when Vt of the selected memory cell is 2.5V or less, that is, data "2" is written, the "L" level of the bitline is maintained.

Thereafter, the levels of sense activation signals SEN2, SEN2B are set to "L", "H", respectively. The levels of latch activation signals LAT2, LAT2B are "L" and "H", respectively. As a result, the flip-flop comprising the clock-synchronous type inverters C17 and C18 is reset. The level of the signal SAC2 is set to "H", and the flip-flop comprising the clock-synchronous type inverters C17 and C18 and the bitline are connected to each other. The levels of sense activation signals SEN2, SEN2B are set to "H", "L", respectively, so that the bitline potential is sensed. Thereafter, the levels of latch activation signals LAT2, LAT2B are "H" and "L", respectively. Then, data ""2" data, or "1" or "0" write" is latched by the flip-flop comprising the clock-synchronous type inverters C17 and C18.

The second read cycle is different from the first read cycle in the following points.

Specifically, the voltage of the select control gate WL is not 2.5V but Vcc. Signals SEN1, SEN1B, LAT1, LAT1B, and SAC1 are output in place of signals SEN2, SEN2B, LAT2, LAT2B, SAC2.

In the second read cycle, data ""0" data or, "1" or "2" write" is latched by the flip-flop comprising the clock-synchronous type inverters C15 and C16.

Data written in the memory cell is read by the above-explained two read cycles.

<Write Operation>

Prior to data write, data of the memory cell is erased, and the threshold value Vt of the memory cell is Vcc or more. At the erasure time, the control gate WL is set to 20V, and the bitline is set to 0V. The potentials of nodes N1 and N2 of the flip-flop circuits provided in the bitline control circuit of FIG. 16 are shown in the following Table 5.

TABLE 5

| | "0" | "1" | "2" |
|---|---|---|---|
| N1 | L | H | H |
| N2 | L | H | L |

In the write operation, as shown in FIG. 18, the level of the precharge signal PRE is set to "L", and the bitline is floated. The signals VRFY1, VRFY2, FIM, FIL are set to Vcc. In a case where "0" is written, data is latched by the flip-flop comprising the clock-synchronous type inverters C15 and C16 such that the output level of the clock-synchronous type inverter C15 is set to "H." As a result, the bitline is set to 0V. In a case where "1" or "2" is written, the bitline is charged to Vcc.

Sequentially, the signals BLC, VRFY2, FIM, FIL and the voltage VSA are set to 10V, the voltage VBLH is set to 8V, and the voltage VBLM is set to 7V. In a case where "1" is written, data is latched by the flip-flop comprising the clock-synchronous type inverters C17 and C18 such that the output level of the clock-synchronous type inverter C17 is set to "H." As a result, 7V is applied to the bitline BL. In a case where "2" is written, the bitline is set to 8V. In a case where "0" is written, the bitline is set to 0V. Thereafter, the selected control gate WL is set to −12V.

In a case where "1" or "2" is written, an electron is injected to a charge storage layer of the memory cell by a potential difference between the bitline BL and the control gate WL. As a result, the threshold value of the memory cell is reduced. In a case where "1" is written, an amount of charges to be injected to the charge storage layer of the memory cell must be lessened as compared with the case where "2" is written. Due to this, the bitline BL is set to 7V, and the potential difference between the bitline BL and the control gate WL is relaxed to 19V. In the case where "0" is written, the threshold value of the memory cell is substantially unchanged by the bitline voltage of 0V.

<Verify Read Operation>

To confirm the write state of the memory cell after the write operation and additionally write data only to the memory cell in which data is insufficiently written, the verify read is performed. The timing of the verify read operation is shown in FIG. 19, and the outline of the operation is shown in FIG. 15 previously explained. During the verify reading, the voltage VBLH is Vcc, and the FIM is 0V.

The verify read is performed by two basic cycles. The basic cycles are similar to the read cycle. The difference between the basic cycles and the read cycle lies in the following point.

Specifically, the voltage of the selected control gate WL and the signals VRFY1, VRFY2, and FIH are output (only VERY1 is output at the first verify read cycle).

The signals VRFY1, VRFY2, and FIH are output before the signals SEN1, SEN1E, LAT1, LAT1B are set to "L", "H", "L", "H", respectively, after the control gate WL is reset to 0V. In other words, the signals VRFY1, VRFY2 and FIH are output after the potential of the bitline is determined by the threshold value of the memory cell and before the flip-flop comprising the clock-synchronous type inverters C15 and C16 is reset. The voltage of the selected control gate WL is set to be low, e.g., 2V (first cycle) 4V (second cycle) to reserve a threshold margin against 2.5V (first cycle) at the read time and Vcc (second cycle).

The following will explain the voltage of the bitline BL, which is determined by data 1, data 2, and the threshold value of the selected memory cell (data 1 is latched by the flip-flop comprising the clock-synchronous type inverters C15 and C16 and data 2 is latched by the flip-flop comprising the clock-synchronous type inverters C17 and C18).

Data 1 is a signal for controlling ""0" data, or "1" or "2" data write." In the case where "0" is written, Qn20 is in an "ON" state, and in the case where "1" or "2" is written, Qn23 is in an "ON" state. Data 2 is a signal for controlling ""1" data or "2" data write." In the case where "1" is written, Qn26 is in an "ON" state, and in the case where "2" is written, Qn27 is in an "ON" state.

<Verify First Read Cycle>

In the first verify read cycle when "0" data is written (initial write data is "0"), since data of the memory cell is "0", the level of the bitline potential is set to "H" even if the control gate WL is 2V. Thereafter, the signal VRFY1 is set to "H", so that the level of the bitline BL is set to "L."

In the first verify read cycle when "1" data is written (initial write data is "1"), since data of the memory cell is "1", the threshold value of the memory cell is 2.5V or more. Even if the control gate WL is 2V, the level of the bitline potential is maintained to be "H." Thereafter, if the signal VRFY1 is set to "H", "1" data is already sufficiently written, and data 1 shows only "0" data write, the level of the bitline BL is set to "L" ((2) of FIG. 19), or "H" ((1) of FIG. 19).

In the first verify read cycle when "2" data is written (initial write data is "2"), if data of the select memory cell is not "2" ("2" is insufficiently written), the level of the bitline potential is "H" ((3) of FIG. 19) even when the control gate WL is 2V. In a case where "2" is sufficiently written in the select memory cell, the level of the bitline potential is set to "L" when the control gate WL is 2V ((4), (5) of FIG. 19). (5) of FIG. 19 shows the case in which "2" is already sufficiently written and data 1 shows "0" data write. In this case, the level of the signal VRFY1 is set to "H", so that the bitline BL is grounded.

<Verify Second Read Cycle>

In the second verify read cycle when "0" data is written (initial write data is "0"), since data of the memory cell is "0", the level of the bitline potential is set to "H" even if the control gate CG is 4V. Thereafter, the signal VRFY1 is set to "H", so that the level of the bitline BL is set to "L."

in the second verify read cycle when "1" data is written (initial write data is "1"), in a case where data of the memory cell is not "1" ("1" is insufficiently written), the level of the bitline potential is "H" even if the control gate WL is 4V ((6) of FIG. 19). In a case where "1" is sufficiently written, the level of the potential value is "L" if the control gate WL is 4V ((7), (8) of FIG. 19). (8) of FIG. 19 shows the case in which "1" is already sufficiently written and data 1 shows "0" data write. In this case, the level of the signal VRFY1 is set to "H", so that the bitline BL is grounded.

In the first verify read cycle when "2" data is written (initial write data is "2"), data of the memory cell is "2." Due to this, if the threshold value of the memory cell is 4V or less and "2" is insufficiently written, the level of the bitline potential is "L" when the control gate WL is 4V ((10), (11) of FIG. 19). In a case where "2" is insufficiently written and the threshold value of the memory cell is 4V or more, the level of the bitline is "H" ((9) of FIG. 19).

Thereafter, if the signals VRFY1, VRFY2, FIH are set to "H", "2" data is already sufficiently written, and data 1 shows only "0" data write, the level of the bitline BL is set to "H" ((11) of FIG. 19), or "H" ((9), (10) of FIG. 19).

By the above-explained verify read operation, similar to the fourth embodiment, write data and rewrite data are set as shown Table 3.

In this case, in the memory cell which "1" is insufficiently written, since both N1 and N2 are in the "H" level, Qn35 and Qn36 are turned "ON", and RENDB2 is discharged from the precharge potential. Even if there is one memory cell in which "1" is insufficiently written, RENDB2 is set to an "L" level. Then, it is checked whether or not "1" is sufficiently written in the next verify read (after the rewrite).

If all the memory cells in which "1" is written are sufficiently written, node N1 is set to "L" at all columns for write "1." As a result, Qn35 is turned "OFF", and RENDB2 can keep the precharge potential. In the other words, the "1" data write operation completion detection circuit 4 detects that "H" level of the potential of RENDB2 is maintained. As a result, as shown in FIGS. 6 and 15, at the next verify read (after the rewrite), only the verify read for checking whether or not "2" data is sufficiently written is performed.

In the memory cells in which "0" or "2" is written, since N2 is set to "L", Qn36 is turned "OFF", and RENDB2 is not discharged from the precharge potential. As a result, even in a case where all write data is "0" or "2", RENDB2 can keep "H" level. In the case of "0" data write, N1 may be set to "L", and N2 may be set to "H." Since N1 is set to "L," Qn35 is turned "OFF", the "H" level of RENDB2 can be maintained, and RENDB2 is not discharged from the precharge potential.

The following will explain the state in which the verify read for checking whether or not the memory cell in which "1" data is sufficiently written is omitted with reference to FIG. 15. If ""1" data is insufficiently written, the rewrite, the first verify read cycle, the second verify read cycle are repeated as shown in FIG. 15 since RENDB2 is in the "L" level.

Assuming that all the memory cells in which "1" is written are sufficiently written and that there is a memory cell in which "2" is insufficiently written. Since RENDB2 is in the "H" level and RENDB1 is in the "L" level, only the verify read for checking whether or not "2" data is sufficiently written is performed at the next verify read (after the rewrite)

If data is sufficiently written in all memory cells, Qn30 of each column is turned "OFF", and the level of RENDB1 is set to "H." The data write operation completion detection circuit 4 detects that the level of RENDB1 is set to "H." As a result, data write operation completion data is output.

Table 6 shows the potential of each part of the memory cell array at each of the cases of erasure, write, read and verify read.

TABLE 6

| | | | | Read | | | |
|---|---|---|---|---|---|---|---|
| | | | | first cycle only "2" reading time | second cycle only "2" reading time | Verify read | |
| | | Write | | | | first cycle | second cycle |
| | Erase | "0" "1" "2" | | "L" | "H" | See FIG. 14 | |
| BL | 0 V | 0 V 7 V 8V | | 2.5 V | 5 V | 2.0 V | 4.0 V |
| WL | 20 V | −12 V | | | | | |

The circuits shown in FIGS. 11 and 16 can be deformed as shown in FIGS. 20 and 21, respectively. FIG. 20 shows a case in which n-channel transistors Qn3 and Qn4 are replaced with p-channel transistors Qp1 and Qp2. FIG. 21 shows a case in which n-channel transistors Qn22, Qn23, Qn25 to Qn28 are replaced with p-channel transistors Qp3 to Qp8. As a result, it is possible to prevent the drop of the voltage, which can be transferred in accordance with the threshold voltage of the n-channel transistors. In this example, the voltage VSA may be increased up to 8V, so that the breakdown voltage of the transistors constituting the circuit can be reduced. VRFY1B of FIG. 20 is a reverse signal of VRFY1 of FIG. 11, and VRFY2B, FILB, and FIMB of FIG. 21 are reverse signals of VRFY2, FIL, and FIM of FIG. 16, respectively.

Sixth Embodiment

The following will explain the specific example in which two kinds of detections are performed in the case where the ternary memory cell is used similar to the second embodiment Specifically, one is a detection of the write operation completion of the memory cell in which "1" is written, and the other is a detection of the write operation completion of the memory cell in which "2" is written.

Figure 23:
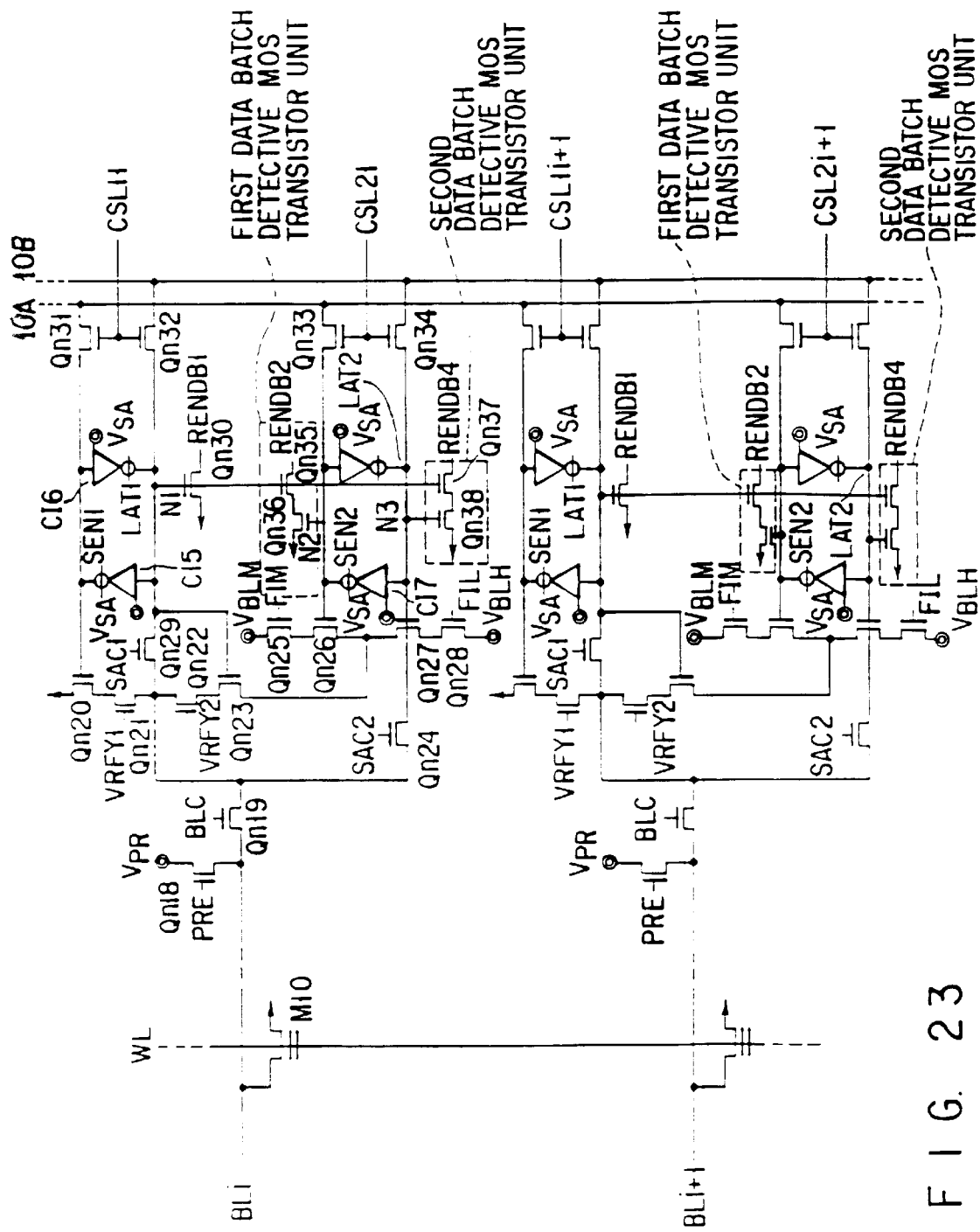
FIG. 23 is a circuit diagram showing the specific structure of the bitline control circuit of the sixth embodiment of the present invention.

FIG. 22 shows a case in which the present invention is applied to the NAND type EEPROM, FIG. 23 shows a case in which the present invention is applied to the NOR type EEPROM. The difference between the sixth embodiment and the fourth and fifth embodiments lines in the following point.

Specifically, the detector of the write operation completion of the memory cell in which "2" is written is provided in addition to the detector of the write operation completion of the memory cell in which "1" is written.

In FIGS. 22 and 23, a first data batch detective MOS transistor unit (Qn13A, Qn13B of FIG. 22 and Qn35, Qn36 of FIG. 23) is a circuit for detecting the write operation completion of the memory cell in which "1" is written. A second data batch detective MOS transistor unit (Qn13C, Qn13D of FIG. 22 and Qn37, Qn38 of FIG. 23) is a circuit for detecting the write operation completion of the memory cell in which "2" Us written.

Similar to the fourth and fifth embodiments, RENDB1 is a signal for detecting the write operation completion of all data. RENDB2 is a signal for detecting whether or not the memory cell in which "1" is written is sufficiently written.

RENDB4 is a signal for detecting whether or not the memory cell in which "2" is written is sufficiently written. "2" data write operation completion batch detection may be performed in the same as the "1" data write operation completion batch detection, which is already described in the fourth and fifth embodiments.

Prior to the batch detection, RENDB4 is precharged to a constant potential. In the memory cell in which "2" is written, since N3 is set to the "H" level, MOS transistor Qn13D of FIG. 22 (Qn38 of FIG. 23) is turned "ON." As described in the fourth and fifth embodiments, since N1 of the memory cell in which "2" is written is set to the "L" level, Qn13C of FIG. 22 (Qn37 of FIG. 23) is turned "OFF," so that RENDB4 keeps the precharge potential. In the case of the memory cell in which "2" is insufficiently written, since N1 of the memory cell is set to the "H" level, Qn13C of FIG. 22 (Qn37 of FIG. 23) is turned "ON", so that RENDB4 is discharged from the precharge potential. In the case of the memory cell in which "0" is written, since N1 of the memory cell is set to the "L" level, Qn13C of FIG. 22 (Qn37 of FIG. 23) is turned "OFF," so that RENDB4 keeps the precharge potential. In the case of the memory cell in which "1" is written, N3 is set to the "L" level regardless of the write state, that is, sufficient write or insufficient write. As a result, RENDB4 keeps the precharge potential.

As mentioned above, by detecting RENDB4, it is possible to detect whether or not the memory cell in which "2" is written is sufficiently written. The outline of the write operation may be performed as explained in the second embodiment.

Seventh Embodiment

According to the present invention, in write data to the multi-value memory cell, the data batch detective MOS transistor unit can detect the write operation completion of the memory cell in which "1" is written and the write operation completion of the memory cell in which "2" is written. The data batch detective MOS transistor unit is connected to the bitline control circuit. If there is no "1" write data in, for example, the ternary memory cell, the verify read for "1" write data can be omitted from the beginning.

As shown in FIG. 22, RENDB2 and RENDB4 are precharged before inputting write data to the bitline control circuit. Thereafter, data is loaded to the latch circuit comprising inverters C11, C12, C13, and C14.

If there is no "1" in write data, at least one of N1 and N2 is set to the "L" level, and at least one of Qn13B or Qn13A is turned "OFF", so that RENDB2 keeps the precharge potential. In the bitline control circuit for write data "1", both N1 an N2 are set to the "H" level, so that RENDB2 is discharged from the precharge potential.

By detecting the potential of RENDB2, it is possible to detect whether or not there is "1" write data. If there is no "1" write data, the verify read for checking whether or not "1" is sufficiently written may not be performed from the beginning.

Similarly, RENDB4 is precharged before the data load. Then, after the data load to the bitline control circuit, the potential of RENDB4 is detected, thereby making it possible to detect whether or not "2" data is written. In other words, if there is no "2" write data, RENDB4 keeps the precharge potential. If there is "2" write data, RENDB4 is discharged from the precharge potential. Then, the potential of RENDB4 may be detected. Thus, if RENDB4 is discharged, the verify read for checking whether or not "2" is sufficiently written may not be performed from the beginning. By omitting the unnecessary verify read, the entire write time can be reduced.

Eighth Embodiment

This embodiment will specifically explain the four-value memory cell described in the third embodiment.

The flow chart showing the write operation is the same as FIG. 8. According to this embodiment, the unnecessary verify read is omitted, so that the entire write time is reduced. Specifically, after the first write, the first verify read cycle, the second verify read cycle, and the third verify read cycle are performed. The first verify read cycle checks whether or not "3" is sufficiently written. The second verify read cycle checks whether or not "2" is sufficiently written. The third verify read cycle checks whether or not "1" is sufficiently written.

If there is a memory cell in which "1" is insufficiently written, a rewrite is performed. In the rewrite operation, the write operation is performed even in the memory cell in which "2" is insufficiently written and the memory in which "3" is insufficiently written.

The third verify read cycle is unnecessary after the memory cell in which "1" is written is sufficiently written. Due to this, as shown in FIG. 8, until the memory cell in which "2" is written is sufficiently written, the rewrite, the first verify read cycle, and the second verify read cycle are performed.

The second verify read cycle is unnecessary after the memory cell in which "1" is written is sufficiently written. As shown in FIG. 8, until the memory cell in which "3" is written is sufficiently written, only the rewrite and the first verify read cycle are performed.

The following will explain the case in which the present invention is applied to the four-value memory cell of NAND type EEPROM.

FIG. 24 shows the structure of the multi-value storable type EEPROM according to the eighth embodiment of the present invention. In the memory cell array 1 in which the memory cells are arranged in the matrix form, there is provided a control gate and select gate driving circuit 9 to select the memory cell or to apply a write voltage and a read voltage to the control gate. The circuit 9 is connected to an address buffer 11 so as to receive an address signal. A data circuit 10 stores write data and reads data of the memory cell. The circuit 10 is connected to the data I/O buffer 6 to receive an address signal from the address buffer 11. The data I/O buffer 6 controls the data input and output to/from the external section of the EEPROM.

FIG. 25 shows the memory cell array 1 shown in FIG. 24 and the data circuit 10. The memory cells M1 to M4 are connected in series so as to constitute an NAND cell type cell. The both ends of the NAND cell type cell are connected to the bitline BL and the source line Vs through select transistors S1 and S2, respectively. The group of the memory cells M using the control gate CG in common forms a unit, which is called "page", and writes and reads data. A block is formed by the group of the memory cells expanding to four control gates CG1 to CG4. Each of "page" or "block" is selected by the circuit 9. Each of the data circuit 10-0 to 10-m is connected to each of the bitlines BL0A to BLmA, and temporarily stores write data to the corresponding memory cell. In this embodiment, since an open-bitline arrangement is used, the bitlines BL0B to BLmB are connected to the data circuits, respectively.

FIG. 26 shows the relationship between the threshold voltage of the memory cell M and four write states (four level data "0", "1", "2", "3"). The data "0" state is the same as the state after an erasure is performed. For example, the data "0" state has a negative threshold value. The data "1" state has a threshold value between 0.5V to 0.8V. The data "2" state has a threshold value between 1.5V to 1.8V. The data "3" state has a threshold value between 2.5V to 2.8V.

Read voltage VCG2R is applied to the control gate CG of the memory cell M and the memory cell is turned "ON" or "OFF", so that data of the memory cell can be detected to be "0", "1", "2", or "3." Sequentially, read voltages VCG3R, VCGIR are applied to the control gate CG, so that data of the memory cell is completely detected. For example, read voltages VCG1R, VCG2R, and VCG3R are 0V, 1V, and 2V, respectively. These read voltages VCG1R, VCG2R, and VCG3R are called verify voltages. At a data write time, these read verify voltages are applied to the control gate to detect the state of the memory cell M. As a result, it is checked whether or not write data is completely performed. For example, these verify voltages are set to 0.5V, 1.5V, 2.5V, respectively.

Figure 27:
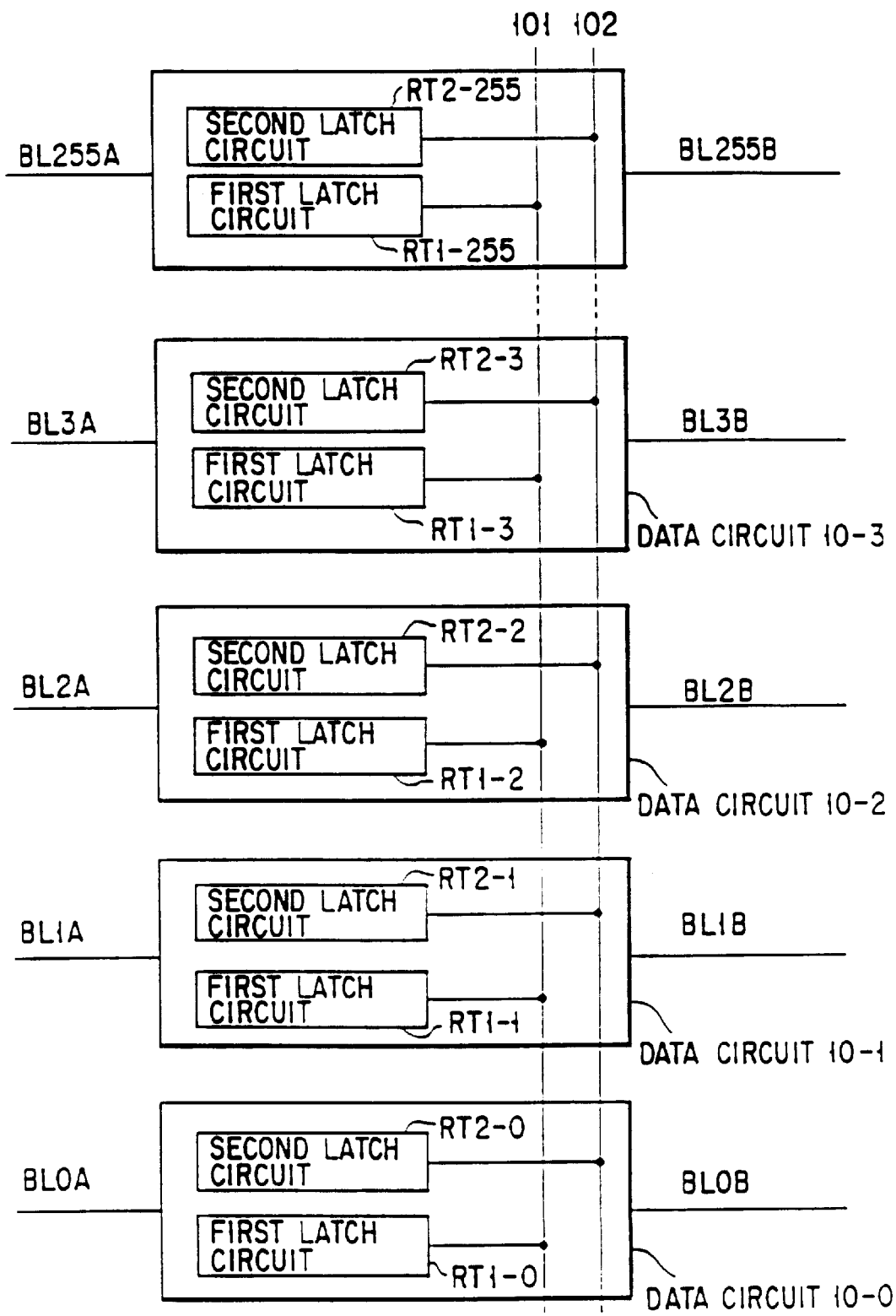
FIG. 27 is a block diagram showing the specific structure of the data circuit.

FIG. 27 shows the data circuit including two latch circuits (first and second latch circuits). In write data, two-bit write data is stored in these two latch circuits. In reading data, read four-value data is stored in these two latch circuits, and output to the external section of the chip through I/O1 and I/O2.

The following will explain a case in which 512-bit data (column address A0, A1, A2, . . . , A510, A511) is write and read.

<Write>

First, write data of head address A0 is input to a first latch circuit RT1-0 so as to be stored. Sequentially, write data of address A1, A2, . . . , A254, A255 is input to latch circuits RT1-1, RT1-2, . . . , RT1-254, RT1-255, respectively, so as to be stored. Then, write data of address A256, A257, . . . , A510, A511 is input to latch circuits RT2-0, RT2-1, . . . , RT2-254, RT2-255, respectively, so as to be stored. Thereafter, data write to the memory cell is performed in accordance with two-bit write data stored in these two latch circuits of the data circuit.

If data of below 512 bits, write data is input to the first latch circuit of the data circuit. However, write data is not input to the second latch circuit. In this case, write data may be input to the second latch circuit such that the write state of the memory cell is set to "0" state having the low threshold value or "1" state.

<Read>

Figure 28A:
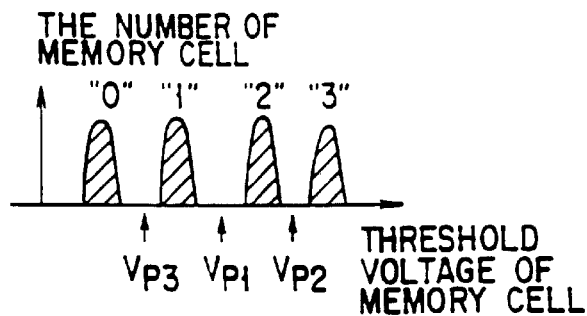
FIGS. 28A and 28B are views each explaining the outline of reading steps.
Figure 28B:
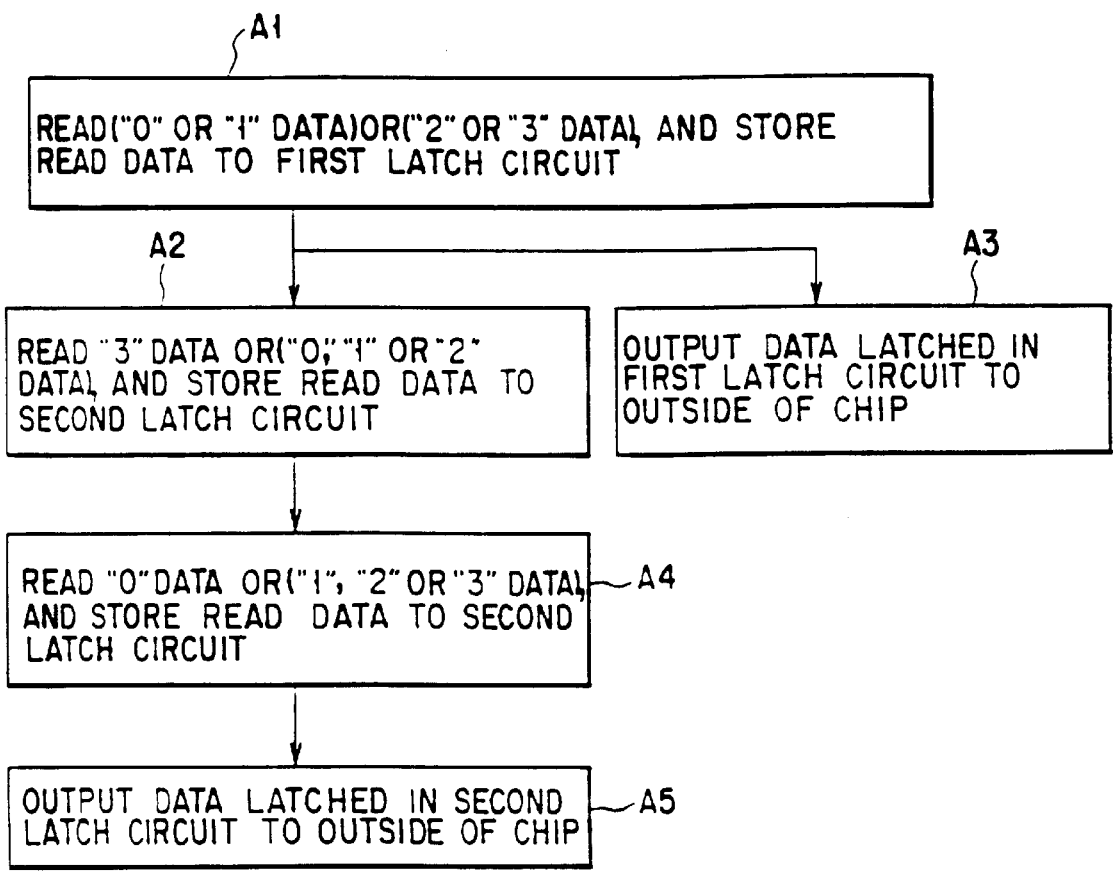

FIGS. 28A and 28B show data read steps.

First of all, a voltage Vp1, which is between "1" state and "2" state, is applied to the word line of the read memory cell. If the memory cell is in a conductive state, data is "0" or "1." If the memory cell is in a non-conductive state, data is "2" or "3." Then, read data corresponding to the column addresses A0, A1, A2, . . . , A254, A255 is stored in the first latch circuit (step A1).

Next, if Vp2 is applied to the select word line, it is understandable that the memory cell is "0" state, or "1" or "2" state. Read data is stored in the second latch circuit (step A2). During this time, data (corresponding to the column addresses A0, A1, A2, . . . , A254, A255) stored in the first latch circuit is output to the external section of the chip through the IO1 (step A3).

Finally, if Vp3 is applied to the select word line, it is understandable that the memory cell is "0" state, "1", "2", or "3" state. As a result, two-bit data stored in the memory cell is read. Data (corresponding to the column addresses A256, A257, . . . , A510, A511) is stored in the second latch circuit (step A4). Data (corresponding to the column addresses A0, A1, A2, . . . , A254, A255) stored in the first latch circuit is output to the external section of the chip. Thereafter, data (corresponding to the column addresses A0, A1, A2, . . . , A254, A255) is stored in the second latch circuit is output to the external section of the chip through the IO2 (step A5).

In the above-mentioned reading system, just after data is first sensed, and stored in the first latch circuit, read data can be output to the external section. As a result, the entire read time is greatly shorter than the conventional case. That is, the entire read time, which is the same as the case of the binary memory cell, can be obtained. In the conventional case, the word line voltage is changed three times, and data is output to the external section of the chip. In this embodiment, a predetermined read voltage is first applied to the word line so as to read the memory cell. Then, data is output to the external section of the chip. As a result, the reading speed can be improved.

The following will specifically explain an operation with reference to an operation timing chart.

Figure 29:
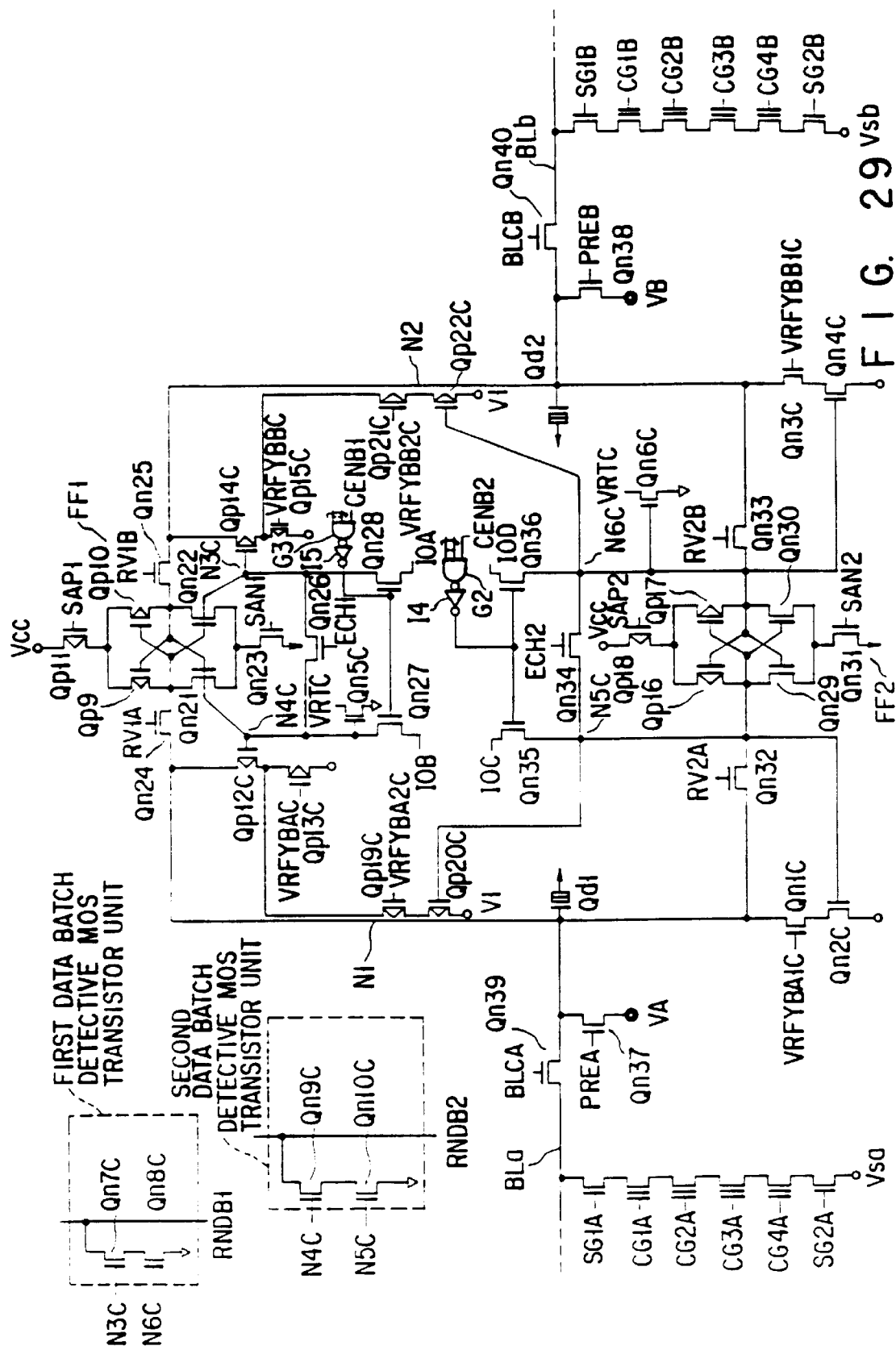
FIG. 29 is a circuit diagram showing a specific example of the data circuit.

FIG. 29 is a specific example of a circuit 3. This embodiment shows the case of the four-value storage. Write/read data is latched by flip-flops FF1 and FF2. The flip-flop FF1 comprises n-channel MOS transistors Qn21, Qn22, Qn23 and p-channel MOS transistors Qp9, Qp10, Qp11. The flip-flop FF2 comprises n-channel MOS transistors Qn29, Qn30, Qn31 and p-channel MOS transistors Qp16, Qp17, Qp18. These flip-flops FF1 and FF2 are operated as sense amplifiers.

Flip-flops FF1 and FF2 latch data, "write "0" data or write "1" data or write "2" data, or write "3" data?", as write data. Also, the flip-flops FF1 and FF2 latch data, "the memory cell holds "0" data, the memory cell holds "1", the memory cell holds "2" data, or the memory cell holds "3" data?" as read data. Data I/O lines IOA and IOB and the flip-flop FF1 are connected to each other through n-channel MOS transistors Qn28, Qn27. Data I/O lines IOC and IOD and the flip-flop FF2 are connected to each other through n-channel MOS transistors Qn35, Qn36.

Data I/O lines IOA, IOB, IOC, IOC are also connected to a data I/O buffer 4 of FIG. 24. Gates of the n-channel MOS transistors Qn 27 and Qn28 are connected to an NAND logic circuit G3 and the output of the column address decoder comprising an inverter I5. CENB1 is activated, so that read data stored in the flip-flop FF1 is output to IOA and IOB. Gates of the n-channel MOS transistors Qn 35 and Qn36 are connected to an NAND logic circuit G2 and the output of the column address decoder comprising an inverter I4. CENB2 is activated, so that read data stored in the flip-flop FF2 is output to IOC and IOD.

The n-channel MOS transistors Qn26 and Qn34 equalize the flip-flops FF1 and FF2, respectively, in a state that signals ECH1 and ECH2 are set to "H." The n-channel MOS transistors Qn24 and Qn32 control the connection between the flip-flops FF1 and FF2 and MOS capacitor Qd1. The n-channel MOS transistors Qn25 and Qn33 control the connection between the flip-flops FF1 and FF2 and MOS capacitor Qd2.

A circuit comprising p-channel MOS transistors Qp12C and Qp13C changes the gate voltage of MOS capacitor Qd1 by an activation signal VRFYBAC in accordance with data of flip-flop FF1. A circuit comprising p-channel MOS transistors Qp14C and Qp15C changes the gate voltage of MOS capacitor Qd2 by an activation signal VRFYBBC in accordance with data of flip-flop FF1. A circuit comprising p-channel MOS transistors Qp12C, Qp19C, and Qp20C changes the gate voltage of MOS capacitor Qd1 by an activation signal VRFYBA2C in accordance with data of flip-flops FF1 and FF2.

A circuit comprising p-channel MOS transistors Qp14C, Qp21C, and Qp22C changes the gate voltage of MOS capacitor Qd2 by an activation signal VRFYBB2C in accordance with data of flip-flops FF1 and FF2. A circuit comprising n-channel MOS transistors Qn1C and Qn2C changes the gate voltage of MOS capacitor Qd1 by an activation signal VRFYBA1C in accordance with data of flip-flop FF2. A circuit comprising n-channel MOS transistors Qn3C and Qn4C changes the gate voltage of MOS capacitor Qd2 by an activation signal VRFYBB1C in accordance with data of flip-flop FF2.

Each of MOS capacitors Qd1 and Qd2 comprises a depletion-type n-channel MOS transistor to be sufficiently smaller than the bitline capacitor. An n-channel MOS transistor Qn37 charges MOS capacitor Qd1 to a voltage VA by a signal PREA. An n-channel MOS transistor Qn38 charges MOS capacitor Qd2 to a voltage VB by a signal PREB. N-channel MOS transistors Qn39 and Qn40 control the connection between a data circuit and bitlines BLa and BLb by signals BLCA and BLCB, respectively. The circuit, which comprises n-channel MOS transistors Qn37 and Qn38, uses as a bitline voltage control circuit.

The first data batch detective MOS transistor unit, which comprises n-channel MOS transistors Qn7C and Qn8C, detects the write operation completion of the memory in which "1" is written. The second data batch detective MOS transistor unit, which comprises n-channel MOS transistors Qn9C and Qn10C, detects the write operation completion of the memory in which "2" is written.

The following shows a case in which a control gate CG2A is selected.

<Read Operation>

FIG. 30 shows a read method of this embodiment. At time tw1, voltages VA and VB are set to 1.8V and 1.5V, respectively, and bitlines BLa and BLb are set to 1.8V, and 1.5V, respectively. Then, the levels of signals PREA and PREB are set to "L", so that the bitlines BLa and BLb are floated. At time tw2, the control gate CG2A whose block is selected by the control gate and select gate drive circuit 9, is set to 1V. Then, non-select control gates CG1A, SG3A, CG4A and select gates SG1A and 2G2A are set to VCC. If the threshold value of the selected memory cell is below 1V, the bitline voltage is set to be lower than 1.5V. If the threshold value of the selected memory cell is over 1V, the bitline voltage of 1.8V is maintained as it is. Thereafter, the levels of signals SAN2 and SAP2 are set to "L" and "H", respectively. Then, the flip-flop FF2 is non-activated, and a signal ECH2 is set to an "H" level so as to be equalized. At time tw3, the levels of signals RV2A and RV2B are set to "H" Level. At time tw4, the levels of signals SAN2 and SAP2 are set to "H" and "L", respectively, so that the voltage of node N1 is sensed and latched. As a result, the flip-flop FF2 senses "data of memory cell is "0" or "1", "2" or "3"", and sensed data is latched.

At time tw5, data stored in the flip-flop FF2 is output to the external section of the chip when CENB2 is activated.

Then, it is checked whether the threshold value of the memory cell is over 1V or below 0V. The bitline BL$a$ and the dummy bitline BL$b$ are precharged to 1.8V and 1.5V, respectively, at time tw5. Thereafter, they are floated. At time tw6, the selected control gate is set to 0V. If the threshold value of the selected memory cell is below 0V, the bitline voltage is set to be lower than 1.5V. If the threshold value of the selected memory cell is over 0V, the bitline voltage of 1.8V is maintained as it is. Thereafter, the levels of signals SAN1 and SAP1 are set to "L" and "H", respectively. Then, the flip-flop FF1 is non-activated, and a signal ECH1 is set to an "H" level so as to be equalized. At time tw7, the levels of signals RV1 A and RV1 B are set to "H" level. At time tw8, the levels of signals SAN1 and SAP1 are set to "H" and "L", respectively, so that the voltage of node N1 is sensed and latched. As a result, the flip-flop FF1 senses "data of memory cell is "0" or "1", 2" or "3"", and sensed data is latched. At this time, the potentials of nodes N3C and N5C of the flip-flops FF1 and FF2 can be shown by the following Table 7.

TABLE 7

|  | "0" | "1" | "2" | "3" |
| --- | --- | --- | --- | --- |
| N3C | L | H | H | H |
| N5C | L | L | H | H |

Finally, data ""0", "1", "2" or "3"" written to the memory cell is sensed. At time tw9, the bitline BL$a$, and the dummy bitline BL$b$ are precharged to 1.8V, and 1.5V, respectively. Thereafter, they are floated. At time tw10, the selected control gate is set to 2V. If the threshold volts of the selected memory cell is below 2V, the bitline voltage is set to be lower than 1.5V. If the threshold voltage of the selected memory cell is over 2V, the bitline voltage of 1.8V is maintained as it is. At time tw11, VRFYBA2C is set to "0V."

As is obvious from Table 7, only when data is "1", node N5C is set to "Low level" and node N3C is set to "High level" (node N4C is set to "Low level"). As a result, only when data is "1", p-channel MOS transistors Qp12C, Qp19C, Qp20C are turned on, and node N1 is set to VCC.

Thereafter, the levels of signals SAN1 and SAP1 are set to "L" and "H", respectively, and flip-flop FF1 is non-activated. As a result, the signal ECH1 is set to "H" level, so as to be equalized. At time tw12, the levels of the signals RV1 A an RV1B are set to "H." At time tw13, the levels of signals SAN1 and SAP1 are set to "H" and "L", respectively, so that the voltage of node N1 is sensed and latched. As a result, the flip-flop FF1 senses "data of memory cell is "0" or "1", "2" or "3"", and sensed data is latched. At time tw14, data stored in the flip-flop FF1 is output to the external section of the chip when CENB1 is activated.

As a result of the above read operation, four-value data is latched by the flip-flops FF1 and FF2 as shown in the following Table 8.

TABLE 8

|  | "0" | "1" | "2" | "3" |
| --- | --- | --- | --- | --- |
| IOA (N3C) | L | H | L | H |
| IOB (N4C) | H | L | H | L |
| IOC (N5C) | L | L | H | H |
| IOD (N6C) | H | H | L | L |

The distribution of the threshold of each data of Table 8 is as follows:
data "0" . . . threshold: 0V or less
data "1" . . . threshold: 0.5V to 0.8V or less
data "2" . . . threshold: 1.5V to 1.8V or less
data "3" . . . threshold: 2.5V to 2.8V or less During the reading, the levels of the signals VRFYBAC and VRFYBBC are set to "H", and the levels of the signals VRFYBA1C and VRFYBB1C are set to "L." The voltage Vs is set to 0V.

The relationship among data stored in the memory cell, the threshold value, and data I/O lines IOA, IOB, IOC, and IOD in the level after reading is as shown in Table 8.

<Write Operation>

First of all, write data is loaded onto the flip-flops FF1 and FF2. Thereafter, data "1", "2", and "3" is written at substantially the same time.

Then, the verify read is performed to check whether data "1", "2", "3" is sufficiently written. If there is a memory cell in which data write is insufficiently performed, a rewrite is performed. A write operation completion detecting circuit detects that all memory cells are sufficiently written, so that the write operation is completed.

The following will explain the write operation and the verify read operation.

(1) Programming

Before the write operation, input data is converted by the data I/O buffer 4 so as to be input to the data circuit 3. The relationship among four-value data, data I/O lines IOA, IOB, IOC, and IOD is shown as the following Table 9.

TABLE 9

|  | "0" | "1" | "2" | "3" |
| --- | --- | --- | --- | --- |
| IOA (N3C) | H | H | L | L |
| IOB (N4C) | L | L | H | H |
| IOC (N5C) | H | L | H | L |
| IOD (N6C) | L | H | L | H |

It is assumed that the number of data circuits is 256 (page length is 256). The first input 256-bit write data is input to the flip-flop FF1 through IOA and IOB in a state that the column activation signal CENB1 is in an "H" level. Then, write data of 256 bits and the following, which is input from the external section, is input to the flip-flop FF2 through IOC and IOD in a state that the column activation signal CENB2 is in an "H" level.

As is understood from Tables 8 and 9, data, which is input to the flip-flop FF1 through IOA and IOB and written, is output to the flip-flop FF2 as read data in reading data. Thereafter, read data is output to the external section of the chip through IOC and IOD. In other words, data, in which write data is input from IOA, is controlled by the data I/O buffer to be output from IOD. Similarly, data, in which write data is input from IOB, is controlled by the data I/O buffer to be output from IOC.

Data, which is input to the flip-flop FF2 through IOC and IOD and is written, is output to the flip-flop FF1 as read data in reading data. Thereafter, read data is output to the external section of the chip through IOB and IOA. In other words, data, in which write data is input from IOC, is controlled by the data I/O buffer to be output from IOB. Similarly, data, in which write data is input from IOD, is controlled by the data I/O buffer to be output from IOA.

Figure 31:
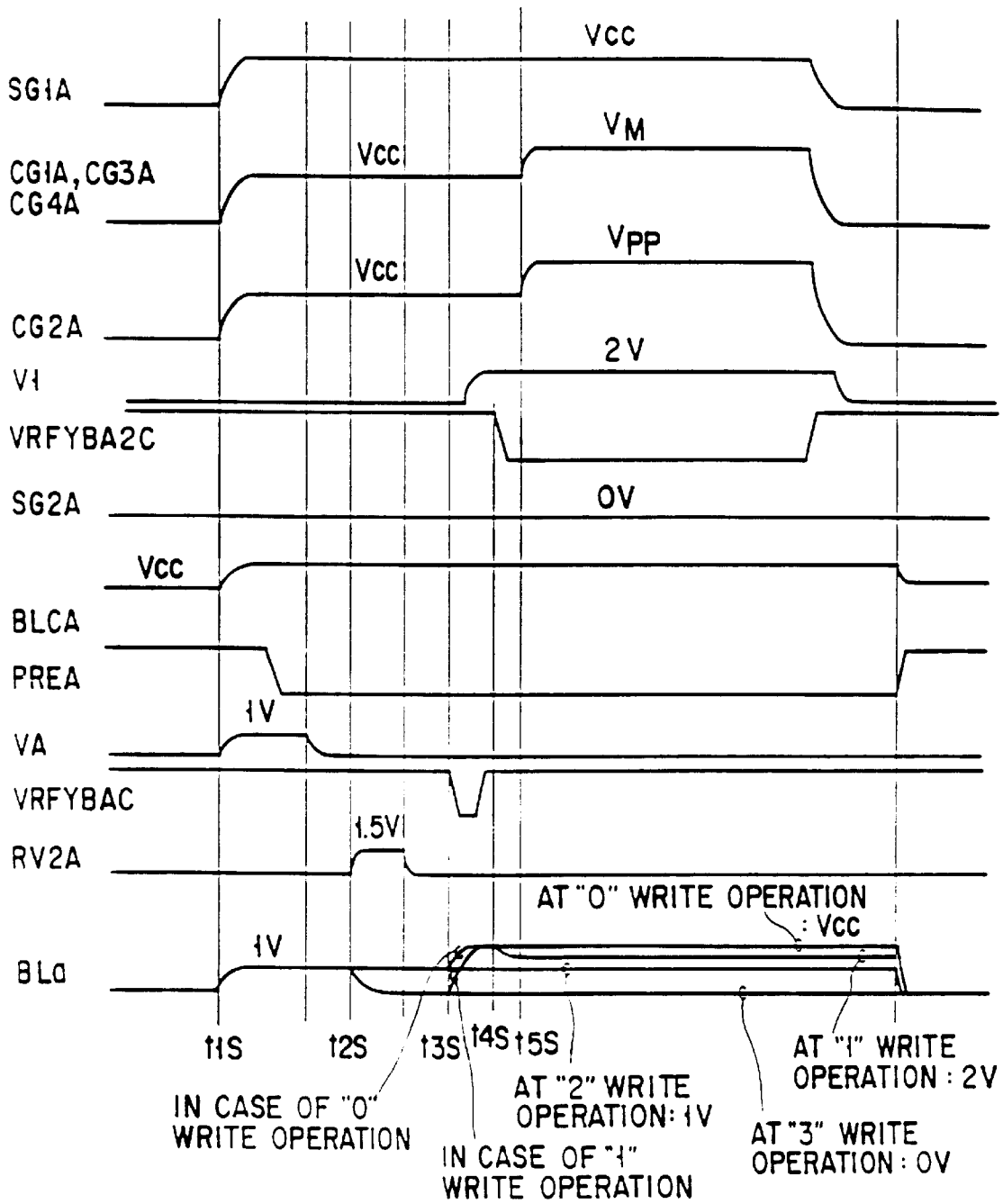
FIG. 31 is a timing chart explaining the writing of the eighth embodiment of the present invention.

The write operation is shown by FIG. 31.

At time t1s, the voltage VA is used as a bitline write control voltage of 1V, and the bitline BLa is set to 1V. In this case, if there occurs a problem of voltage drop corresponding to the threshold value of the n-channel MOS transistor Qn39, a signal BLCA may be boosted. Sequentially, the level of a signal PRE is set to "L", and the bitline is floated. At time t2s, a signal RV2A is set to 1.5V. As a result, the bitline control voltage of 0V is applied to the bitline from the data circuit in which data "1" or "3" is stored. It is assumed that the threshold value of the n-channel MOS transistor Qn32 is 1V. Qn32 is turned "OFF" when data "0" or "2" is written, and Qn32 is turned "ON" when data "1" or "3" is written. At time t3s, VRFYBAC is set to 0V, and a bitline write control voltage VCC is output to the bitline from the circuit in which data "0" or "1" is stored.

Then, VRFYBA2 is 0V at time t1s, and bitline "1" write potential 2V is output to the bitline from the data circuit in which data "1" is stored. As a result, the bitline in which "0" is written is set to VCC, the bitline in which "1" is written is set to 2V, the bitline in which "2" is written is set to 1V, and the bitline in which "3" is written is set to 0V.

At time t4s, the select gate SG1A of the selected block, and the control gates CG1A to CG4A are set to VCC by the control gate and select gate driving circuit 2. The select gate SG2A is 0V. Sequentially, the selected control gate CG2A is set to a high voltage VPP (e.g., 20V), non-select control gates CG1A, CG3A, CG4A are set to VM (e.g., 10V). In the memory cell corresponding to the data circuit in which data "3" is stored, by a potential difference between the channel potential of 0V and the VPP of the control gate, an electron is injected to the floating gate, and the threshold value is increased.

In the memory cell corresponding to the data circuit in which data "2" is stored, by a potential difference between the channel potential of 1V and the VPP of the control gate, an electron is injected to the floating gate, and the threshold value is increased. In the memory cell corresponding to the data circuit in which data "1" is stored, by a potential difference between the channel potential of 2V and the VPP of the control gate, an electron is injected to the floating gate, and she threshold value is increased. The reason why the channel potential is 1V in the case where "2" is written and the channel potential is 2V in the case where "1" is written is as follows.

The amount of electrons to be injected is reduced in order of the case in which data "3" is written, the case in which data "2" is written, and the case in which data "1" is written.

In the memory cell corresponding to the data circuit in which data "0" is stored, since the potential difference between the channel potential and VPP of the control gate is small, the electron is substantially not injected to the floating gate. As a result, the threshold value of the memory cell is unchanged. During the write operation, the levels of the signals SAN1, SAN2, PREB, and BLCB are set to "H", and the levels of the signals SAP1, SAP2, VRFYGA1C, RV1A, RV1 B, ECH1, ECH2 are set to "L", and the voltage BV is 0V.

(2) Verify Read

After the write operation, it is detected whether or not data is sufficiently performed (write verify).

If the memory cell reaches a predetermined threshold value, data of the data circuit is changed to "0." If the memory cell does not reach the predetermined threshold value, data of the data circuit is stored, and the write operation is performed again. The write and the write verify operations are repeated until all the memory cells, in which data "1" is written, "2" is written and data "3" is written, reach the predetermined threshold value.

In this case, as shown in FIG. 8, if the first data batch detective MOS transistor unit detects that all memory cells in which "1" is written are completed, "1" verify read is omitted in the following verify read. Similarly, if the second data batch detective MOS transistor unit detects that all memory cells in which "2" is written are completed, "2" verify read is omitted in the following verify read.

The write verify operation will be explained with reference to FIGS. 32 and 33.

(2-1) "1" Verify Read

First of all, it is detected whether or not the memory cell in which "1" is written reaches a predetermined value.

At time t1yc, the voltage VA and VB are set to 1.8V and 1.5V, respectively, and the bitline BLa and BLb are 1.8V and 1.5V, respectively. The levels of the signals BLCA and BLCB are set to "L", the bitline BLa and the MOS capacitor Qd1 is separated from each other. Also, the bitline BLb and the MOS capacitor Qd2 is separated from each other. The bitlines BLa and BLb are floated. The levels of the signals PREA and PREB are set "L", and the nodes N1 and N2, serving as gate electrodes of MOS capacitor Qd1 and Qd2, respectively, are floated.

Sequentially, the control gate CG2A of the block, which is selected by the control gate and select gate drive circuit 2, is set to 0.5V, the non-select control gates CG1A, CG3A, CG4A and select gates SG1A, SG2A are set to VCC. If the threshold value of the selected memory cell is below 0.5V, the bitline voltage is lower than 1.5V. If the threshold value of the selected memory cell is over 0.5V, the bitline voltage of 1.8V is maintained as it is.

At time t2yc, the levels of the signals BLCA and BLCB are set to "H," and the potential of the bitline is transferred to N1 and N2. Thereafter, the levels of the signals BLCA and BLCB are set to "L", and the bitline BLa and the MOS capacitor Qd1 are separated from each other. Also, the bitline BLb and the MOS capacitor Qd2 are separated from each other. Thereafter, at time t3yc, RV1 A is set to 1.5V. Then, in a case of write "2" and a case of write "3", node N1 is discharged to 0V. At time t4yc, if the level of the signal VRFYBA1C is set to "H", the n-channel MOS transistor Qn2 is turned "ON" and node N1 is set to VCC in the data circuit in which write data "0" or "2" is stored. As a result, in a case of write "0" and a case of write "1", node N1 is set to VCC. In a case of write "3", node N1 is set to 0V.

The levels of signals SAN2 and SAP2 are set to "L", and "H", respectively, so that the flip-flop FF2 is non-activated, and the level of the signal ECH2 is set to "H" so as to be equalized. Thereafter, the levels of signals RV2A and RV2B are set to "H." Then, the levels of the signals SAN2 and SAN2 are set to "H", and "L", respectively, again. As a result, at time t5yc, the voltage of node N1 is latched. Then, only the data circuit, which stores write data "1", detects whether or not data of the corresponding memory cell in which "1" is written is sufficiently written.

If data of the memory cell is "1", the voltage of the node N1 is sensed and latched by the flip-flop FF2, so that write data is changed to "0." If data of the memory cell is not "1", the voltage of the node N1 is sensed and latched by the flip-flop FF2, so that write data "1" is stored. Write data of the data circuit in which "0", "2", or "3" is written is not changed.

The write operation completion of the memory cell in which "1" is written is detected by the first data batch detective MOS transistor unit of FIG. 29. After "1" verify read, RNDB1 is precharged to VCC. In the data circuit in which data "0", "2", or "3" is latched, at least one of N3C and N3C is set to the "L" level (Table 9). Due to this, at least one of the n-channel MOS transistors Qn7C and Qn8C is turned off, and RNDB1 is not discharged from the precharge potential.

It is assumed that there is one memory cell In which "1" is insufficiently written. Since both nodes N3C and N6C of the data circuit are set to the "H" level (table 9), transistors Qn7C and Qn8C are turned on, and RNDB1 is reduced from the precharge potential.

If all memory cells in which "1" is written are sufficiently written, the node N6C is set to the "L" level. At least one of nodes N3C and N6C of the first data batch detective MOS transistor unit, which is provided in each of data circuits 10-0, 10-1, . . . , 10-m-1, 10-m, is turned off. As a result, RNDB1 maintains the precharge potential, and the completion of write data "1" is detected. If write of data "1" is all completed, "1" verify read is omitted at the following verify read.

(2-2) "2" Verify Read

Similar to the case of "1" verify read, after precharging the bitline and the dummy bitline, the selected control gate CG2A is set to 1.5V. If the threshold value of the selected memory cell is below 1.5V, the bitline voltage is lower than 1.5V. If the threshold value of the selected memory cell is over 1.5V, the bitline voltage of 1.8V is maintained as it is.

At time t6yc, the levels of the signals BLCA and BLCB are set to "H," and the potential of the bitline is transferred to N1 and N2. Thereafter, the levels of the signals BLCA and BLCB are set to "L", and the bitline BL*a* and the MOS capacitor Qd1 are separated from each other. Also, the bitline BL*b* and the MOS capacitor Qd2 are separated from each other. Thereafter, at time t7yc, RV2A is set to 1.5V, which is below VCC.

In a case where the threshold value of the n-channel MOS transistor Qn32 is 1V, the transistor Qn32 is turned "ON" and the node N1 is 0V in the data circuit in which data "3" is written. In the data circuit in which data "2" is written, if the memory cell in which "2" is written is sufficiently written, the transistor Qn32 is turned "OFF", and node N1 is set to 1.5V or more. If the memory cell in which "2" is written is insufficiently written, the node N1 is below 1.5V. At time t8yc, if the level of the signal VRFYBAC Is set to "L", the p-channel MOS transistor Qp13 is turned "ON" and the node N1 is VCC in the data circuit in which data "0" or "1" is written.

The levels of signals SAN1 and SAP1 are set to "L", and "H", respectively, so that the flip-flop FF1 is non-activated, and the level of the signal ECH1 is set to "H" so as to be equalized. Thereafter, the levels of signals RV1 A and RV1 B are set to "H." Then, the levels of the signals SAN1 and SAN1 are set to "H", and "L", respectively, again. As a result, at time t9yc, the voltage of node N1 is latched. Then, only the data circuit, which stores write data "2", detects whether or not data of the corresponding memory cell in which "2" is written is sufficiently written.

If data of the memory cell is "2", the voltage of the node N1 is sensed and latched by the flip-flop FF1, so that write data is changed to "0." If data of the memory cell is not "2", the voltage of the node N1 is sensed and latched by the flip-flop FF1, so that write data "2" is stored. Write data of the data circuit in which "0", "1", or "3" is written is not changed.

The write operation completion of the memory cell in which "2" is written is detected by the second data batch detective MOS transistor unit of FIG. 29. After "2" verify read, RNDB2 is precharged to VCC. In the data circuit in which data "0", "1", or "3" is latched, at least one of N4C and N5C is set to the "L" level (Table 9). Due to this, at least one of the n-channel MOS transistors Qn9C and Qn10C is turned off, and RNDB2 is not discharged from the precharge potential.

It is assumed that there is one memory cell in which "2" is insufficiently written. Since both nodes N4C and N5C of the data circuit are set to the "H" level (Table 9), transistors Qn9C and Qn10 are turner on, and RNDB2 is reduced from the precharge potential.

If all memory cells in which "2" is written are sufficiently written, the node N4C is set to the "L" level. At least one of nodes N4C and N5C of the second data batch detective MOS transistor unit, Which is provided in each of data circuits 10-0, 10-1, . . . , 10-m-1, 10-m, is turned off. As a result, RNDB2 maintains the precharge potential, and the completion of write data "2" is detected. If write of data "2" is all completed, "2" verify read is omitted at the following verify read.

(2-3) "3" Verify Read

After precharging the bitline and the dummy bitline at time t10yc, the selected control gate CG2A is set to 2.5V. If the threshold value of the selected memory cell is below 2.5V, the bitline voltage is lower than 1.5V. If the threshold value of the selected memory cell is over 2.5V, the bitline voltage of 1.8V is maintained as it is.

At time t11yc, the levels of the signals BLCA and BLCB are set to "H," and the potential of the bitline is transferred to N1 and N2. The levels of the signals BLCA and BLCB are set to "L" again, so that the bitline BL*a* and the MOS capacitor Qd1 are separated from each other. Also, the bitline BL*b* and the MOS capacitor Qd2 are separated from each other. At time t12yc, if the level of the signal YRFYBA is set to "L", the p-channel MOS transistor Qp13 is turned "ON" and the node N1 is VCC in the data circuit in which "0" or "1" is stored or the data circuit in which "2" is sufficiently written. The levels of signals SAN1 and SAP1 are set to "L", and "H", respectively, so that the flip-flop FF1 is non-activated, and the level of the signal ECH1 is set to "H" so as to be equalized.

Thereafter, the levels of the signals RV1 A and RV1B are set to "H." At time t13yc, the levels of the signals SAN1 and SAP1 are set to "H" and "L", respectively, so that the voltage of node N1 is sensed and latched.

Figure 33:
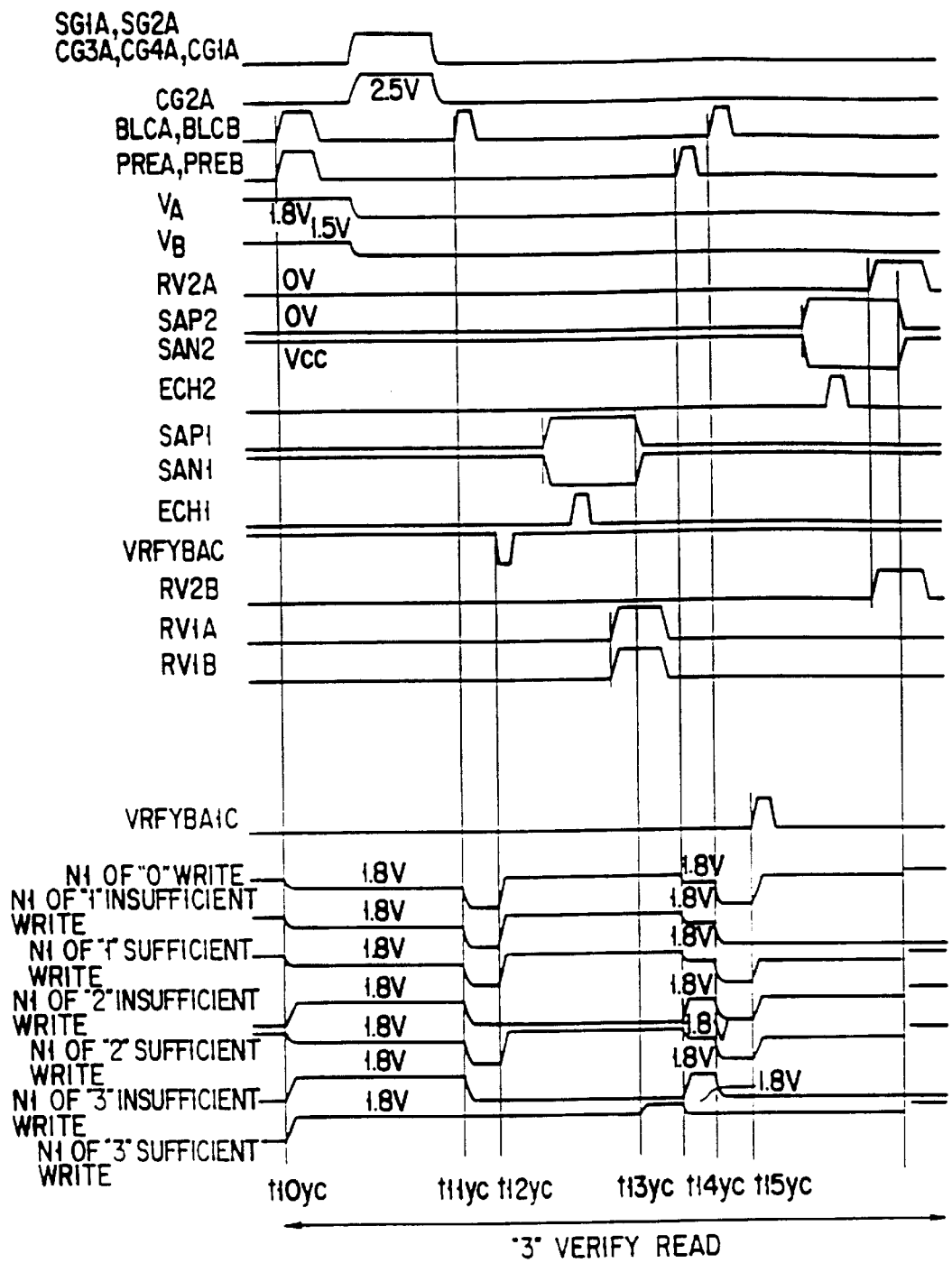
FIG. 33 is a timing chart explaining the write verify operation of the eighth embodiment of the present invention.

Thereafter, as shown in FIG. 33, the conversion of write data is further performed. At time t14yc, the levels of the signals BLCA and BLCB are set to "H," and the potential of the bitline is transferred to N1 and N2. The levels of the signals BLCA and BLCB are set to "L" again, so that the bitline BL*a* and the MOS capacitor Qd1 are separated from each other. Also, the bitline BL*b* and the MOS capacitor Qd2 are separated from each other.

Thereafter, at time t15yc, if the level of the signal VRFYBA1C is set to "H", the n-channel MOS transistor Qn2C is turned "ON" and the node N1 is VCC in the data circuit in which "0" or "2" is stored or the data circuit in which "1" is sufficiently written. The levels of signals SAN2 and SAP2 are set to "L", and "H", respectively, so that the flip-flop FF2 is non-activated, and the level of the signal ECH2 is set to "H" so as to be equalized.

Thereafter, the levels of the signals RV2A and RV2B are set to "H." At time t17yc, the levels of the signals SAN2 and SAP2 are set to "H" and "L", respectively, so that the voltage of node N1 is sensed and latched.

Thus, only the data circuit in which "3" write data is stored can detect whether or not data "3" of the corresponding memory cell is sufficiently written. If data of the memory cell is "3", the voltage of the node N1 is sensed and latched by the flip-flops FF1 and FF2. Thereby, write data is changed to "0." If data of the memory cell is not "3", the voltage of the node N1 is sensed and latched by the flip-flops FF1 and FF2, so that write data "3" is stored. Write data of the data circuit in which "0", "1", or "2" is stored is not changed.

During the write verify, the level of the signal VRFYBBC is set to "H", the level of the signal VRFYBB1C is set to "L", and the voltage Vs is set to 0V.

If all selected memory cells reach a predetermined threshold value, data of the data circuit becomes "0." Specifically, if the write operation is completed, the nodes N4C and N6C are set to the "L." By detecting the completion of the write operation, it is understood whether or not all selected memory cells reach a predetermined threshold value. In detecting the completion of the write operation, the write operation completion catch detective transistors Qn5c and Qn6c may be used as shown in FIG. 29. After the verify read, VRTC is precharged to VCC.

If there is one memory cell in which data write operation is insufficiently performed, at least one of the n-channel MOS transistors Qn5C and Qn6C is turned on since at least one of the nodes N4C and N6C of the data circuit is in the "H" level. Then, VRTC is reduced from the precharge potential. If all memory cells are sufficiently written, the nodes N4C and N6C of the data circuits 10-0, 10-1, ..., 10-m-1, 10-m are set to the "L." As a result, since the n-channel MOS transistors Qn5C and Qn6C of the all data circuits are turned off, VRTC maintains the precharge potential.

Ninth Embodiment

Figure 34:
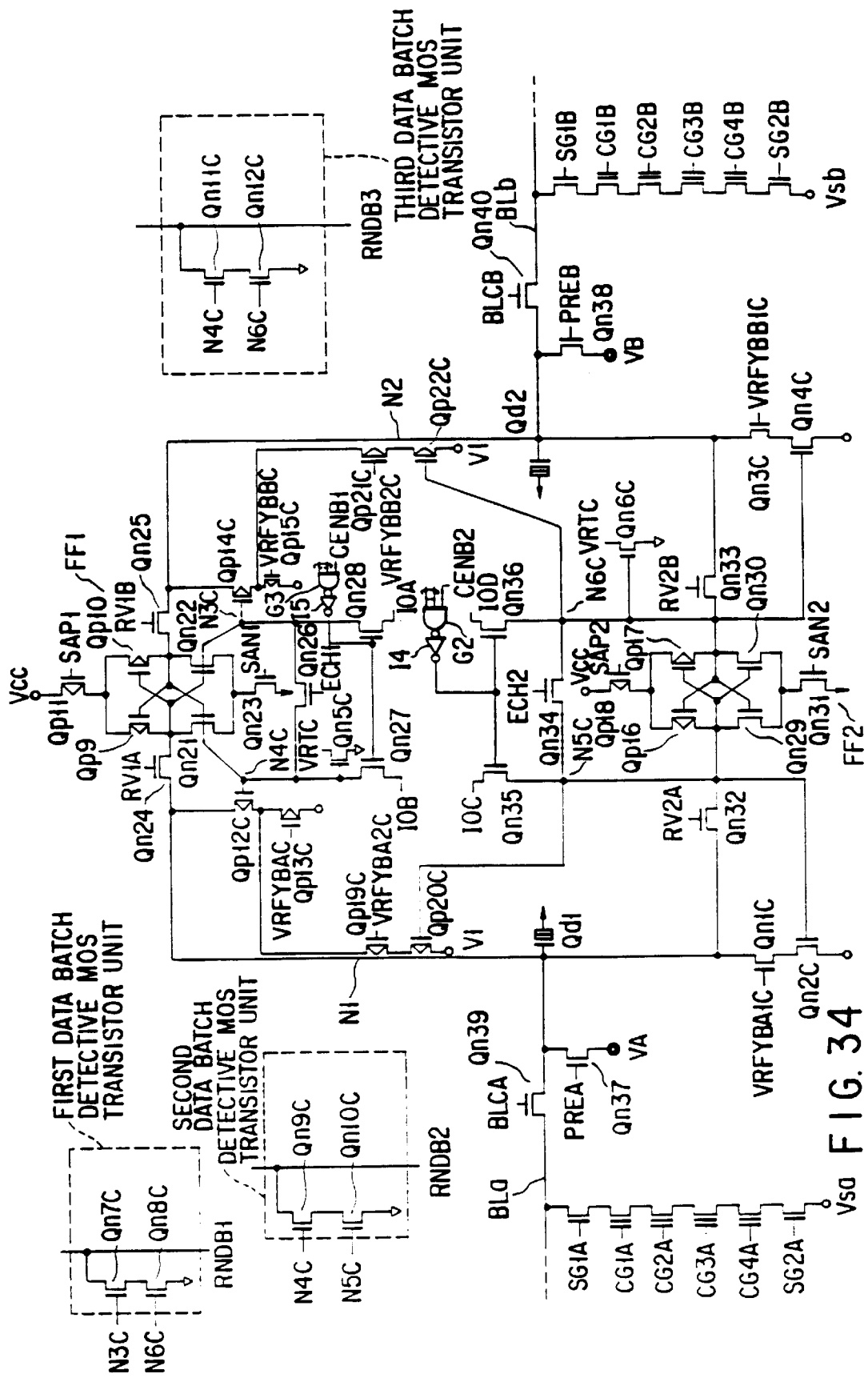
FIG. 34 is a circuit diagram showing a specific example of the data circuit of a ninth embodiment of the present invention.

As shown in FIG. 34, the write operation completion of the memory cell in which "3" is written may be detected. In this case, the write operation completion of the memory cell is detected by the third data batch detective MOS transistor unit of FIG. 34. After "3" verify read, RNDB3 is precharged to VCC. In the data circuit in which data "0", "1", or "2" is latched, since at least one of N4C and N6C is set to "L" (Table 9), at least one of the n-channel MOS transistors Qn11C and Qn12C is turned off, and RNDB3 is not discharged from the precharge potential.

It is assumed that there is one memory cell in which "3" is insufficiently written. Since both nodes N4C and N6C of the data circuit are set to the "H" level (Table 9), transistors Qn11C and Qn12C are turned on, and RNDB3 is reduced from the precharge potential. If all memory cells in which "3" is written are sufficiently written, the node N4C is set to the "L" level. At least one of nodes N4C and N6C of the third data batch detective MOS transistor unit, which is provided in each of data circuits 10-0, 10-1, ..., 10-m-1, 10-m, is turned off. As a result, RNDB3 maintains the precharge potential, and the completion of write data "3" is detected.

In a case where the write operation of data "3" is completed prior to the writing of data "1" or "2", the third data batch detective MOS transistor unit may be provided, so that the completion of the writing of "3" can be detected.

If all write of "3" is completed, "3" verify read is omitted at the following verify read.

Tenth Embodiment

The write steps and verify read steps are not limited to the case of FIG. 8. For example, in a case where the writing of data "2" is completed prior to the writing of data "1", the second data batch detective MOS transistor unit of FIG. 29 and 34 detects the completion of the writing of "2." As a result, at the following verify read, "2" verify read is omitted, and "1" and "3" write operation and "1" verify read operation and "3" verify read operation may be performed.

Thus, according to this embodiment, the completion of the writing of a predetermined write level can be detected by the circuit for detecting the data write operation completion of a predetermined level. After the completion of the writing of the predetermined write level, the verify read of the write level is omitted, so that the entire write speed can be improved. In this case, the write level for detecting the write operation completion can be arbitrarily set, and the operation timing can be also arbitrarily set.

For example, in the embodiment of FIG. 8, the verify read is performed in order of "3" verify read, "2" verify read, and "1" verify read. However, the verify read may be performed in order of "1" verify read, "2" verify read, and "3" verify read. Or, the verify, read may be performed in order of "2" verify read, "3" verify read, and "1" verify read.

Eleventh Embodiment

The following embodiments (eleventh to thirteenth embodiments) will explain EEPROMs having high speed operation and a high density, which can be applied to EEPROMS other than the above-mentioned multi-value storable nonvolatile semiconductor memory devices (EEPROM).

In the eleventh embodiment, the memory cell units, each having memory cells or memory cells and select transistors, are arranged as shown in FIG. 35 to form a sub-array.

Specifically, one end of each of the memory units is connected to a common signal line in a state that four memory cell units share a contact. Also, the other end of each of the memory units is connected to the common signal line in a state that four memory cell units share a contact.

More specifically, one end of an arbitrary memory cell unit (e.g., unit 3, the third unit seen from the top of FIG. 35) is connected to a first common signal line (common signal line 1). In this case, four memory cell units 1 to 4 (first to fourth units seen from the top of FIG. 35) share a contact. The other end of the memory cell unit 3 (third unit seen from the top) is connected to a second common signal line (common signal line 2). In this case, two memory cell units (fifth and sixth units seen from the top of FIG. 35) share a word line and contact each other, and do not come in contact with one end of the above memory cell unit 3. Also, two memory cell units (third and fourth units seen from the top of FIG. 35) share a word line and contact each other, and come in contact with one end of the above memory cell unit 3.

In other words, two memory cell units are connected in parallel, so that a plurality of parallel connected units is formed. Then, one end of an arbitrary memory cell unit is connected to the first common signal line in a state that two parallel connected units, which share the word line, come in contact with each other. The other end of the arbitrary memory cell unit is connected to the second signal line in a state that two parallel connected units, which share the word line and have no contact at one end, come in contact each other.

Figure 36:
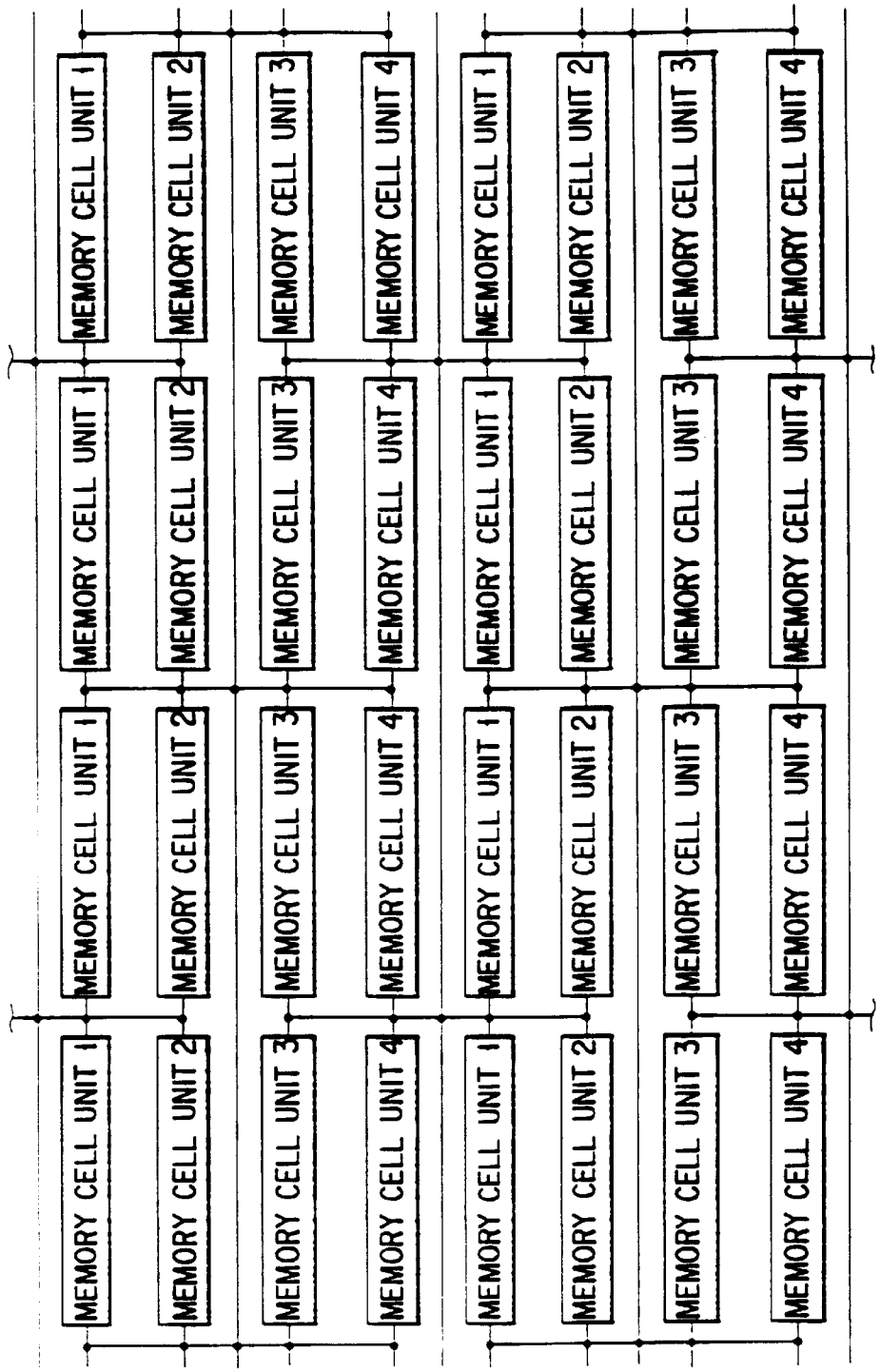
FIG. 36 is a block diagram showing the structure of a memory cell array of the eleventh embodiment of the present invention.

Thus, the sub-arrays are continuously formed, so that the memory cell arrays are structured as shown in FIG. 36.

As shown in FIGS. 37 and 38, each memory cell unit comprises a memory cell section having memory cells, and select transistors. Memory cell units A, B, C, and D of FIGS. 37 and 38 correspond to any of the memory cell units 1, 2, 3, and 4 of FIGS. 35 and 36. Specifically, there are 24 combinations, for example, A:1, B:2, C:3, D:4, or A:4, B:3, C:1, D:2. In FIG. 38, a threshold value Vt1 of an E-type select gate may be larger than a threshold value Vt2 of an I type select gate, for example, Vt1=2V and Vt2=0.5V. In FIG. 37, the threshold value Vt1 of the E-type select gate and a threshold value of a D-type select gate may be, for example, 0.7V and −2V, respectively.

For selecting the memory cell of FIG. 37, there are two types of voltages to be applied to select gates SG1, SG2, SG3 of the select block. One is a voltage Vsgh (e.g., Vcc=3V) by which E and D-type select gates are turned on, and the other is a voltage Vsgl (e.g., 0V) by which the D-type select gate is turned on but the E-type select gate is turned off. Among four memory cell units, for selecting the memory cell unit A, the voltage to be applied to SG2, SG3, SG4 is set to Vsgh, and the voltage to be applied to SG1 is set to Vsg1. For selecting the memory cell unit B, the voltage to be applied to SG2 is set to Vsg1, and the voltage to be applied to SG1, SG3, SG4 is set to Vsgh. Similarly, for selecting the memory cell unit C, the voltage to be applied to SG1, SG2, SG4 is set to Vsgh, and the voltage applied to SG3 is set to Vsg1. For selecting the memory cell unit D, the voltage to be applied to, SG1, SG2, SG3 is set to Vsgh, and the voltage to be applied to SG4 is set to Vsg1.

If 0V is applied to the select gate of the non-select block, a bitline voltage is not leaked through the non-select block.

In the memory cell units shown in FIG. 38, the method for selecting the memory cell unit is substantially the same as the case of FIG. 37. However, for example, if the threshold value of the E-type select gate is 2V and that of the I type select gate is 0.5V, Vsgl to be applied in the select block may be 1.5V. As a result, the E-type select gate is turned on, and the I type select gate is turned on.

There are variations of the structure of the memory cell section. One example is shown by FIGS. 39A to 39D. FIG. 39A shows a NOR cell type EEPROM, FIG. 39B shows an AND cell type EEPROM (H. Kume et al.: IEDM Tech. Dig., December. 1992, pp. 991–993). FIG. 39C shows an NAND cell type. The structure shown in FIG. 39D may be used. The present invention is not limited to the EEPROM. The present invention is useful to the so-called EPROM or a mask ROM.

Twelfth Embodiment

The following will specifically explain the present invention, for example, an NAND cell type EEPROM.

Figure 40:
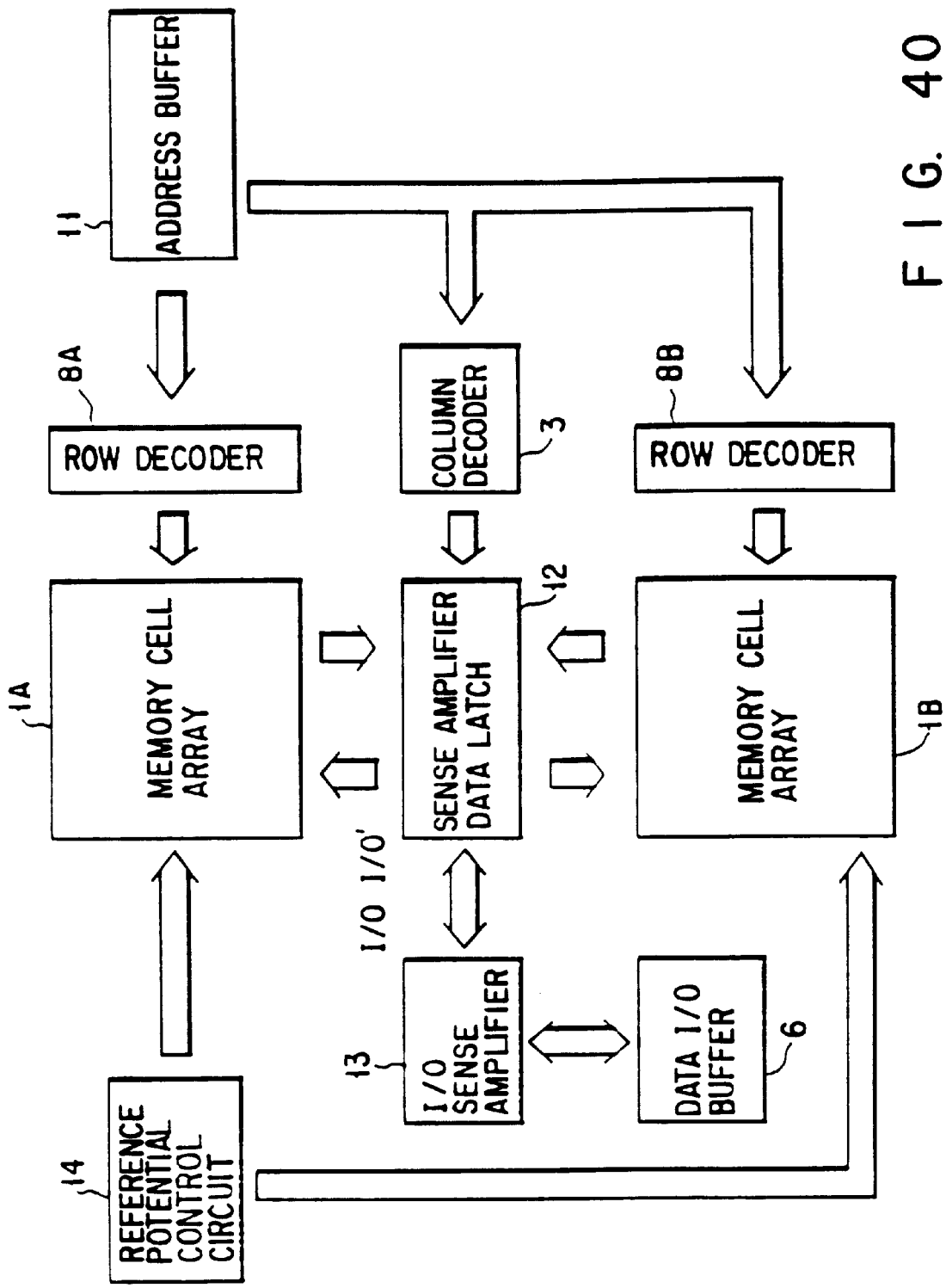
FIG. 40 is a block diagram showing the structure of an NAND type EEPROM of a twelfth embodiment of the present invention.

FIG. 40 is a block diagram showing the basic structure of the NAND cell type EEPROM as the twelfth embodiment of the present invention. In FIG. 40, the same reference numerals are added to the same portions common to the portions of FIGS. 9 and 24. Since the memory cell array 1 is an open bitline system, the memory cell array 1 is divided to memory cell arrays 1A and 1B. A sense amplifier 12 serves as latching means to write and read data. A row decoder 9 selects a word line. A column decoder 3 selects a bitline. In addition, the NAND cell type EEPROM comprises an address buffer 11, an I/O sense amplifier 13, a data I/O buffer 6, and a substrate potential control circuit 14.

Figure 2A:
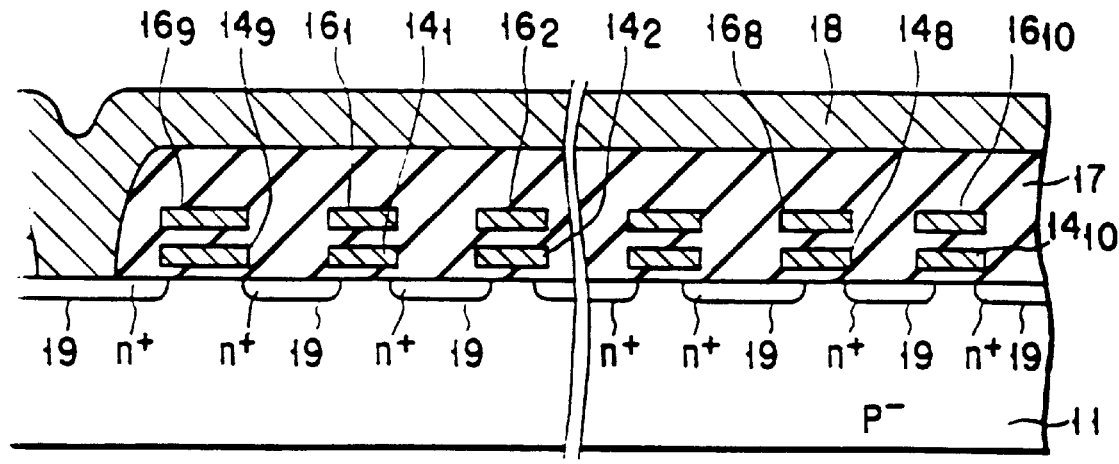
FIGS. 2A and 2B are cross-sectional views each being taken along line of 2A—2A of FIG. 1A and 2B—2B of FIG. 1A.
Figure 2B:
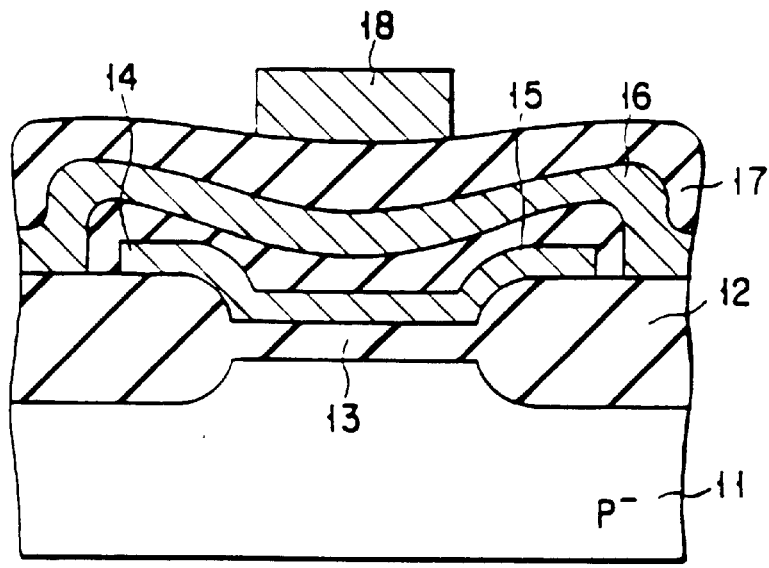
Figure 3:
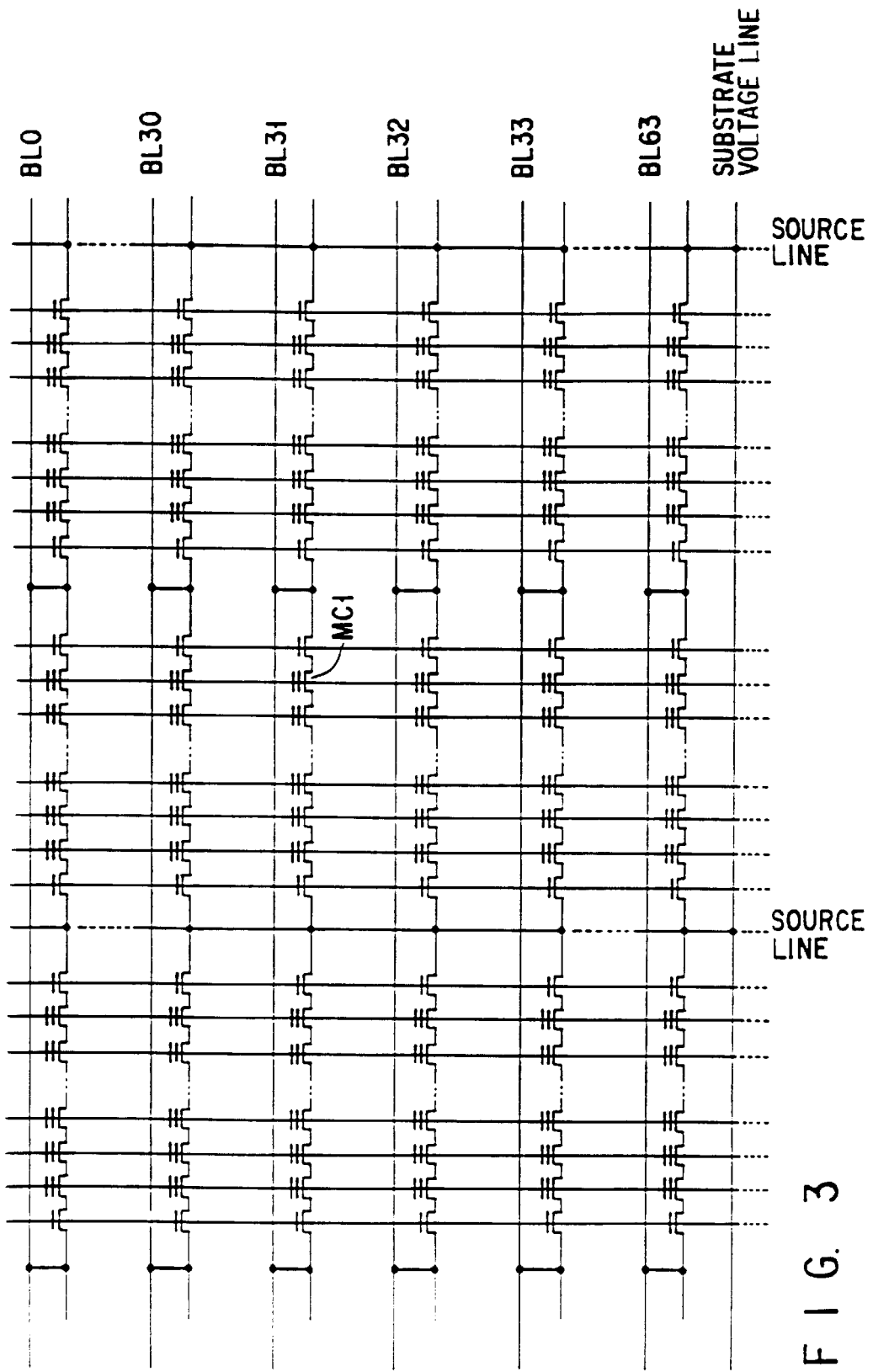
FIG. 3 is an equivalent circuit diagram of a memory cell array of the conventional NAND type EEPROM.
Figure 41:
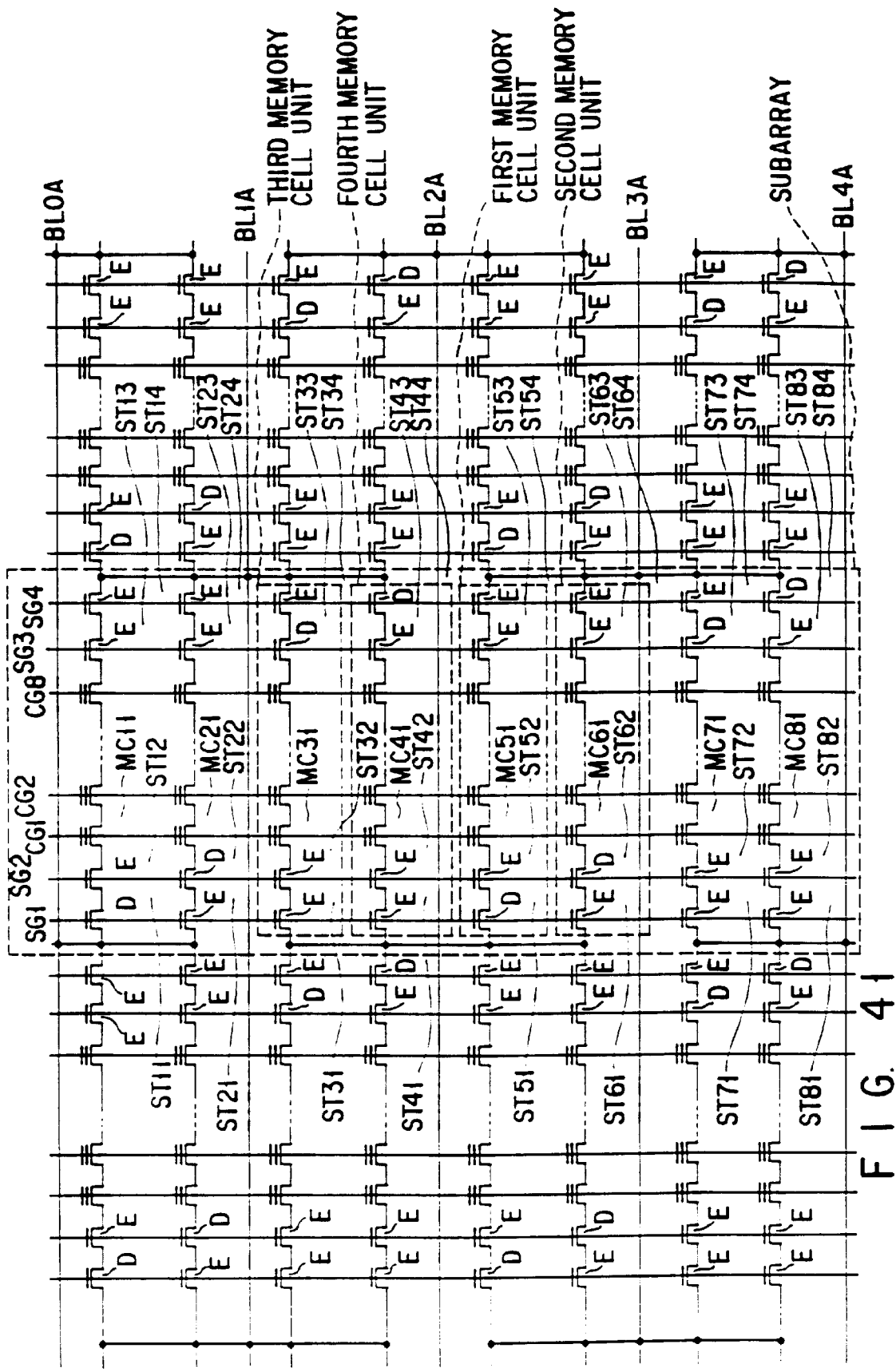
FIG. 41 is a circuit diagram showing the memory cell array of the twelfth embodiment of the present invention.
Figure 42:
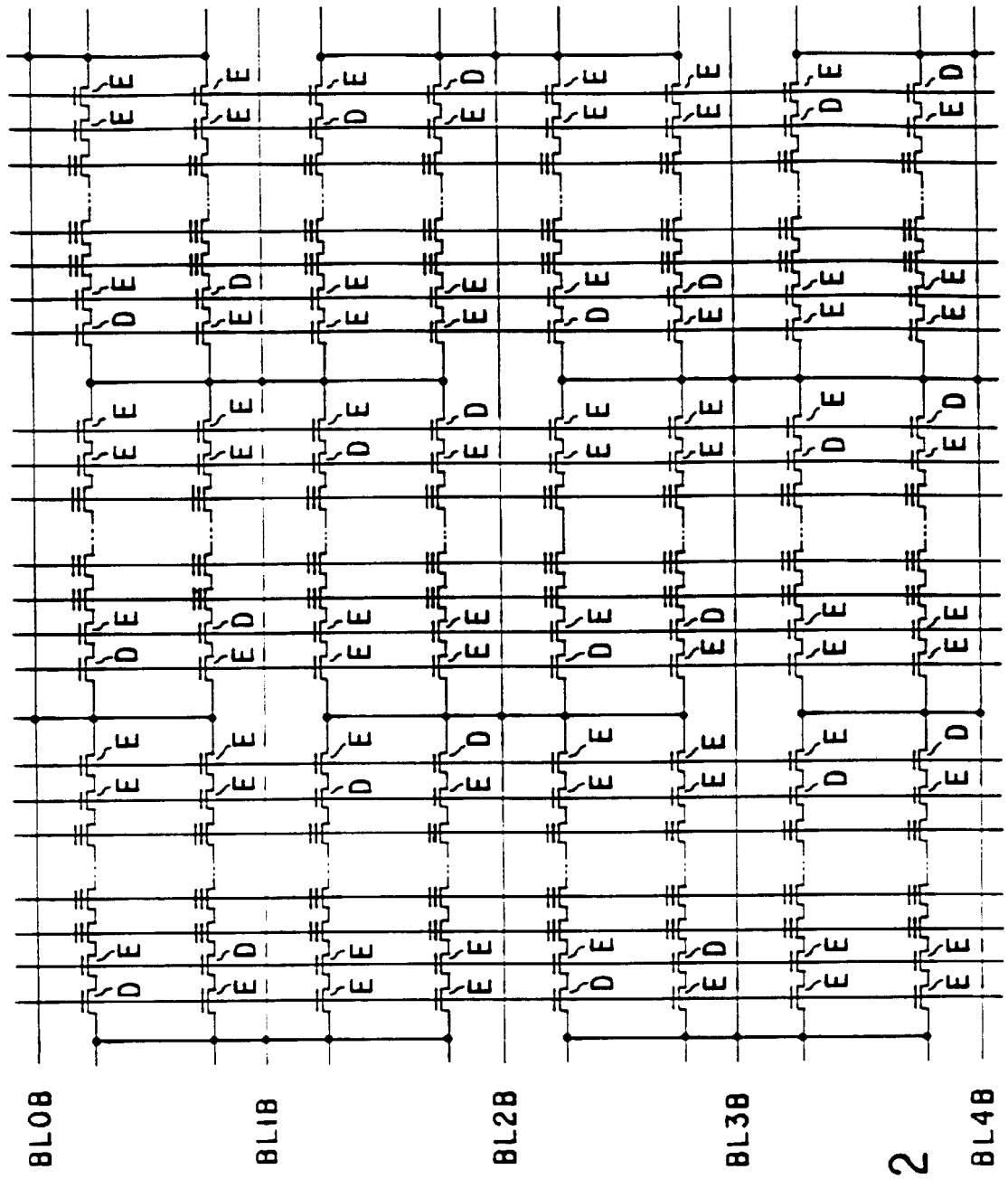
FIG. 42 is a circuit diagram showing the memory cell array of the twelfth embodiment of the present invention.

FIG. 41 shows the structure of the memory cell array 1A, and FIG. 42 shows the structure of the memory cell array 1B. Unlike the conventional memory cell array (FIG. 3), in the memory cell array (FIGS. 41, 42) of this embodiment, the select gate of the source line side is not connected to the source line of the n-type diffusion layer. In this embodiment, the select gates of both ends of the source line side are brought into contact with the bitline. As a result, since the bitline having a low resistance serves as a source line at a read time, the reading speed can be improved. Since two bitlines are shared per four memory cell columns, the pitch of the bitline is twice as large as the conventional case, so that the bitline can be easily processed.

In the memory cell array of this embodiment, there are provided two threshold voltages of two select MOS transistors for connecting one NAND cell column to the bitline, Vth1 and Vth2 (Vth1>Vth2). It is assumed that the select MOS transistor having higher threshold voltage Vth1 (e.g., 0.8V) is an E-type transistor and that the select MOS transistor having lower threshold voltage Vth1 (e.g., −2V) is a D-type transistor. Regarding the voltages to be applied to the select gates, there are a voltage Vsgh (e.g., 3V) by which both D-type and E-type transistors are turned on (Vsgh>Vt1, Vt2) and a voltage Vsgl (e.g., 0V) by which the D-type transistor is turned on but the E-type transistor is turned off (Vt1>Vsg1>Vt2).

Thus, there are provided two kinds of threshold voltages of the select MOS transistor and two kinds of voltages to be applied to the select gates. As a result, in writing and reading data, both ends of one of four NAND cell units sharing a contact can be conductive to two bitlines, and the other memory cell units can be non-conductive.

The following will specifically explain the reading and writing systems.

<Read>

For reading data of memory cell MC31, MC71, . . . , the memory cell unit (3) to the bitlines BL1A, BL3A, . . . , the bitlines BL1A, BL3A, . . . , are precharged to a bitline read potential VA (e.g., 1.8V), and BL2A, BL4A, . . . , are grounded to 0V. After precharge, the bitlines BL1A, BL3A, . . . , are floated.

The control gate CG1 is set to 0V, and CG2 to CG8 are set to Vcc (e.g., 3V). The select gate SG3 is set to Vsg1, and the select gates SG1, SG2, and SG4 are set to Vsgh. The other select gates and control gates are set to 0V. In this case, select MOS transistors ST11, ST12, ST22, ST23, ST31, ST32, ST41, ST42, ST51, ST542, ST61, ST71, ST72, . . . , connected to the bitlines BL0A, BL2A, BL4A, . . . , are turned on. Also, select MOS transistors ST14, ST24, ST34, ST44, ST54, ST64, ST74, ST84, . . . , connected to the bitlines BL1A, BL3A, BL5A, . . . , are turned on. The D-type select MOS transistors ST33, ST73, . . . , connected to the bitlines BL1A, BL3A, BL5A, . . . , are turned on. However, the E-type select MOS transistors ST13, ST23, ST43, ST53, ST653, ST83, ST93, ST103, . . . , are turned off.

As a result, data written to the memory cells MC31, MC71, . . . , is "1", the precharged bitlines BL1A, BL3A, . . . , are discharged to the grounded bitlines BL2A, BL4A, . . . , so as to be reduced from the precharge potential. Thereby, data of the memory cells MC31, MC71, . . . , of the memory cell unit (3) is read to the bitlines BL1A, BL3A, . . . . If data written to the memory cell is "0", the bitlines BL1A, BL3A, . . . , are not discharged, and the precharge potential is maintained.

The E-type select MOS transistors ST13, ST23, ST43, ST53, ST53, ST63, ST83, ST93, . . . , connected to the bitlines BL1A, BL3A, BL5A, . . . , are turned off. As a result, data of the memory cells MC1, MC21, MC41, MC51, MC61, MC81, MC91, ..., of the memory cell units (1), (2), and (4) is not read to the bitlines BL1A, BL3A, BL5A.

For reading data of the memory cells MC11, MC51, MC91, ..., of the memory cell unit (1) to the bitlines BL0A, BL2A, BL4A, BL6A, ..., the select gates SG2, SG3, SG4 may be set to Vsgh and SG1 may be set to Vsg1. For reading data of the memory cells MC21, MC61, MC101, ..., of the memory cell unit (2) to the bitlines BL0A, BL2A, BL4A, ..., the select gates SG1, SG3, SG4 may be set to Vsgh and SG2 may be set to Vsg1. For reading data of the memory cells MC41, MC81, ..., of the memory cell unit (4) to the bitlines BL1A, BL3A, ..., the select gates SG1, SG2, SG3 may be set to Vsgh and SG4 may be set to Vsg1.

According to this embodiment, a half number of the bitlines is grounded to be used as the function, which is the same as the conventional source line, without using the source line (n-type diffusion layer) of the conventional memory cell array. Then, data of the memory cell is read to the other half of the bitlines. The bitline, which is formed of polysilicon, Al having low resistance, is used in place of the conventional source line, which is formed of n-type diffusion layer having resistance. As a result, the reduction of the reading speed, which is caused by the float of the source line, can be prevented.

Figure 43:
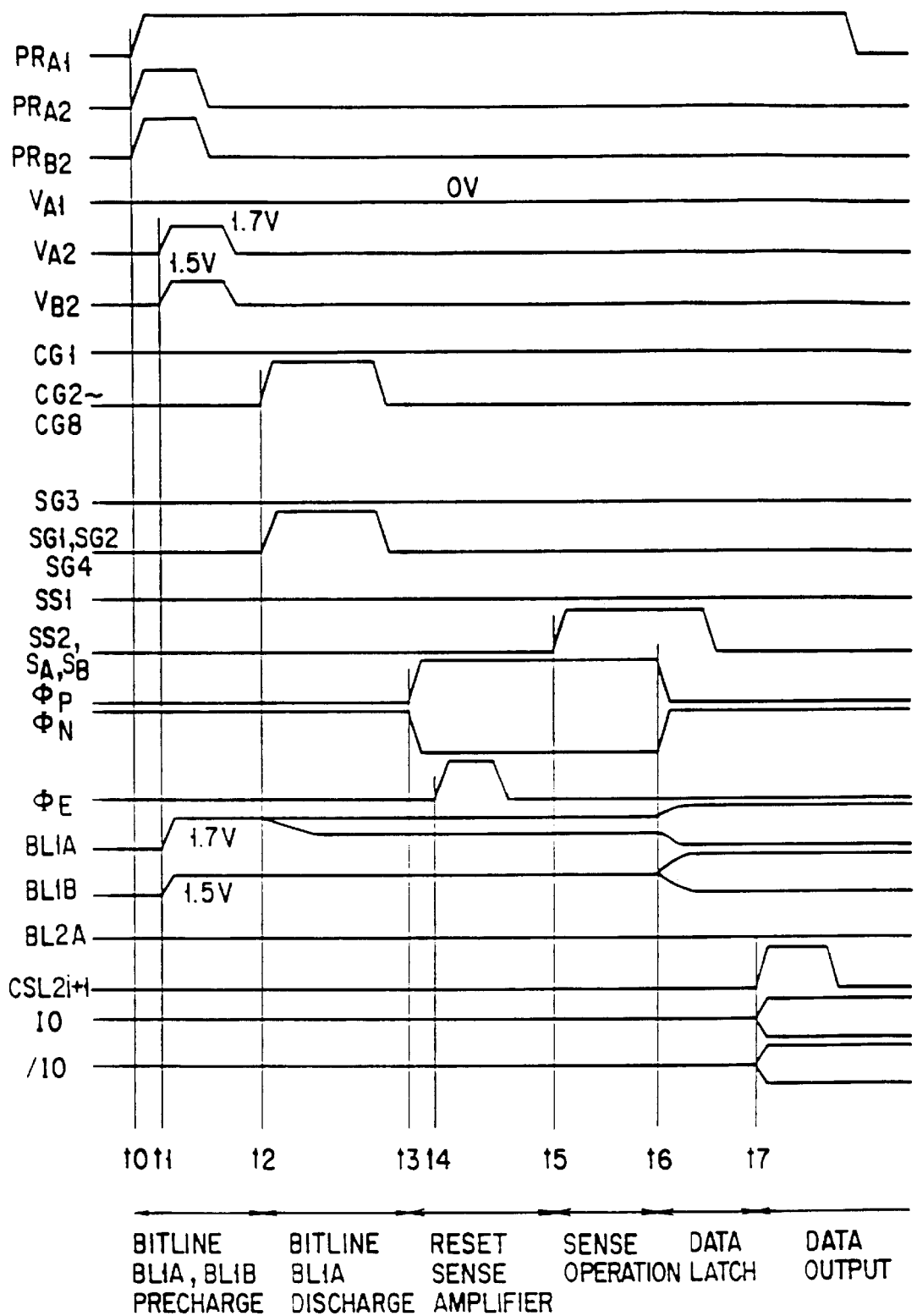
FIG. 43 is a timing chart explaining a data read operation of the twelfth embodiment of the present invention.

The following will specifically explain the reading operation with reference to FIG. 43.

FIG. 43 is a timing chart showing a case of reading data written to the memory cells MC31, MC71, ..., of the memory cell unit (1) of FIG. 41.

Figure 44:
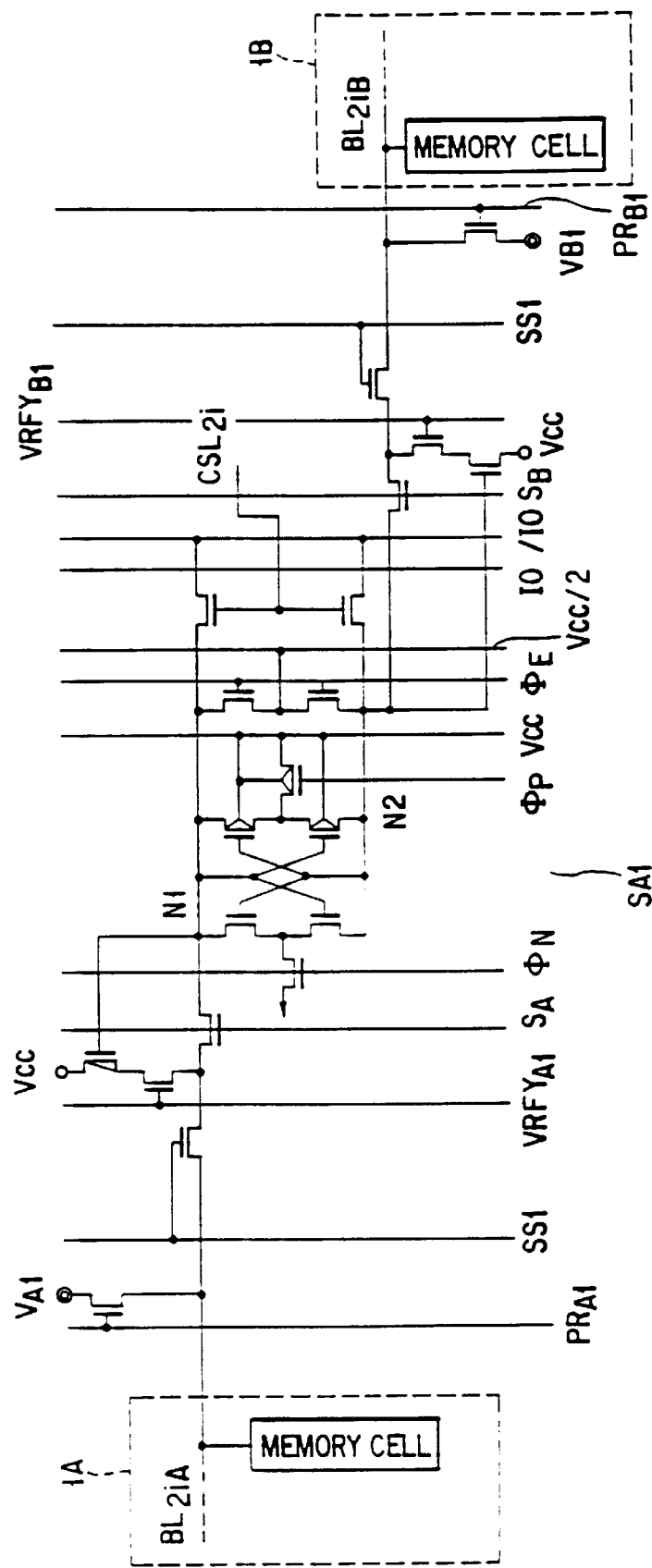
FIG. 44 is a circuit diagram showing the bitline control circuit of the twelfth embodiment of the present invention.

The bitlines BL0A, BL2A, BL4A, BL6A, ..., are connected to the sense amplifier SA1 of FIG. 44. The bitlines BL1A, BL3A, BL5A, ..., are connected to the sense amplifier SA2 of FIG. 45. The sense amplifier comprises a CMOS flip-flop, which is controlled by control signals φP and φN.

First of all, precharge signals PRA1, PRA2, PRB2 are changed to Vcc from Vss (time t0). Then, bitlines BL1A, BL3A, BL5A, ..., are precharged to VA2 (e.g., 1.7V), and (dummy) bitlines BL1B, BL3B, BL5B, ..., are precharged to VB2 (e.g., 1.5V) (time t1). VA1 is 0V, and the bitlines BL0A, BL2A, BL4A, BL6A, ..., are grounded.

After precharging, PRA2 and PRB2 are set to Vss, and the bitlines BL1A, BL3A, BL5A, ..., are floated. Thereafter, a predetermined voltage is applied to the select gate and the control gate from the row decoder 8 (time t2). If data, which is written to the memory cells MC31, MC71, ..., of the memory cell unit A(3) is "0", the threshold voltage of the memory cell is positive, and no current flows. The potential of each of the bitlines BL1A, BL3A, BL5A, ..., is set to 1.7V. In the memory cell (3), the control gate CG1 is 0V, CG2 to CG8 are Vcc (e.g., 3V), SG1, SG2, SG4 are 3V (Vsgh), and SG3 is 0V (Vsg1). If data is "1", the cell current flows, and the potential of each of the bitlines BL1A, BL3A, BL5A, ..., is reduced to 1.5V or less. In this case, since the select gate SG3 is 0V, the E-type select MOS transistor having SG3 as a gate electrode is turned off, and data of the memory cells of the memory cell units (1), (2), and (4) is not transferred to the bitlines. During this time, (dummy) bitlines BL1B, BL3B, BL5B are set to the precharge potential of 1.5V.

Thereafter, at time t3, φP is 3V, and φN is 0V, and CMOS flip-flop FF is non-activated. At time t4, φE is 3V, so that CMOS flip-flop FF of SA2 is equalized, and nodes N1 and N2 are set to Vcc2 (e.g., 1.5V). At time t5, SS2, SA, SB is 3V, and the bitline and the sense amplifier are connected to each other. Thereafter, φN is changed to 3V from 0V, and φP is changed to 0V from 3V, so that the potential difference between each of the bitlines BL1A, BL3A, BL5A, ..., and each of the bitlines BL1B, BL3B, BL5B, ..., is amplified (time t6). In other words, if data "0" is written to the memory cell MC31, MC71, ..., node N1 of SA2 is set to 3V, and node N2 is set to 0V. If data "1" is written to the memory cell MC31, MC71, ..., node N1 is set to 0V, and node N2 is set to 3V. Thereafter, if a column select signal CSL is changed to 3V from 0V, data, which is latched by the CMOS flip-flop FF, is output to the IO, and /IO (time t7).

The bitlines BL0A, BL2A, BL4A, BL6A, ..., are grounded to 0V by the reading operation. In other words, the bitlines are grounded on every other line. The distance between the read bitlines is twice as long as the case in which the bitline is not grounded. As a result, noise, which is caused by an inter-bitline capacitance combination, is greatly reduced. PRB1 is set to Vcc and VB1 is set to 0V by the reading operation, so that bitlines BL0B, BL2B, BL4B, BL6B, ..., may be grounded. As a result, noise, which is caused by an inter-bitline capacitance combination in amplifying the bitline potential, can be reduced.

Figure 46:
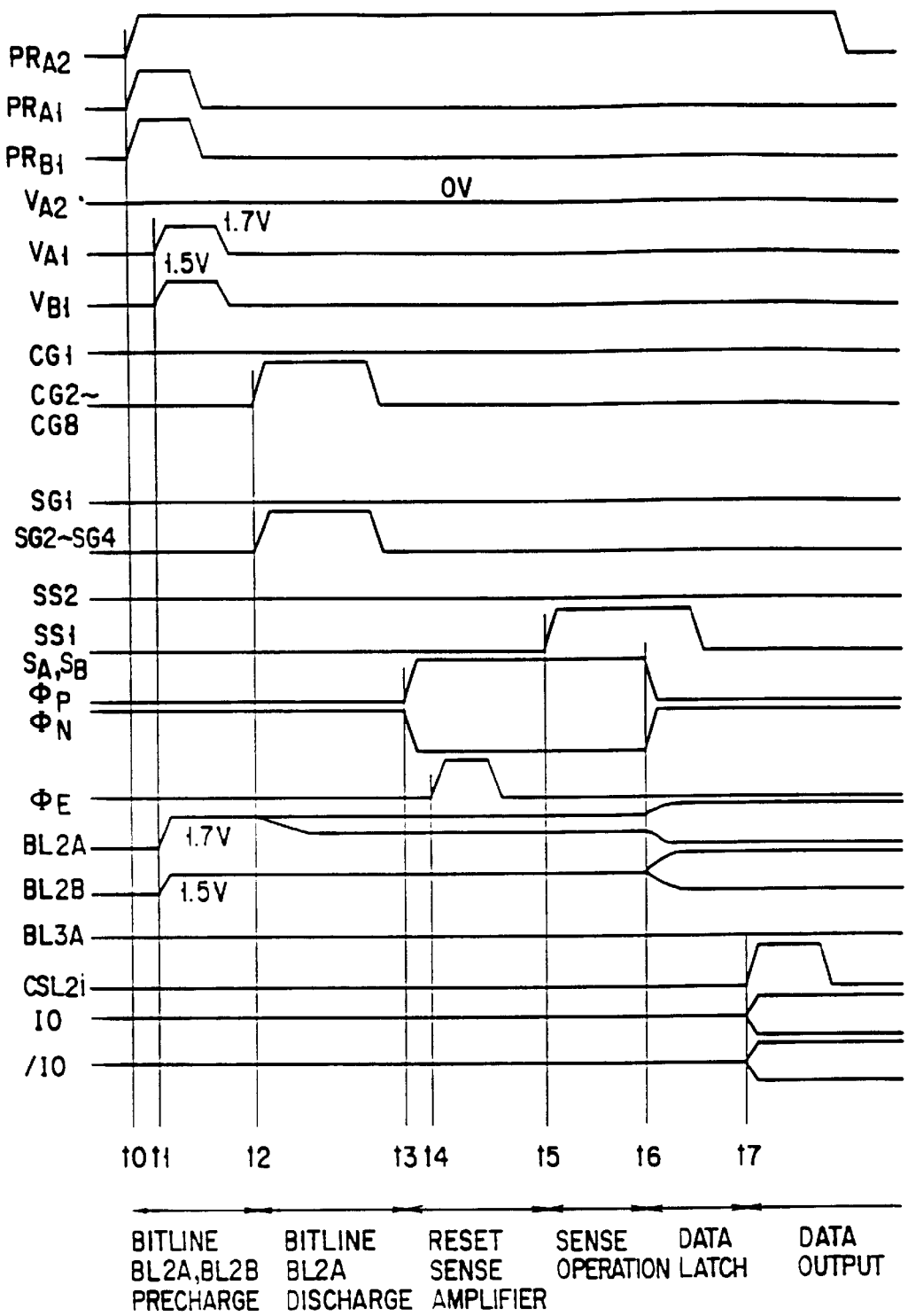
FIG. 46 is a timing chart explaining the data read operation of the twelfth embodiment of the present invention.

FIG. 46 is a timing chart showing a case of reading data written to the memory cells MC11, MC51, MC91, ..., of the memory cell unit (1) of FIG. 41.

First of all, precharge signals PRA1, PRA2, PRB1 are changed to Vcc from Vss (time t0). Then, bitlines BL0A, BL2A, BL4A, ..., are precharged to VA1 (e.g., 1.7V), and (dummy) bitlines BL0B, BL2B, BL4B, ..., are precharged to VB1 (e.g., 1.5V) (time t1). VA2 is 0V, and the bitlines BL1A, BL3A, BL5A, ..., are grounded.

After precharging, PRA1 and PRB1 are set to Vss, and the bitlines BL0A, BL2A, BL4A, ..., are floated. Thereafter, a predetermined voltage is applied to the select gate and the control gate from the row decoder 8 (time t2). In this case, the control gate CG1 is 0V, CG2 to CG8 are Vcc (e.g., 3V), SG2, SG3, SG4 are 3V (Vsgh), and SG1 is 0V (Vsg1). If data, which is written to the memory cells MC11, MC51, MC91, ..., is "0", the threshold voltage of the memory cell is positive, and no current flows. The potential of each of the bitlines BL0A, BL2A, BL4A, ..., is set to 1.7V. If data is "1", the cell current flows, and the potential of each of the bitlines BL0A, BL2A, BL4A, ..., is reduced to 1.5V or less. In this case, since the select gate SG1 is 0V, the E-type select MOS transistor having SG1 as a gate electrode is turned off, and data of the memory cells of the memory cell units (2), (3), and (4) is not transferred to the bitlines. During this time, (dummy) bitlines BL0B, BL2B, BL4B are set to the precharge potential of 1.5V.

Thereafter, at time t3, φP is 3V, and φN is 0V, and CMOS flip-flop FF is non-activated. At time t4, φE is 3V, so that CMOS flip-flop FF of SA1 is equalized, and nodes N1 and N2 are set to Vcc/2 (e.g., 1.5V). At time t5, SS1, SA, SB is 3V, and the bitline and the sense amplifier are connected to each other. Thereafter, φN is changed to 3V from 0V, and φP is changed to 0V from 3V, so that the potential difference between each of the bitlines BL0A, BL2A, BL4A, ..., and each of the bitlines BL0B, BL2B, BL4B, ..., is amplified (time t6). In other words, if data "0" is written to the memory cell MC11, MC51, MC91, ..., node N1 of SA1 is set to 3V, and node N2 is set to 0V. If data "1" is written thereto, node N1 is set to 0V, and node N2 is set to 3V. Thereafter, if the column select signal CSL is changed to 3V from 0V, data, which is latched by the CMOS flip-flop FF, is output to the IO, and /IO (time t7).

Since the bitlines BL1A, BL3A, BL5A, ..., are grounded to 0V by the reading operation, noise, which is caused by the inter-bitline capacitance combination, can be reduced.

Figure 47:
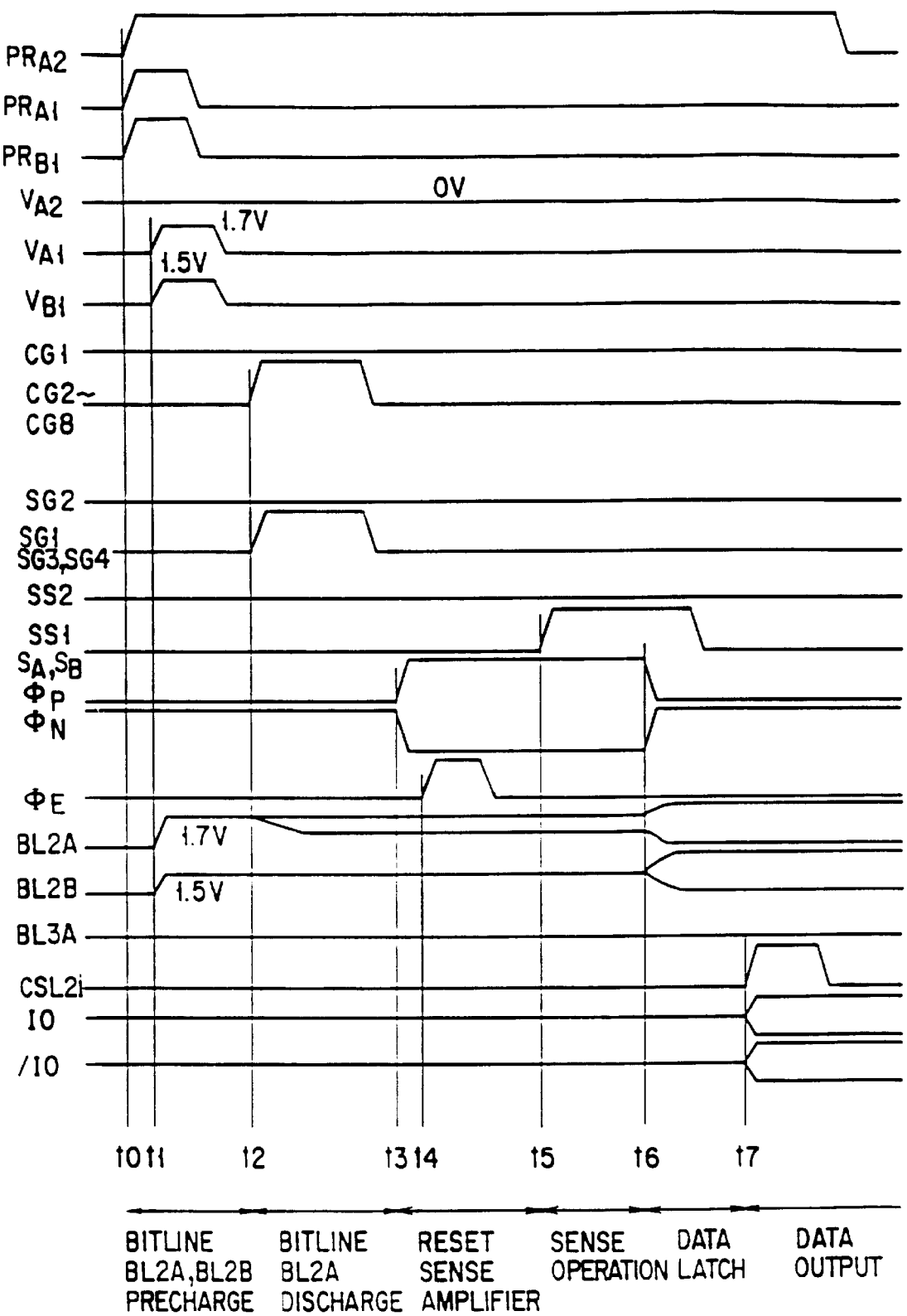
FIG. 47 is a timing chart explaining the data read operation of the twelfth embodiment of the present invention.

Similarly, FIG. 47 is a timing chart showing a case of reading data of the memory cells MC21, M61, MC 101, . . . , of the memory cell unit (2) to the bitlines BL0A, BL2A, BL4A, BL6A, . . . . If SG2 is set to Vsg1, and SG1, SG3, and SG4 are set to Vsgh, the memory cell unit (2) is selected and the memory cell units (1), (3), and (4) are non-selected.

Figure 48:
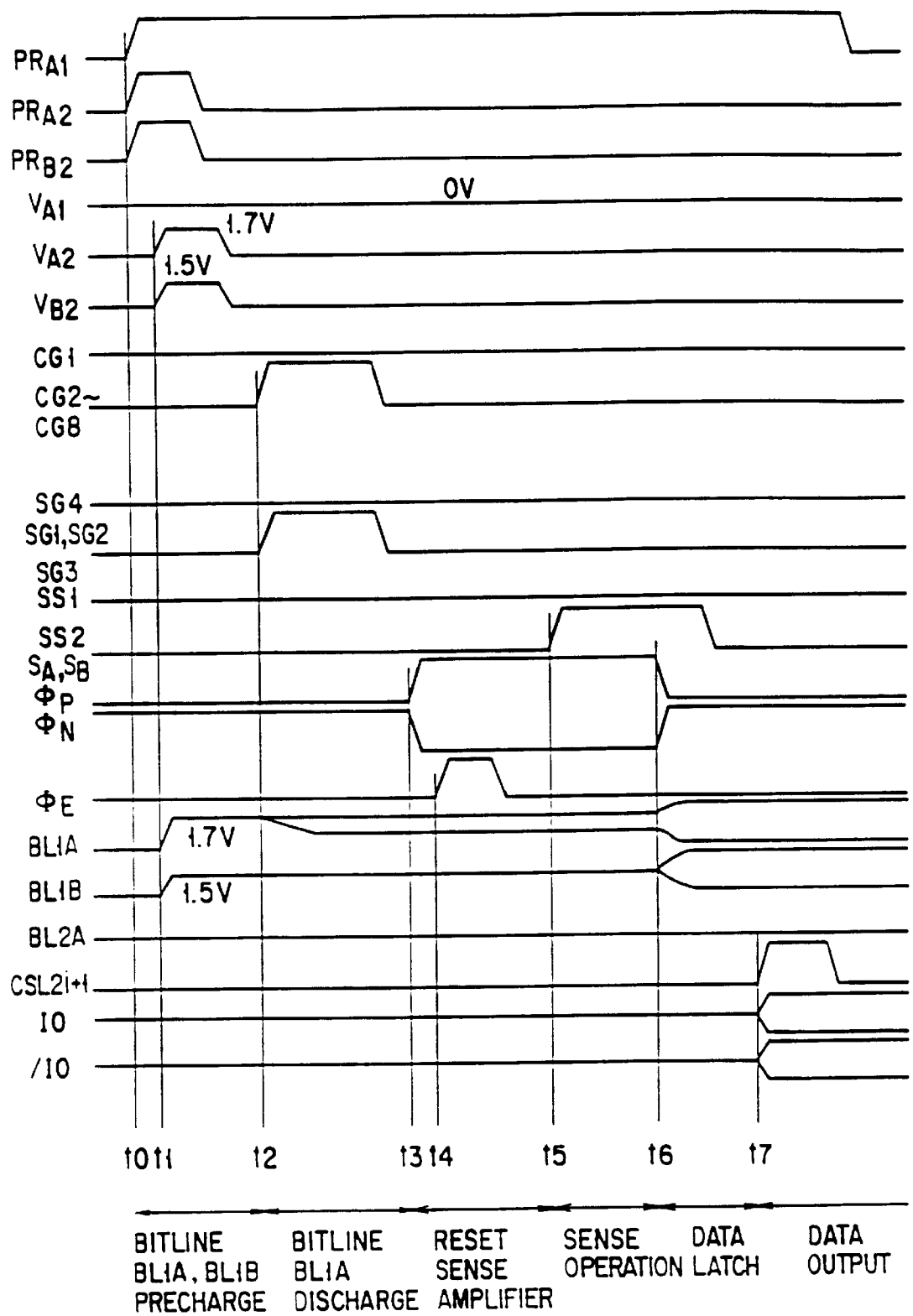
FIG. 48 is a timing chart explaining the data read operation of the twelfth embodiment of the present invention.

FIG. 48 is a timing chart showing a case of reading data of the memory cells MC41, M81, . . . , of the memory cell unit (4) to the bitlines BL1A, BL3A, If SG4 is set to Vsg1, and SG1, SG2, and SG3 are set to Vsgh, the memory cell unit (4) is selected and the memory cell units (1), (2), and (3) are non-selected.

The timing of the reading operation is arbitrarily set. For example, at time t5, the transfer gate for connecting the bitline and the sense amplifier is turned on, and the potential of the bitline and that of the dummy bitline are transferred to the nodes N1 and N2 of the sense amplifier. Thereafter, the transfer gate may be turned off. In this case, since the bitline and the dummy bitline are separated from the sense amplifier, the load capacitance of the sense amplifier is reduced, so that the potentials of nodes N1 and N2 are rapidly determined at the time of sensing and data latching.

In the above-explained embodiment, for reading data of the memory cells MC31, MC71, the bitlines BL1A, BL3A, BL5A, . . . , are precharged. Then, the bitlines BL2A, BL4A, . . . , are grounded, so that data of the memory cells is read to the bitlines BL1A, BL3A, BL5A, . . . , Data can be arbitrarily read to which side of the bitlines connected to both ends of the memory cell unit. For example, for reading data of the memory cells MC31, MC71, . . . , the bitlines BL2A, BL4A, . . . , are precharged. Then, the bitlines BL1A, BL3A, BL5A, . . . , are grounded. As a result, data of the memory cells may be read to the bitlines BL2A, BL4A, . . . .

<Write>

A write operation of this embodiment will be described as follows.

The following will explain writing steps in a case where data is written to the memory cells MC31, MC71, . . . , of the memory cell unit (3) of FIG. 41.

The select gates SG1 and SG2 are set to 0V. The select gate SG1 is used as a common gate for a plurality of select MOS transistors. The select gate SG2 is also used as a common gate for a plurality of select MOS transistors. The select MOS transistors having SG1 and SG2 as gate electrodes are connected in series. At least one of the select MOS transistors is turned off. SG3, SG4, and CG1 to CG8 are set to Vcc, and the bitlines BL1A, BL3A, BL5A, . . . , are set to Vcc. Then, a channel of a page for write operation is precharged to Vcc-Vth (voltage, which is smaller than the bitline potential Vcc due to the drop in the threshold voltage of the select MOS transistor). At this time, SG3 or SG4 may be set to a value more than Vcc, e.g., Vcc+Vth or Vcc+2Vth (Vth: threshold value of E-type select MOS transistor) to transfer Vcc to the channel without dropping the threshold value. The bitlines BL0A, BL2A, BL4A, . . . , may be set to an arbitrary voltage, e.g., Vcc, 0V.

Thereafter, SG3 is set to Vsgl (e.g., 0V), D-type select MOS transistors ST33, ST73, . . . , are turned on, but E-type select MOS transistors are turned off. As a result, the channels of the memory cell units (1), (2), (4) where no data is written are floated at the potential charged from the bitline, that is, Vcc (-Vth). Data to be written to the memory cells MC31, MC71, . . . , of the memory cell unit (3) is supplied from the bitlines BL1A, BL3A, . . . .

For example, for write data "0" to the memory cell MC31, if the bitline BL1A is set to 0V, the D-type select MOS transistor ST33 is turned on, so that the channel of the memory cell MC31 is 0V. For write data "1" to the memory cell MC31, if the bitline BL1A is set to 3V, the gate of the D-type select MOS transistor ST33 is 0V, the drain is 3V (Vcc), the source is 2.2V (Vcc-Vth) or 3V (Vcc). In this potential state, the threshold value of the D-type select MOS transistor is set to, e.g., -1.6V or -2V such that ST33 is turned off. As a result, the D-type select MOS transistors ST33, ST73, . . . , are turned off, and the channel of the memory cell MC31 to which data "1" is written is floated at Vcc (-Vth). Or, the threshold value of the D-type select MOS transistor may be set to e.g., -5V. In this case, even if the D-type select MOS transistor ST33 is not turned off, the source of the D-type select MOS transistor ST34 is set to Vcc or Vcc-Vth, the drain is set to Vcc, and the gate is set to Vcc. In this potential state, the D-type select MOS transistor ST34 may be turned off, and the channel of the memory cell to which data "1" is written may be floated.

The threshold value of the D-type select MOS transistor, that of the E-type select MOS transistor, and the potentials to be applied to the select gates SG3 and SG4 can be explained as follows.

Specifically, these threshold values and the potentials may be set such that the channel of the memory cell where data is written is set to 0V in the case of write data "0" and the channel is floated in the case of write data "1." These threshold values and the potentials may be arbitrarily set. The bitlines BL0A, BL2A, BL4A, . . . , may be Vcc or 0V.

The select gate SG3 is changed from Vcc to Vsgl (voltage, which is higher than the threshold value of the D-type select MOS transistor but lower than the E-type select MOS transistor, e.g., 0V). Thereafter, the control gates CG1 to CG8 are changed to an intermediate potential VM (about 10V) from Vcc. As a result, the channels of the memory cells of the memory cell units (1), (2), (4) where no data is written and the channel of the memory cells MC31, MC71, . . . , where "1" is written are floated. These channels are increased to the intermediate potential VM (about 8V) from Vcc (-Vth) by the capacitance combination between the control gate and the channel. The channel of the memory cells MC31, MC71, . . . , where data "0" Is written is 0V since the bitline is 0V.

After these channels are increased to the intermediate potential VM from Vcc (-Vth), the control gate CG1 is increased to a write voltage Vpp (20V) from the intermediate voltage VM. The channels of the memory cells of the memory cell units (1), (2), (4) where no data is written and the channel of the memory cells of the memory cell unit where "1" is written are intermediate potential (about 8V) The control gate 1 is Vpp (about 20V). Due to this, data "0" is not written to these memory cells. However, since the channel of the memory cells where "0" is written is 0V and the control gate is Vpp (about 20V), an electron is injected to the floating gate from the substrate and data "0" is written.

Figure 49:
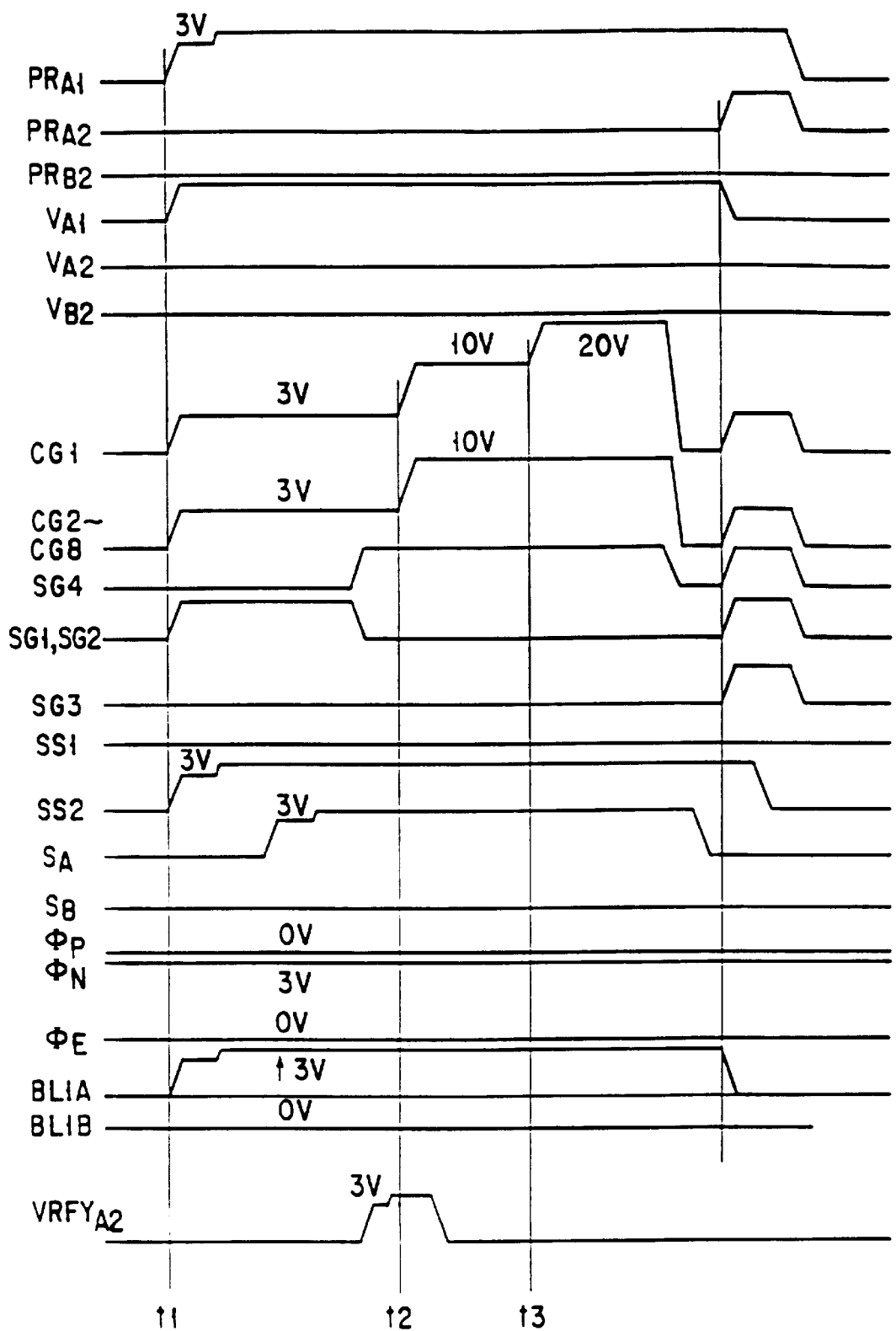
FIG. 49 is a timing chart explaining the data write operation of the twelfth embodiment of the present invention.

Next, the following will specifically explain the write operation of this embodiment with reference to a timing chart. FIG. 49 is a timing chart showing a case in which data is written to the memory cell MC31 (MC71, . . . ,) of the memory cell unit (3).

Data to be written to the memory cells MC31, MC71 of the memory cell unit (3) is latched by the sense amplifier (SA2 of FIG. 45). In a case where "0" is written, node N1 is 0V and node N2 is 3V. In a case where "1" is written, node N1 is 3V and node N2 is 0V.

When the write operation is started, SG3 and SG4 are set to Vss, and SG1, SG2, and CG1 to CG8 are set to Vcc-Vth or Vcc+2Vth at time t1. In this embodiment, in write data to the memory cells MC31, MC71, . . . , of the memory cell unit (3), no data is written to the memory cells of the memory cell units (1), (2), (4). In this example, the channels of the memory cell units (1), (2), (4) are charged from the bitlines BL0A, BL2A, BL4A, . . . . In this embodiment, the bitlines BL0A, BL2A, BL4A, . . . , are charged to Vcc from VA1 of the sense amplifier SA1 of FIG. 44. As a result, the channel of the non-select memory cell is charged to Vcc−Vth or Vcc. At this time, the channel of the memory cell where data is written may be also charged to Vcc−Vth or Vcc. Regarding a method for charging the channels of the memory cells of the memory cell units (1), (2), (4) to Vcc (−Vth), the channels may be charged from BL0A, BL2A, BL4A, . . . , or from BL1A, BL3A, BL5A, . . . .

In accordance with data latched by the sense amplifier SA2, Vcc or Vss (0V) is given to the bitlines BL1A, BL3A, BL5A, . . . . As a result, for write "0" to the memory cell MC31 after charging the channel of the non-select memory cell unit, the bitline BL1A is set to 0V, and the channel of the memory cell MC31 is set to 0V. For write "1" to the memory cell MC31, the bitline BL1A is set to Vcc (e.g., 3V), and the channel of the memory cell MC31 is set to Vcc (−Vth).

In other words, the select gates SG1 and SG2 are set to Vss, and SG3 is set to Vsgl (e.g., 0V), and SG4 is set to Vcc or Vcc+Vth, or Vcc+2Vth. The select gate SG1 is used as a common gate for a plurality of select MOS transistors. The select gate SG2 is also used as a common gate for a plurality of select MOS transistors. The select MOS transistors having SG1 and SG2 as gate electrodes are connected in series. At least one of the select MOS transistors is turned off. The select MOS transistors having SG3 of the memory cell units (1), (2), (4) where no data write is performed is E-type are turned off since they are E-type. The channels of the memory cells of the memory cell units (1), (2), (4) are floated at Vcc (−Vth).

For write "1" to the memory cells MC31, MC71, . . . , the channels of these memory cells are floated since the bitlines BL1A, BL3A, . . . , are Vcc.

For write "0" to the memory cells MC31, MC71, the channels of these memory cells are set to 0V since the bitlines BL1A, BL3A, . . . , are 0V.

After the select gate SG3 is set to Vsgl (e.g., 0V), the control gates CG1 to CG8 is changed to the intermediate potential VM (about 10V) from the Vcc. As a result, the channels of the memory cells of the memory cell units where no data is written and the channel of the memory cells MC31, MC71, . . . , where "1" is written are floated. These channels are increased to the intermediate potential VM (about 8V) from Vcc (−Vth) by the capacitance combination between the control gate and the channel. The channel of the memory cells MC31, MC71, . . . , where data "0" is written is 0V since the bitline is 0V.

After these channels are increased to the intermediate potential VM from Vcc (−Vth), the control gate CG1 is increased to the write voltage Vpp (20V) from the intermediate voltage VM. The channels of the memory cells of the memory cell units (1), (2), (4) where no data is written and the channel of the memory cells of the memory cell unit where "1" is written are intermediate potential (about 10V). The control gate CG1 is Vpp (about 20V). Due to this, data "0" is not written to these memory cells. However, since the channel of the memory cells where "0" is written is 0V and the control gate is Vpp (about 20V), an electron is injected to the floating gate from the substrate and data "0" is written.

After the completion of the write operation, the control gate, the select gate, and the bitline are sequentially discharged, and the write operation is completed.

Similarly, for write data to the memory cells MC11, MC51, MC91, . . . , of the memory cell unit (1), the channels of the memory cells of the memory cell units (2), (3), (4) are charged to Vcc (or Vcc−Vth). Thereafter, the select gate SG1 is set to Vsg1, SG2 is set to Vsgh, and SG3, SG4 are set to Vss. Then, the bitlines BL0A, BL2A, BL4A, . . . , are set to Vcc or Vss, and data is transferred to the memory cells MC11, MC51, MC91, . . . .

Similarly, for write data to the memory cells MC21, MC61, MC101, . . . , of the memory cell unit (2), the channels of the memory cells of the memory cell units (1), (3), (4) are charged to Vcc (or Vcc−Vth). Thereafter, the select gate SG2 is set to Vsg1, SG1 is set to Vsgh, and SG3, SG4 are set to Vss. Then, the bitlines BL0A, BL2A, BL4A, . . . , are set to Vcc or Vss, and data is transferred to the memory cells MC21, MC61, MC101, . . . .

Figure 50:
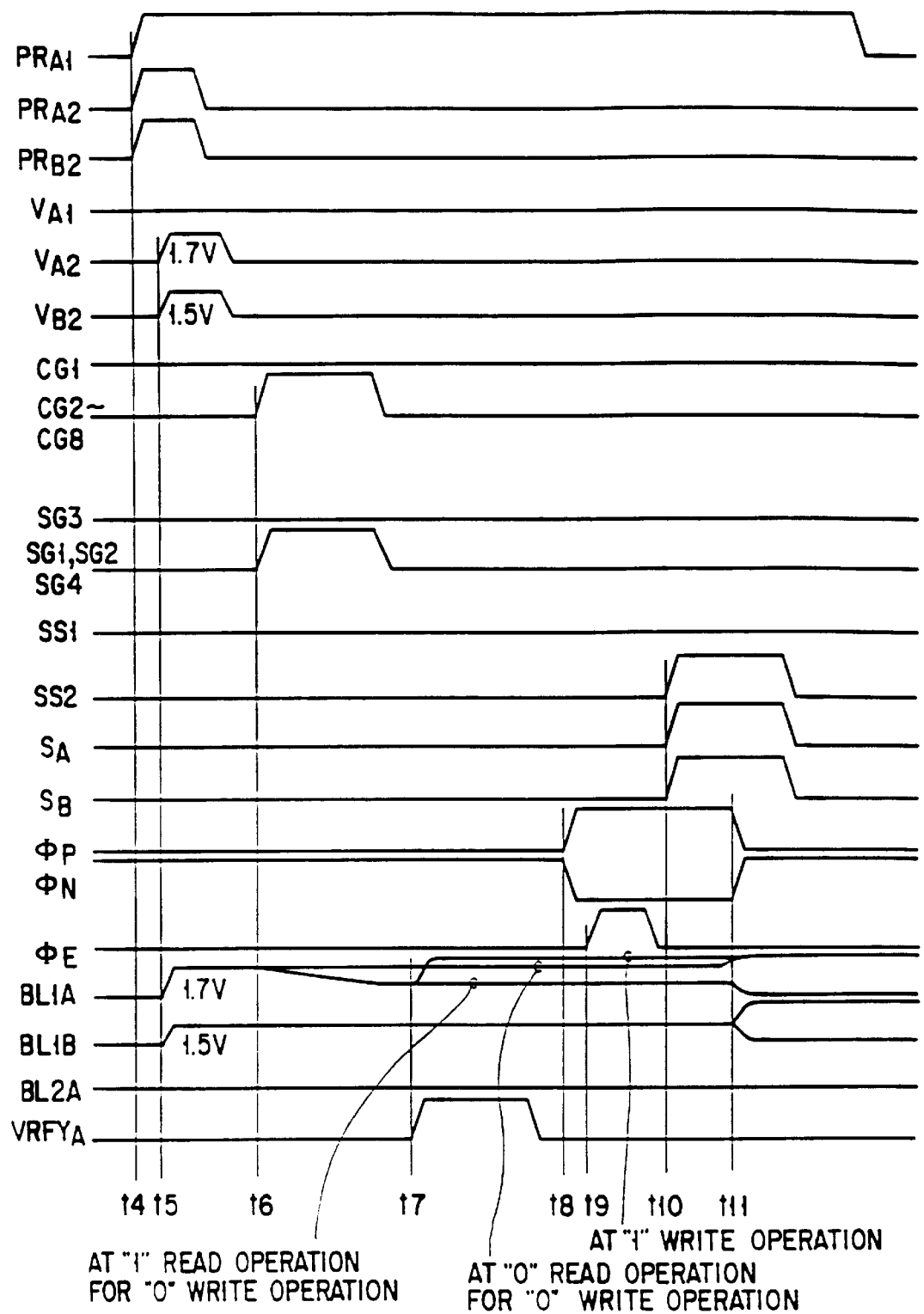
FIG. 50 is a timing chart explaining the write verify operation of the twelfth embodiment of the present invention.

Similarly, for write data to the memory cells MC41, MC81, . . . , of the memory cell unit (4), the channels of the memory cells of the memory cell units (1), (2), (3) are charged to Vcc (or Vcc−Vth). Thereafter, the select gate SG4 is set to Vsg1, SG3 is set to Vsgh, and SG1, SG2 are set to Vss. Then, the bitlines BL1A, BL3A, . . . , are set to Vcc or Vss, and data is transferred to the memory cells MC41, MC81, After the completion of the write operation, an verify operation is performed to check whether or not write operation is sufficiently performed (FIG. 50). Similar to the reading time, at the time of verify read, the select gate SG3 is set to Vsg1, and SG1, SG2, and SG4 are set to Vsgh to select only the memory cell unit (3). After the bitline Is discharged from the precharge potential, the bitline is recharged in accordance with write data. Thereafter, the bitline potential is sensed, so that rewrite data is latched by the sense amplifier. The operation of the sense amplifier and the recharge of the bitline at the time of the verify operation are specifically described in "IEEE J.Solid-State circuit by T. Tanaka, et al., vol. 29, pp. 366–1373, 1994.

In the above document, data is simultaneously written to the memory cells corresponding to ¼ of the total number of memory cells arranged in the column direction. In other words, among four memory cell units, the memory cell unit in which data is simultaneously written is only one.

According to the twelfth embodiment of this invention, data can be substantially simultaneously written to two memory units. For example, if the select gates SG1 and SG3 are set to Vsgl (e.g., 0V) and SG2 and SG4 are set to Vsgh, data can be substantially simultaneously written to the memory cell units (1) and (3). In this case, the E-type select MOS transistor having the select gates SG1 and SG3 as gate electrodes is turned off, and the D-type select MOS transistor is turned on. Write data of the memory cells MC31, MC71, . . . , of the memory cell unit (3) is transferred from the bitlines BL1A, BL3A, . . . . In other words, in the case of "0" write, the bitline and the channel of the memory cell are 0V. In the case of "1" write, the bitline is Vcc, and the channel is Vcc (−Vth) so as to be floated. Similarly, write data of the memory cells MC11, MC51, MC91, . . . , of the memory cell unit (1) is transferred from the bitlines BL0A, BL2A, BL4A, . . . .

Moreover, for example, if the select gates SG2 and SG4 are set to Vsgl and SG1 and SG3 are set to Vsgh, data can He substantially simultaneously written to the memory cell units (2) and (4). In this case, data is transferred to the memory cells of the memory cell unit (4) from the bitlines BL1A, BL3A, BL5A, . . . , and data is transferred to the memory cells of the memory cell unit (2) from the bitlines BL0A, BL2A, BL4A, . . . .

After the write operation, the verify read is performed to check whether or not the write operation is sufficiently performed.

In the verify read operation shown in the above-mentioned document, data of one memory cell is read by use of two bitlines. That is, data of one of four memory cell units is simultaneously read. To write data of two memory cell units substantially simultaneously, the verify read operation is performed twice per one write operation. In the method for write data of two memory cell units substantially simultaneously, since the verify read is performed in connection with each of memory cell units, the total amount of time for write data of two memory cell units is Tpr+2Tvfy (Tpr: write pulse width, Tvfy: verify read time per one time). In the method for write data of one memory cell unit substantially simultaneously, the total amount of time for write data corresponding to two memory cell units is about 2 (Tpr−Tvfy). Thus, the write operation, which is in accordance with the method for write data of two memory cell units substantially simultaneously, is faster than the write operation, which is in accordance with the method for write data of one memory cell unit substantially simultaneously.

In the above-mentioned document, the sense amplifier is connected to each of the bitlines. It is possible to use the so-called common sense amplifier system in which one sense amplifier is connected to two bitlines (FIG. 51). In this case, the timing charts of the writing and reading are substantially the same as the case of the above-mentioned document.

According to the present invention, regarding the select MOS transistors sharing one select gate, there can be provided select MOS transistors, which are in the conductive state, and in the non-conductive state. Also, in the memory cells having the same select gate, the select memory cells and the non-select memory cells can be easily realized by preparing four such select gates.

The threshold voltage of the select MOS transistor and the voltage to be applied to the select gate can be arbitrarily set. One of the transistors connected in series to one end of the memory cell has two kinds of threshold voltages, that is, Vtd1, and Vtd2 (Vtd1>Vtd2). The voltages to be applied to the select gate are Vsghd (Vsghd>Vtd1) and Vsg1d (Vtd1>Vsg1d>Vtd2). The other transistor has two kinds of threshold voltages, that is, Vte1, and Vte2 (Vte1>Vte2). The voltages to be applied to the select gate are Vsghe (Vsghe>Vte1) and Vsgle (Vte1>Vsgle>Vte2) Moreover, one of the transistors connected in series to the other end of the memory cell has two kinds of threshold voltages, that is, Vts1, and Vts2 (Vts1>Vts2). The voltages to be applied to the select gate are Vsghs (Vsghs>Vts1) and Vsgls (Vts1>Vsgs>Vts2). The other transistor has two kinds of threshold voltages, that is, Vtp1, and Vtp2 (Vtp1>Vtp2). The voltages to be applied to the select gate are Vsghp (Vsghp>Vtp1) and Vsglp (Vtp1>Vsglp>Vtp2).

Unlike the case described in the above-mentioned document, it is unnecessary to set Vtd1=Vte1=Vts1=Vtp1, Vtd2=Vte2=Vts2=Vtp2, Vsghd=Vsghe=Vsghs=Vsghp, and vsgld=Vsgle=Vsgls=Vsglp. The threshold voltage and the voltage to be applied to the select gate can be arbitrarily set. For example, one of the transistors connected in series to one end of the memory cell has two kinds of threshold voltages, that is, 2.5V and 0.5V. The other transistor has two kinds of threshold voltages, that is, 1V and −2V. One of the transistors connected in series to the other end of the memory cell has two kinds of threshold voltages, that is, −1 and −3V. The other transistor has two kinds of threshold voltages, that is, 2.8V and −2.5V.

The voltages to be applied to one of two select gates connected in series to one end of the memory cell may be set to Vsgh=3V, VSg1=1.5V. The voltages to be applied to other select gate may be set to Vsgh=2V, Vsg1=−0.5V. The voltages to be applied to one of two select gates connected in series to the other end of the memory cell may be set to Vsgh=0V, VSg1=−2V. The voltages to be applied to the other select gate may be set to Vsgh=4V, Vsg1=−1V.

The threshold voltages of four select MOS transistors connected to one NAND column may be substantially the same. For example, the threshold voltage of the four select MOS transistors connected to one NAND column is set to 0.8V. The threshold voltage of one of two select MOS transistors connected in series to one end of the other NAND cells using an electrode gate of the select MOS transistor in common to the NAND column is 0.8V and 2V. The threshold voltage of the other select MOS transistor is 0.8V and −1V. The threshold voltages of two select MOS transistors connected in series to the other end of the memory cells are 0.8V and −1V. The voltage to be applied to one of two select gates connected in series to one end of the NAND cells is set to Vsgh=3V, Vsg1=1.4V. The voltage to be applied to the other select gate is set to Vsgh=3V, Vsg1=0V. The voltage to be applied to one of two select gates connected in series to the other end of the NAND cells is set to Vsgh=3V, Vsg1=0V. The threshold voltages of the select gate may be, of course, positive or negative values. Also, the voltages to be applied to the select gates may be negative.

If Vsgh is higher than Vcc, conductance of the select MOS transistor is increased (i.g., decreased in resistance), so that the cell current, which flows to the NAND cell column, is increased. As a result, the bitline discharging time is reduced, so that the speed of the verify read is increased. Vsgh may be boosted from Vcc by, for example, a boosting circuit of the chip.

Of the threshold voltages of the select MOS transistors, the higher value may be set to the voltage, which is more than Vcc, (e.g., 3.5V). In this case, e.g., 4V may be applied to the select gate by the boosting circuit of the chip such that the select MOS transistor having such threshold voltage is turned on at the time of reading or verify read.

As a method for changing the threshold voltage, the following methods can be considered.

Specifically, the thickness of the oxide film of the gate of the select MOS transistor is changed. The concentration of impurity material channel-doped to the select MOS transistor is changed. Or, it is possible to make a difference in the threshold voltage by depending on whether or not impurity material is channel-doped to the select MOS transistor. It is also possible to chance the threshold voltage by changing the channel length of the select MOS transistor. In other words, since the threshold voltage is reduced by a short channel effect in the transistor having a short channel length, this kind of transistor may be used as an I-type transistor or a D-type transistor. Moreover, even if a manufacturing process is not newly added to the above-mentioned methods, the other manufacturing processes such as a channel dope of the peripheral circuit may be used. In any method, by making a difference in the threshold voltage of the select MOS transistor, a predetermined threshold voltage can be obtained by a substrate bias.

Thirteenth Embodiment

This embodiment shows a case in which the D-type select MOS transistor of FIG. 41 is changed to an I-type select MOS transistor. In other words, the threshold voltage of the D-type select MOS transistor of FIG. 41 is changed to, for example, 0.5V. The figure of this structure is omitted. If the threshold voltage of the E-type select MOS transistor is set to 2V and the threshold voltage of the I-type select MOS transistor is set to 0.5V, the voltage, by which both the E-type and I-type select MOS transistors are turned on, may be set to 3V. Moreover, the voltage, by which both the E-type select MOS transistor is turned on but the I-type select MOS transistor is turned off, may be set to 1.5V. The reading operation and the write operation are performed in substantially the same manner as the twelfth embodiment.

There can be considered a method for reducing concentration of the substrate to set the lower threshold voltage (I-type) of the select MOS transistors. In the I-type transistor in which concentration of the substrate is low, even if the gate voltage is not applied thereto, a depletion layer between the drain and the substrate is expanded if the drain voltage is applied thereto. As a result, there occurs a problem in which the depletion layer between the drain and the substrate and a depletion layer between the source and the substrate can be easily connected to each other (punch through). To increase the breakdown voltage of the punch through of the I-type select MOS transistor, the channel length L of the I-type select MOS transistor may be increased.

Fourteenth Embodiment

If the threshold voltage of the D-type select MOS transistor of FIG. 41 is set to about −8V, it is possible to execute the write method as in the conventional NAND type EEPROM (the channel of the write non-select memory cell is not floated). For example, for write data of the memory cell MC31 of FIG. 41, SG1, SG2 are set to 0V, SG3 is set to 0V, SG is set to VM10 (about 10V), CG1 is set to Vpp, and CG2 to CG8 are set to VM10. For write data "1" BL1A is set to VM8 about 8V). For write data "0", BL1A is set to 0V. As a result, the channel of the memory cell MC31 in which "1" is written is charged to the intermediate potential (about 8V) from the bitline BL1A.

Regarding the memory units (1), (2), (4) where no write operation is performed, as shown in the twelfth embodiment, the channel of the memory cells of the memory cell units (1), (2), (4) may be set to Vcc (−Vth) before the write potential is biased to the write memory cell MC31 from the bitline BL1A. During the write operation, since SG3 of the non-select memory cell units (1), (2), (4) is turned off, the channel of the memory cells is floated. As a result, as explained in the twelfth embodiment, in boosting the control gate to VM8 or Vpp, the channel of the memory cells is set to the write non-select potential (VM8), and "0" write is prevented by the coupling of the control gate and the channel.

The present invention in its broader aspect is not limited to the specific details and representative devices shown and described herein. Accordingly, various modifications may be made without departing from the spirit or scope of the general inventive concept as defined by the appended claims and their equivalents. For example, the present invention can be applied to an AND type EEPROM (K. Kume et al.: IEDM Tech. Dig., December. 1992, pp. 991–993),a DINOR type EEPROM (S. Kobayashi et al.: ISSSCC Tech. Dig., 1995, pp. 122), or an imaginary ground type array (R. Cemea et al.: ISSSCC Tech. Dig., 1995, pp. 126) other than the above-explained NAND type EEPROM and NOR type EEPROM.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A non-volatile semiconductor memory device comprising:
   a memory cell section including at least one memory cell;
   a first signal line transferring data from/to said memory cell section; and
   a first select transistor arranged between said first signal line and said memory cell section, wherein
      in case of a program inhibit operation, a write unselect voltage is applied to said first signal line and the write unselect voltage is transferred to a channel of at least said memory cell section by applying a first select gate voltage higher than the write unselect voltage to a gate of said first select transistor, and then a voltage higher than the first select gate voltage is applied to a control gate of said memory cell to generate a write inhibit channel voltage boosted by a capacitive coupling of the channel of said memory cell with the control gate thereof.

2. The device according to claim 1, wherein the first select gate voltage is higher than the write unselect voltage by a threshold voltage of said memory cell/said first select transistor.

3. The device according to claim 1, wherein the write unselect voltage is a power supply voltage.

4. The device according to claim 3, wherein the first select gate voltage is higher than the write unselect voltage by a threshold voltage of said memory cell/said first select transistor.

5. A non-volatile semiconductor memory device comprising:
   a memory cell section including at least one memory cell;
   a first signal line transferring data from/to said memory cell section; and
   a first select transistor arranged between said first signal line and said memory cell section, wherein
      in case of a program inhibit operation, a write unselect voltage is applied to said first signal line and the write unselect voltage is transferred to a channel of said memory cell section by applying a first select gate voltage higher than the write unselect voltage to a gate of said first select transistor and a control gate of said memory cell, and then a voltage higher than the first select gate voltage is applied to the control gate of said memory cell to generate a write inhibit channel voltage boosted by a capacitive coupling of the channel of said memory cell with the control gate thereof.

6. The device according to claim 5, wherein the first select gate voltage is higher than the write unselect voltage by a threshold voltage of said memory cell/said first select transistor.

7. The device according to claim 5, wherein the write unselect voltage is a power supply voltage.

8. The device according to claim 7, wherein the first select gate voltage is higher than the write unselect voltage by a threshold voltage of said memory cell/said first select transistor.

9. A non-volatile semiconductor memory device comprising:
   a memory cell section including a plurality of memory cells which are connected in series;

a first common signal line transferring data from/to said memory cell section; and a first select transistor arranged between said first common signal line and said memory cell section, wherein in case of a program inhibit operation, a wire unselect voltage is applied to said first common signal line and the write unselect voltage is transferred to a channel of said memory cell section by applying a first select gate voltage higher than the write unselect voltage to a gate of said first select transistor and control gates of said plurality of memory cells, and then a pass voltage higher than the first select gate voltage is applied to the control gates of the unselected memory cells and a program voltage higher than the pass voltage is applied to the control gate of the selected memory cell to generate a write inhibit channel voltage boosted by a capacitive coupling of the channel of said plurality of memory cells with the control gates thereof.

10. The device according to claim 9, wherein the first select gate voltage is higher than the write unselect voltage by a threshold voltage of said memory cell/said first select transistor.

11. The device according to claim 9, wherein the write unselect voltage is a power supply voltage.

12. The device according to claim 11, wherein the first select gate voltage is higher than the write unselect voltage by a threshold voltage of said memory cell/said first select transistor.

13. A non-volatile semiconductor memory device comprising:

a memory cell section including a least one memory cell;

a first signal line transferring data from/to said memory cell section; and a first select transistor arranged between said first signal line and said memory cell section, wherein in case of a program inhibit operation, a write unselect voltage is applied to said first signal line and the write unselect voltage is transferred to a channel of said memory cell section by applying a first select gate voltage higher than the write unselect voltage to a gate of said first select transistor and applying a first control gate voltage which differs from the first select gate voltage to a control gate of said memory cell, and then a voltage higher than the first select gate voltage is applied to the control gate of said memory cell to generate a write inhibit channel voltage boosted by a capacitive coupling of the channel of said memory cell with the control gate thereof.

14. The device according to claim 13, wherein the first select gate voltage is higher than the write unselect voltage by a threshold voltage of said first select transistor and the first control gate voltage is higher than the write unselect voltage by a threshold voltage of said memory cell.

15. The device according to claim 14, wherein the write unselect voltage is a power supply voltage.

16. The device according to claim 15, wherein the first select gate voltage is higher than the write unselect voltage by a threshold voltage of said first select transistor and the first control gate voltage is higher than the write unselect voltage by a threshold voltage of said memory cell.

17. A non-volatile semiconductor memory device comprising:

a memory cell section including a plurality of memory cells which are connected in series;

a first common signal line transferring data from/to said memory cell section; and a first select transistor arranged between said first common signal line and said memory cell section, wherein during a program operation, in the case that said memory cell section is write-selected, a write select voltage is applied to said first common signal line, and in the case that said memory cell section is write-inhibited, a write unselect voltage is applied to said first common signal line, and the write unselect voltage is transferred to a channel of said write-inhibited memory cell section by applying a first select gate voltage higher than the write unselect voltage to a gate of said first select transistor and control gates of said plurality of memory cells, and then a pass voltage higher than the first select gate voltage is applied to the control gates of the unselected memory cells and a program voltage higher than the pass voltage is applied to the control gate of the selected memory cell so that said write-selected memory cell section is boosted by a capacitive coupling of the channel of said plurality of memory cells with the control gates thereof.

18. The device according to claim 17, wherein the first select gate voltage is higher than the write unselect voltage by a threshold voltage of said memory cell/said first select transistor.

19. The device according to claim 17, wherein the write unselect voltage is a power supply voltage.

20. The device according to claim 19, wherein the first select gate voltage is higher than the write unselect voltage by a threshold voltage of said memory cell/said first select transistor.

21. The device according to claim 17, wherein the write select voltage is lower than the write unselect voltage.

22. The device according to claim 17, wherein the write select voltage is 0V and the write unselect voltage is a power supply voltage.

* * * * *